US011961764B2

(12) United States Patent
Strothmann et al.

(10) Patent No.: US 11,961,764 B2
(45) Date of Patent: Apr. 16, 2024

(54) SEMICONDUCTOR DEVICE AND METHOD OF MAKING A WAFER-LEVEL CHIP-SCALE PACKAGE

(71) Applicant: STATS ChipPAC Pte. Ltd., Singapore (SG)

(72) Inventors: Thomas J. Strothmann, Tucson, AZ (US); Damien M. Pricolo, San Jose, CA (US); Il Kwon Shim, Singapore (SG); Yaojian Lin, Singapore (SG); Heinz-Peter Wirtz, Dottingen (CH); Seung Wook Yoon, Singapore (SG); Pandi C. Marimuthu, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 147 days.

(21) Appl. No.: 17/231,591

(22) Filed: Apr. 15, 2021

(65) Prior Publication Data

US 2021/0233815 A1    Jul. 29, 2021

Related U.S. Application Data

(63) Continuation of application No. 16/204,737, filed on Nov. 29, 2018, now Pat. No. 11,011,423, which is a (Continued)

(51) Int. Cl.
    *H01L 23/28* (2006.01)
    *H01L 21/56* (2006.01)
    (Continued)

(52) U.S. Cl.
    CPC ............ *H01L 21/78* (2013.01); *H01L 21/561* (2013.01); *H01L 21/568* (2013.01);
    (Continued)

(58) Field of Classification Search
    CPC ........... H01L 24/97; H01L 2221/68327; H01L 2224/32225; H01L 2224/48227;
    (Continued)

(56) References Cited

U.S. PATENT DOCUMENTS

| 5,148,266 A | 9/1992 | Khandros et al. |
| 5,266,528 A | 11/1993 | Yamada |

(Continued)

FOREIGN PATENT DOCUMENTS

| CN | 101521165 A | 9/2009 |
| CN | 101944518 A | 1/2011 |

(Continued)

OTHER PUBLICATIONS

Yoon, Seung Wook, "Integrated 3D Wafer Level Packaging Solutions for Mobile Applications", SEMICON Singapore, pp. 1-25, May 2013.

*Primary Examiner* — Shahed Ahmed
(74) *Attorney, Agent, or Firm* — Brian M. Kaufman; Robert D. Atkins; PATENT LAW GROUP: Atkins and Associates, P.C.

(57) ABSTRACT

A semiconductor device has a carrier with a fixed size. A plurality of first semiconductor die is singulated from a first semiconductor wafer. The first semiconductor die are disposed over the carrier. The number of first semiconductor die on the carrier is independent from the size and number of first semiconductor die singulated from the first semiconductor wafer. An encapsulant is deposited over and around the first semiconductor die and carrier to form a reconstituted panel. An interconnect structure is formed over the reconstituted panel while leaving the encapsulant devoid of the interconnect structure. The reconstituted panel is singulated through the encapsulant. The first semiconductor die are removed from the carrier. A second semiconductor die with a size different from the size of the first semiconductor (Continued)

die is disposed over the carrier. The fixed size of the carrier is independent of a size of the second semiconductor die.

17 Claims, 36 Drawing Sheets

Related U.S. Application Data continuation of application No. 15/414,469, filed on Jan. 24, 2017, now Pat. No. 10,181,423, which is a continuation of application No. 14/097,534, filed on Dec. 5, 2013, now Pat. No. 9,620,413, which is a continuation-in-part of application No. 13/832,809, filed on Mar. 15, 2013, now Pat. No. 9,496,195.

(60) Provisional application No. 61/744,699, filed on Oct. 2, 2012.

(51) Int. Cl.
  H01L 21/683   (2006.01)
  H01L 21/78   (2006.01)
  H01L 23/00   (2006.01)
  H01L 23/31   (2006.01)
  H01L 23/498   (2006.01)
  H01L 23/522   (2006.01)

(52) U.S. Cl.
  CPC .......... *H01L 21/6836* (2013.01); *H01L 23/28* (2013.01); *H01L 23/3114* (2013.01); *H01L 23/3135* (2013.01); *H01L 23/49816* (2013.01); *H01L 23/522* (2013.01); *H01L 24/12* (2013.01); *H01L 24/19* (2013.01); *H01L 24/96* (2013.01); *H01L 24/97* (2013.01); *H01L 24/73* (2013.01); *H01L 2221/68327* (2013.01); *H01L 2224/0401* (2013.01); *H01L 2224/04105* (2013.01); *H01L 2224/11* (2013.01); *H01L 2224/12105* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2224/951* (2013.01); *H01L 2224/97* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15174* (2013.01); *H01L 2924/15184* (2013.01); *H01L 2924/15311* (2013.01); *H01L 2924/181* (2013.01); *H01L 2924/3511* (2013.01)

(58) Field of Classification Search
  CPC ........... H01L 2924/15311; H01L 21/78; H01L 21/6836; H01L 2224/023–024; H01L 23/488–49894; H01L 24/10–17; H01L 23/28–3192; H01L 21/56–568; H01L 2924/181–186
  See application file for complete search history.

(56) References Cited

U.S. PATENT DOCUMENTS

| 6,136,137 | A | 10/2000 | Farnworth et al. |
| 6,525,407 | B1 | 2/2003 | Drewery |
| 7,109,587 | B1 | 9/2006 | Li |
| 7,190,080 | B1 | 3/2007 | Leu et al. |
| 7,388,294 | B2 | 6/2008 | Klein et al. |
| 7,642,128 | B1 | 1/2010 | Lin et al. |
| 7,745,910 | B1 | 6/2010 | Olson et al. |
| 7,786,577 | B2 | 8/2010 | Dangelmaier et al. |
| 8,258,633 | B2 | 9/2012 | Sezi et al. |
| 8,309,864 | B2 | 11/2012 | Kobayashi et al. |
| 8,367,475 | B2 | 2/2013 | Law et al. |
| 8,367,476 | B2 | 2/2013 | Benjavasukul et al. |
| 8,659,166 | B2 | 2/2014 | Sasaki et al. |
| 2003/0170450 | A1 | 9/2003 | Stewart et al. |
| 2004/0113283 | A1 | 6/2004 | Farnworth et al. |
| 2004/0145051 | A1 | 7/2004 | Klein et al. |
| 2005/0017353 | A1 | 1/2005 | Seddon et al. |
| 2005/0051877 | A1 | 3/2005 | Hsu |
| 2005/0269715 | A1 | 12/2005 | Yoo |
| 2007/0029666 | A1 | 2/2007 | Goh et al. |
| 2009/0011543 | A1 | 1/2009 | Karta et al. |
| 2009/0091001 | A1 | 4/2009 | Park |
| 2009/0166835 | A1 | 7/2009 | Yang et al. |
| 2009/0196011 | A1 | 8/2009 | Kobayashi et al. |
| 2009/0215227 | A1 | 8/2009 | Tan et al. |
| 2009/0289356 | A1 | 11/2009 | Camacho et al. |
| 2010/0095739 | A1 | 4/2010 | DeNatale et al. |
| 2010/0127360 | A1 | 5/2010 | Pagaila et al. |
| 2010/0230795 | A1 | 9/2010 | Kriman et al. |
| 2010/0252828 | A1 | 10/2010 | Grillberger et al. |
| 2010/0258932 | A1 | 10/2010 | Yoshida et al. |
| 2011/0001238 | A1 | 1/2011 | Wakisaka et al. |
| 2011/0014746 | A1 | 1/2011 | Do et al. |
| 2011/0024888 | A1 | 2/2011 | Pagaila et al. |
| 2011/0037169 | A1 | 2/2011 | Pagaila |
| 2011/0042796 | A1 | 2/2011 | Chang et al. |
| 2011/0049695 | A1 | 3/2011 | Shin et al. |
| 2011/0095413 | A1 | 4/2011 | Barth et al. |
| 2011/0101491 | A1 | 5/2011 | Skeete et al. |
| 2011/0101512 | A1 | 5/2011 | Choi et al. |
| 2011/0104853 | A1 | 5/2011 | Lo |
| 2011/0127668 | A1 | 6/2011 | Lin et al. |
| 2011/0204505 | A1 | 8/2011 | Pagaila et al. |
| 2011/0221055 | A1 | 9/2011 | Lin et al. |
| 2011/0221069 | A1 | 9/2011 | Kunimoto |
| 2011/0233766 | A1 | 9/2011 | Lin et al. |
| 2011/0241222 | A1* | 10/2011 | Sezi ...................... H01L 24/19 |
| | | | 257/E23.116 |
| 2011/0272824 | A1 | 11/2011 | Pagaila |
| 2011/0278703 | A1 | 11/2011 | Pagaila et al. |
| 2011/0278717 | A1 | 11/2011 | Pagaila et al. |
| 2011/0278736 | A1 | 11/2011 | Lin et al. |
| 2011/0318876 | A1 | 12/2011 | Lee et al. |
| 2012/0001339 | A1 | 1/2012 | Malatkar |
| 2012/0018858 | A1 | 1/2012 | Chen et al. |
| 2012/0018874 | A1 | 1/2012 | Lin et al. |
| 2012/0018904 | A1 | 1/2012 | Lin et al. |
| 2012/0038047 | A1 | 2/2012 | Do et al. |
| 2012/0049388 | A1 | 3/2012 | Pagaila |
| 2012/0074587 | A1 | 3/2012 | Koo et al. |
| 2012/0112340 | A1* | 5/2012 | Lin ..................... H01L 23/3114 |
| | | | 257/734 |
| 2012/0112351 | A1 | 5/2012 | Walczyk et al. |
| 2012/0126427 | A1 | 5/2012 | Sasaki et al. |
| 2012/0139120 | A1 | 6/2012 | Chow et al. |
| 2012/0146181 | A1 | 6/2012 | Lin et al. |
| 2012/0168089 | A1 | 7/2012 | Schmidt-Lange et al. |
| 2012/0186793 | A1 | 7/2012 | Brunschwiler et al. |
| 2012/0187568 | A1 | 7/2012 | Lin et al. |
| 2012/0187584 | A1 | 7/2012 | Lin et al. |
| 2012/0241925 | A1 | 9/2012 | Yoon et al. |
| 2012/0241955 | A1 | 9/2012 | Law et al. |
| 2012/0273959 | A1 | 11/2012 | Park et al. |
| 2012/0273960 | A1 | 11/2012 | Park et al. |
| 2012/0286429 | A1 | 11/2012 | Han et al. |
| 2013/0037935 | A1 | 2/2013 | Xue et al. |
| 2013/0087931 | A1 | 4/2013 | Phua et al. |
| 2013/0095612 | A1 | 4/2013 | Huang et al. |
| 2013/0127018 | A1 | 5/2013 | Phua et al. |
| 2013/0168849 | A1 | 7/2013 | Scanlan |
| 2013/0168874 | A1 | 7/2013 | Scanlan |
| 2013/0200528 | A1 | 8/2013 | Lin et al. |
| 2013/0341774 | A1 | 12/2013 | Chang et al. |
| 2014/0001652 | A1 | 1/2014 | Chen et al. |
| 2014/0070420 | A1 | 3/2014 | Sapone |
| 2014/0091482 | A1 | 4/2014 | Lin et al. |
| 2014/0103488 | A1 | 4/2014 | Chen et al. |

(56) References Cited

U.S. PATENT DOCUMENTS

| | | | |
|---|---|---|---|
| 2014/0103527 A1 | 4/2014 | Marimuthu et al. | |
| 2014/0110842 A1 | 4/2014 | Zenz et al. | |
| 2014/0131896 A1 | 5/2014 | Yu et al. | |
| 2014/0183718 A1 | 7/2014 | Han et al. | |
| 2014/0183761 A1 | 7/2014 | Lin et al. | |
| 2015/0187710 A1* | 7/2015 | Scanlan | H01L 24/20 257/777 |
| 2016/0093580 A1* | 3/2016 | Scanlan | H01L 24/02 438/114 |

FOREIGN PATENT DOCUMENTS

| | | |
|---|---|---|
| CN | 101989558 A | 3/2011 |
| CN | 102097337 A | 6/2011 |
| CN | 102105982 A | 6/2011 |
| CN | 102163561 A | 8/2011 |
| CN | 102244012 A | 11/2011 |
| CN | 102244013 A | 11/2011 |
| CN | 102299086 A | 12/2011 |
| CN | 102347253 A | 2/2012 |
| CN | 102347272 A | 2/2012 |
| CN | 102386108 A | 3/2012 |
| CN | 102569210 A | 7/2012 |
| CN | 102709200 A | 10/2012 |
| CN | 103035578 A | 4/2013 |
| CN | 203288575 U | 11/2013 |
| CN | 102903642 B | 4/2015 |
| IN | 103117232 A | 5/2013 |
| JP | H0492459 A | 3/1992 |
| JP | 3455948 B2 | 10/2003 |
| JP | 2009277854 A | 11/2009 |
| JP | 2010245384 A | 10/2010 |
| JP | 4812525 B2 | 11/2011 |
| KR | 20080106155 A | 12/2008 |
| KR | 20090072958 A | 7/2009 |
| TW | 201246483 A | 11/2012 |

\* cited by examiner

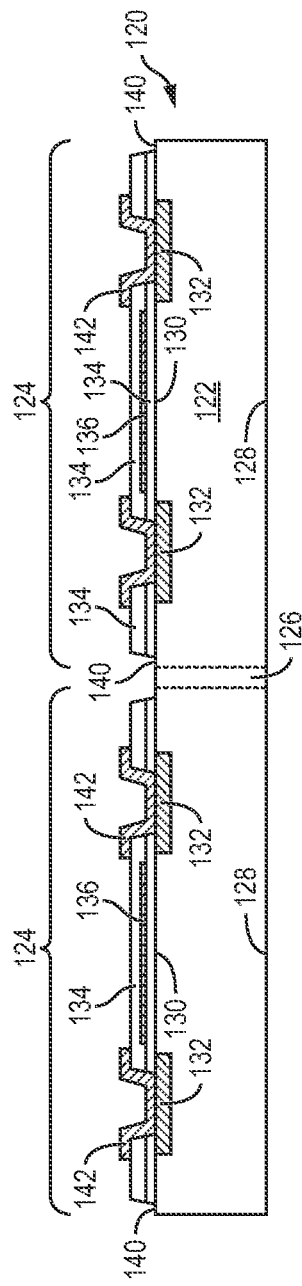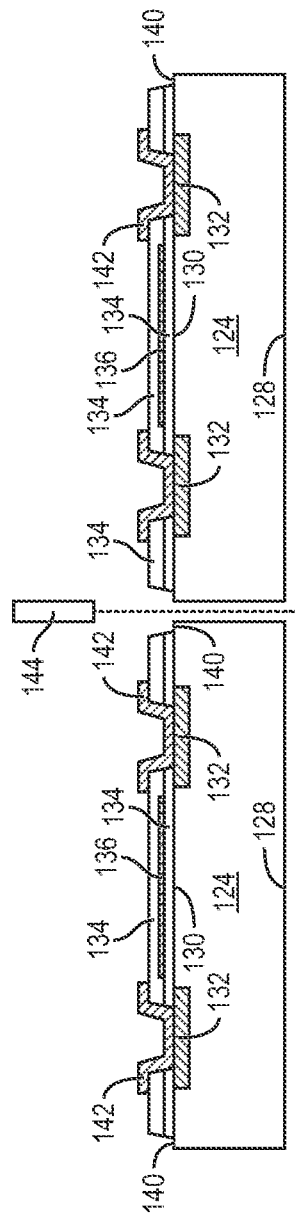

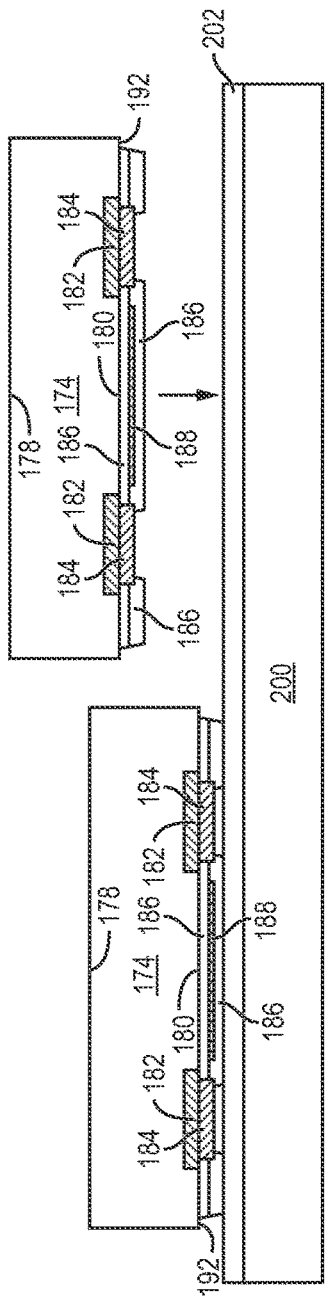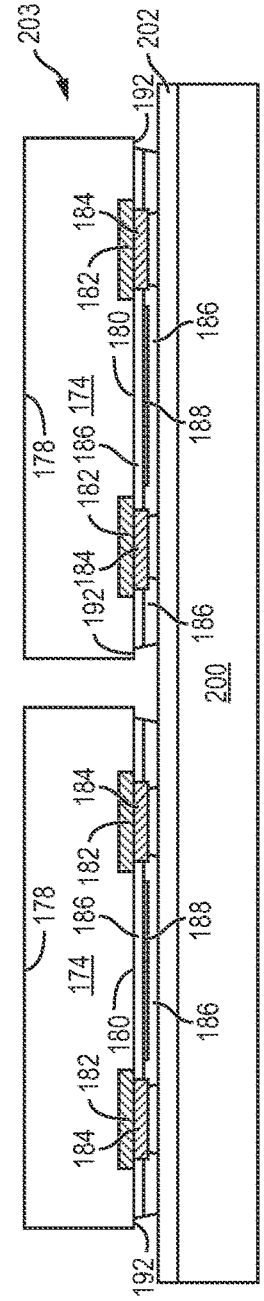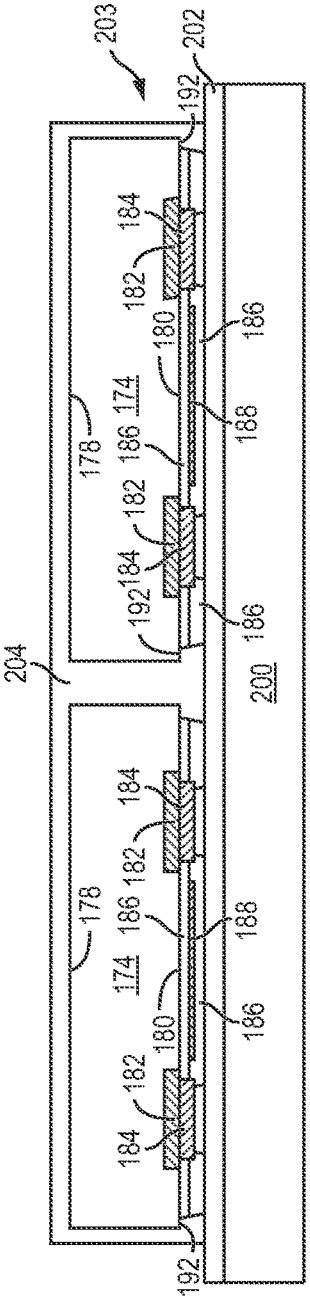
FIG. 7a
FIG. 7b
FIG. 7c

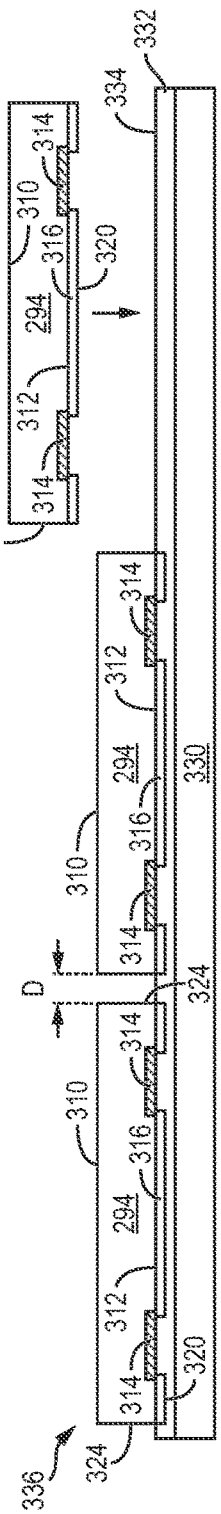
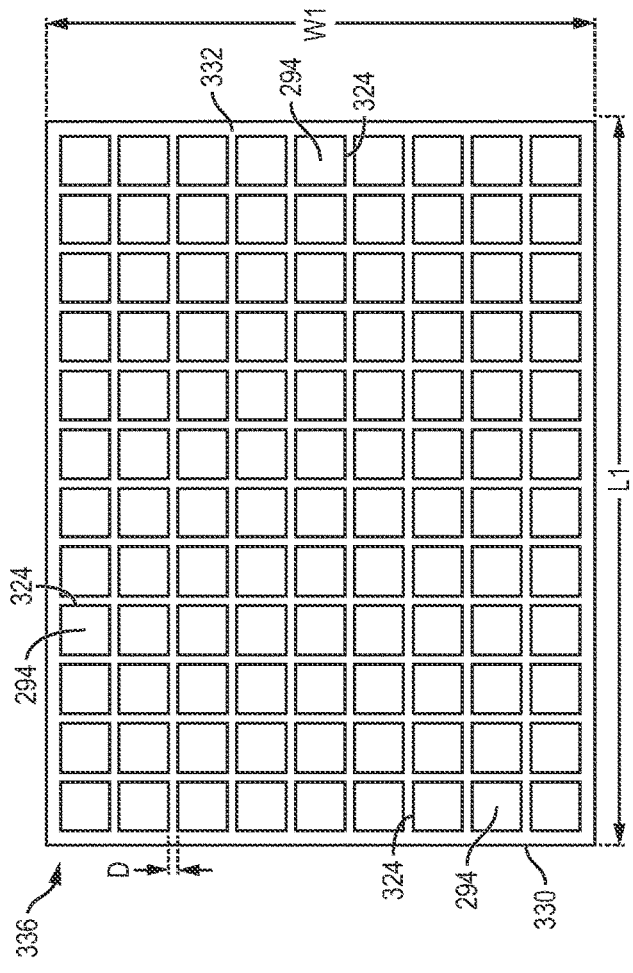
FIG. 13d
FIG. 13e
FIG. 13f

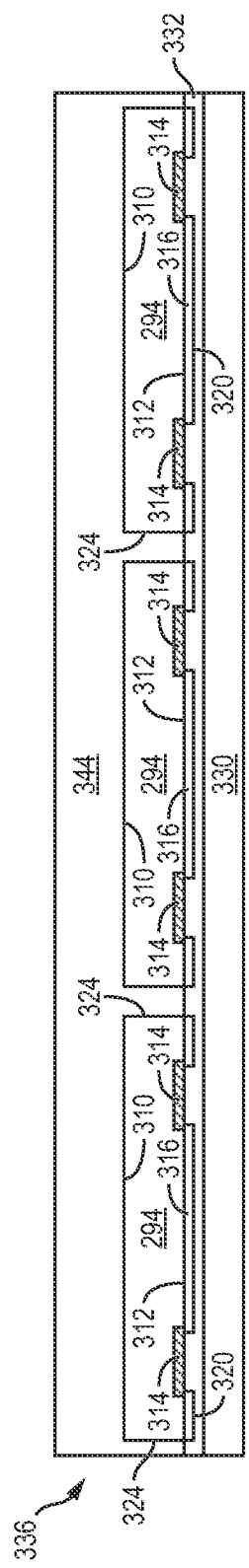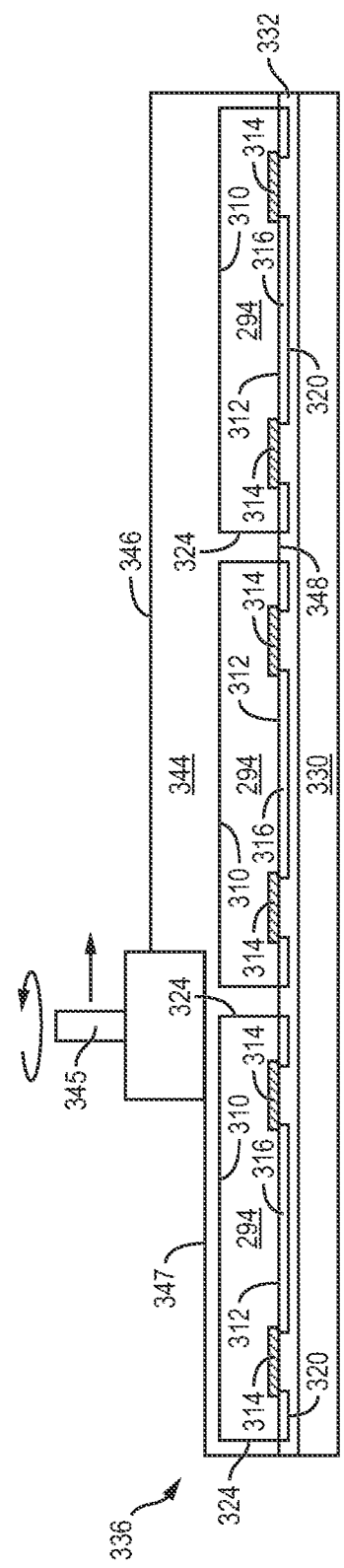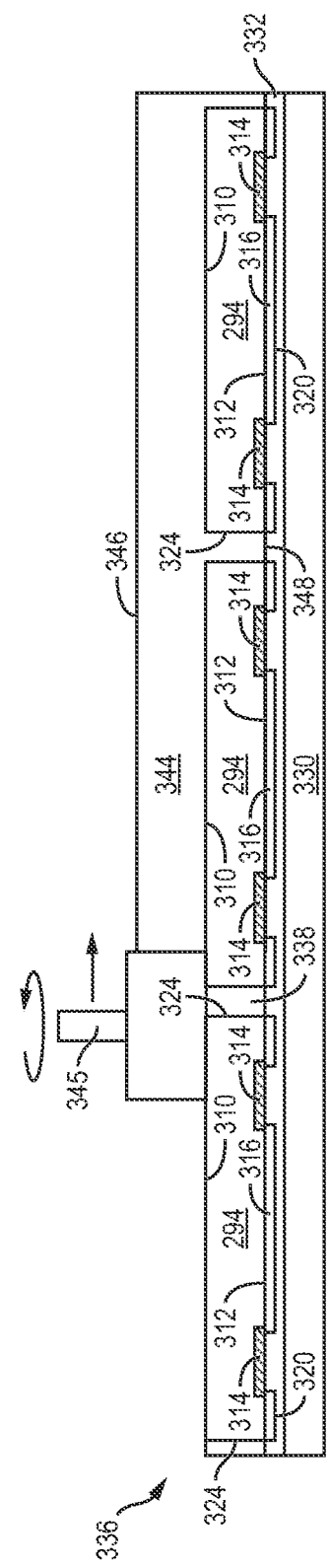

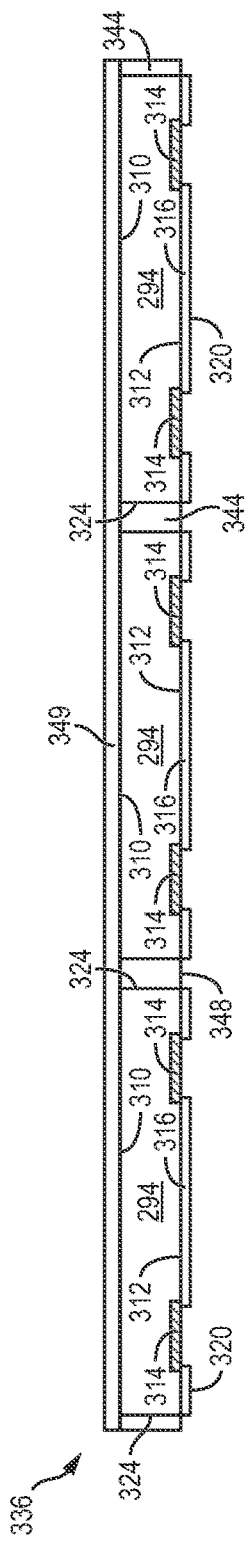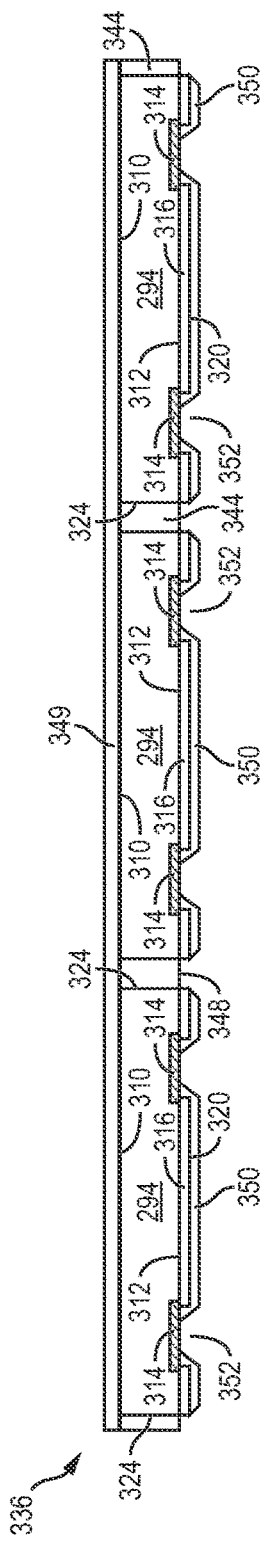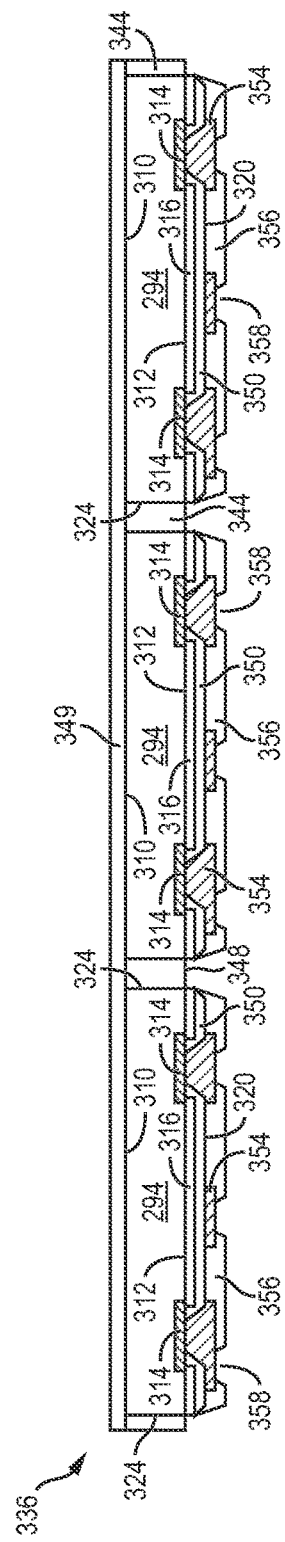

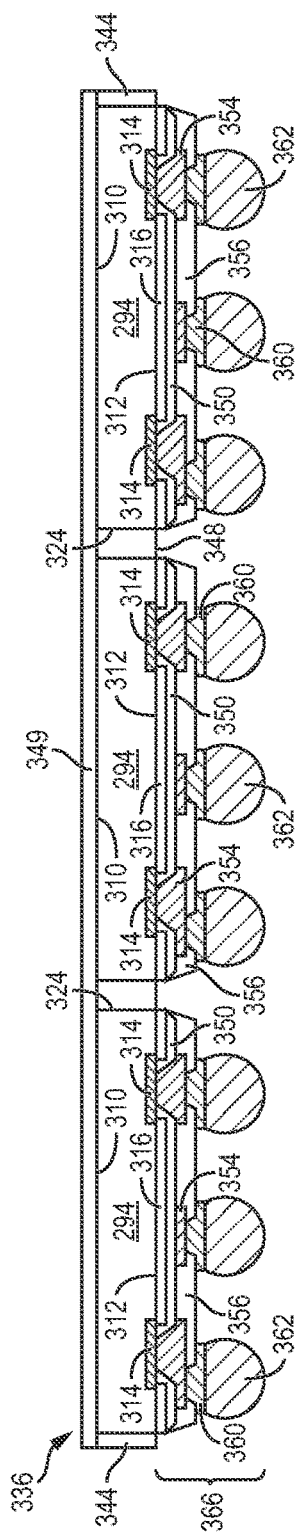
FIG. 13o
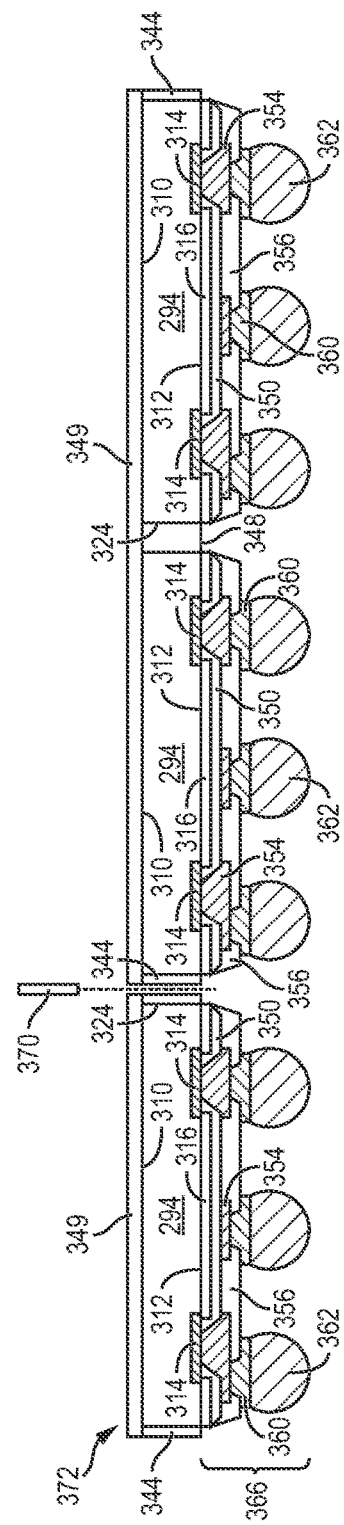
FIG. 13p
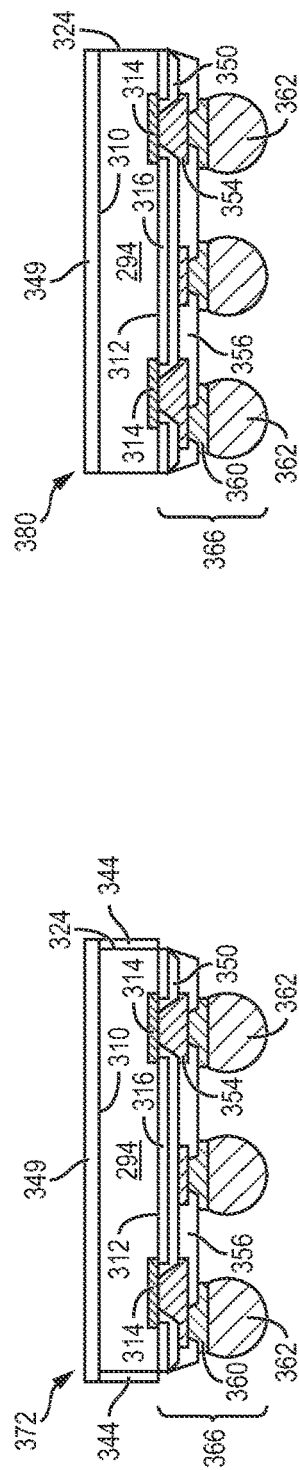
FIG. 15
FIG. 14

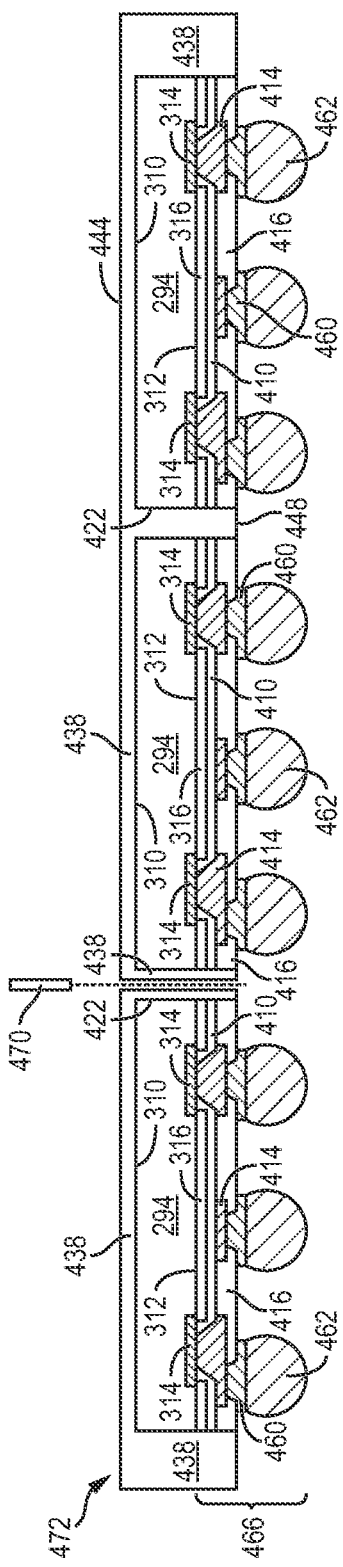
FIG. 19k
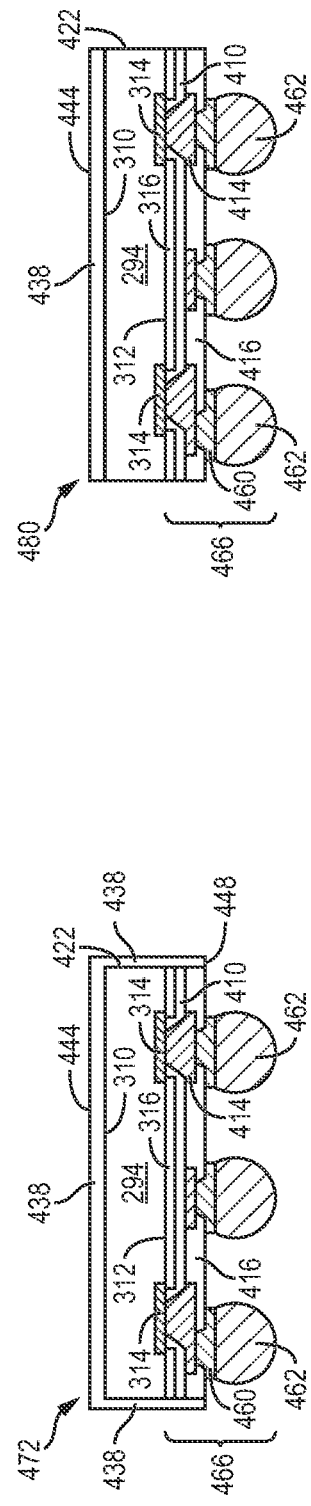
FIG. 20
FIG. 21

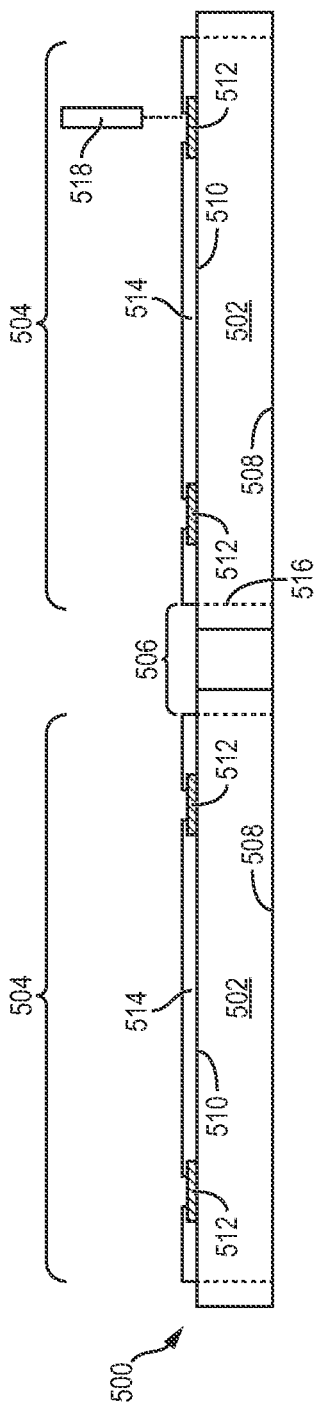
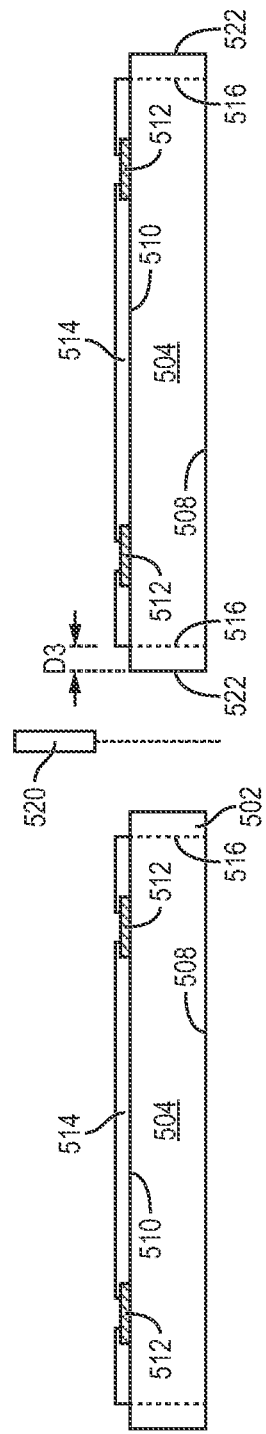
FIG. 26a
FIG. 26b

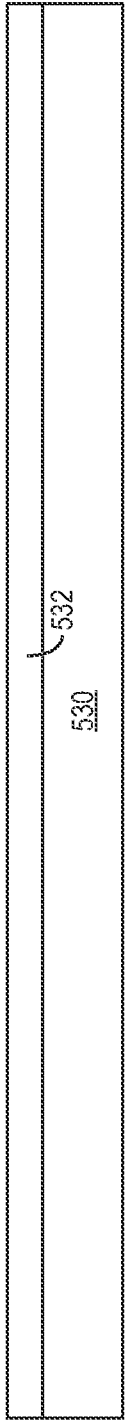
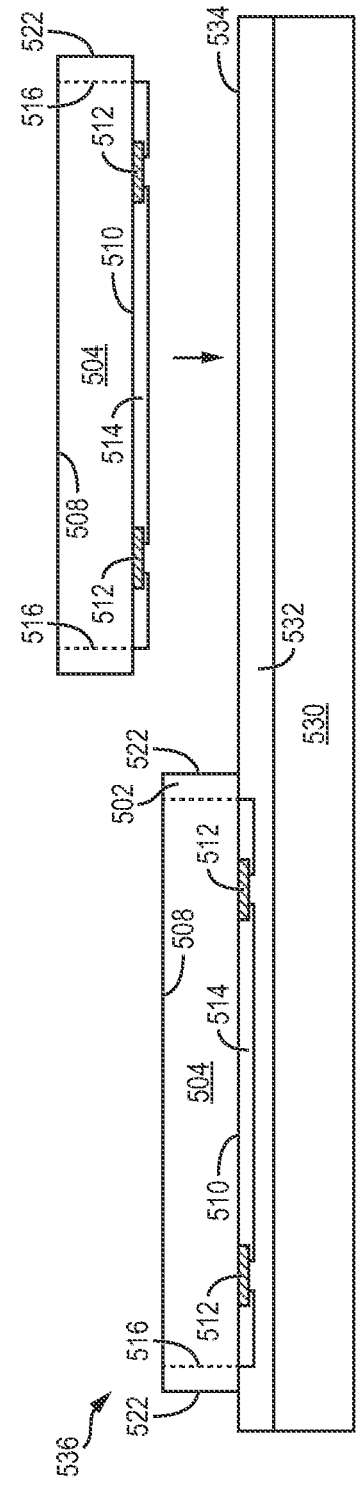
FIG. 26c
FIG. 26d

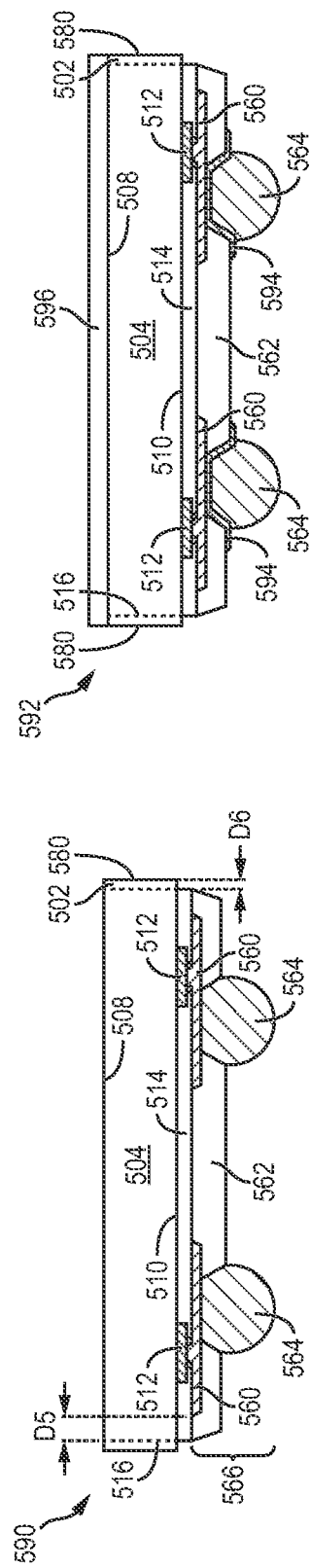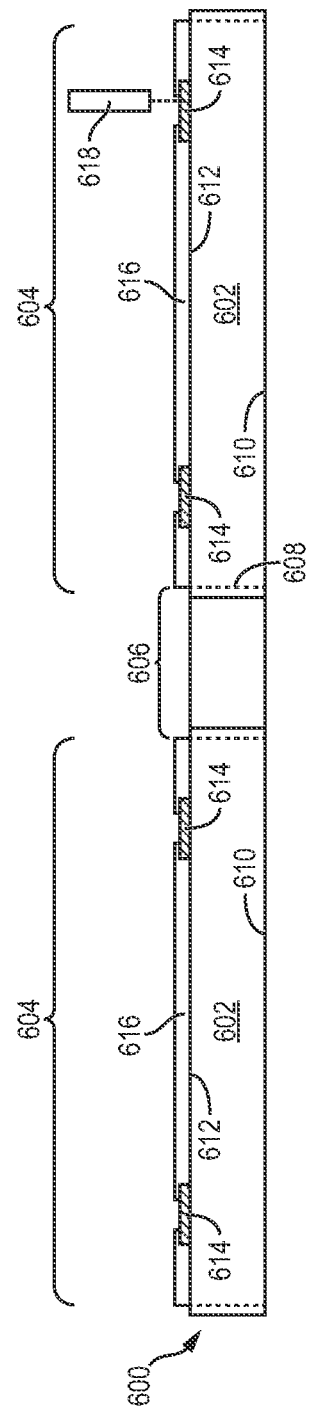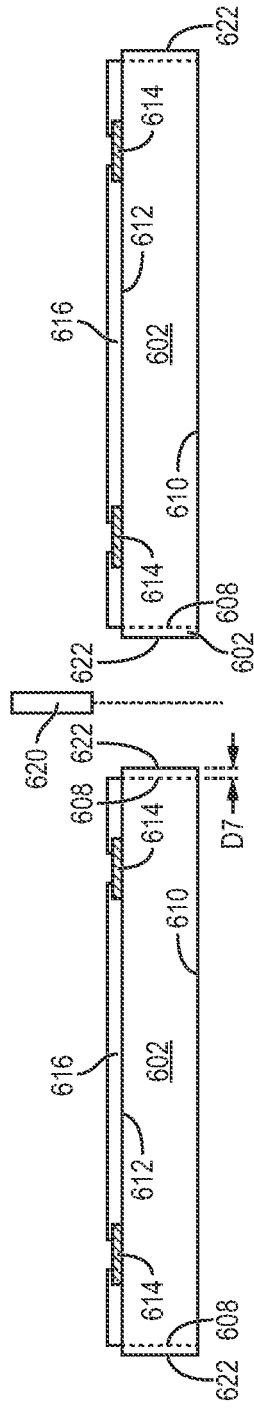

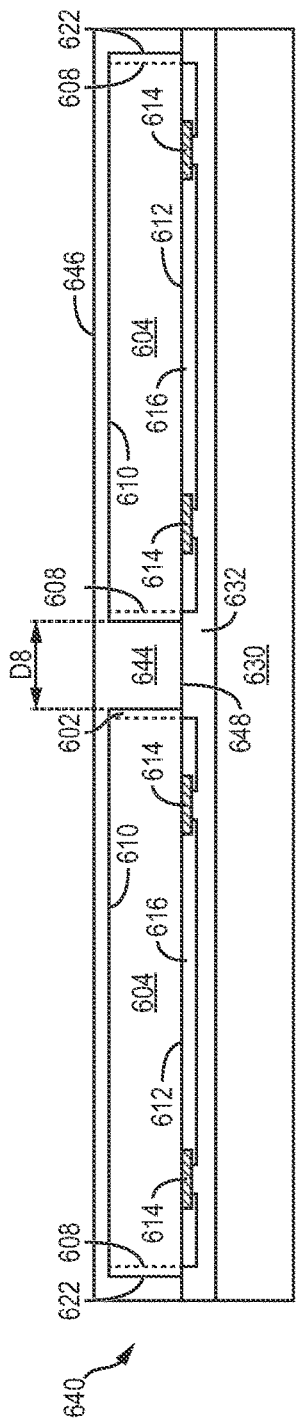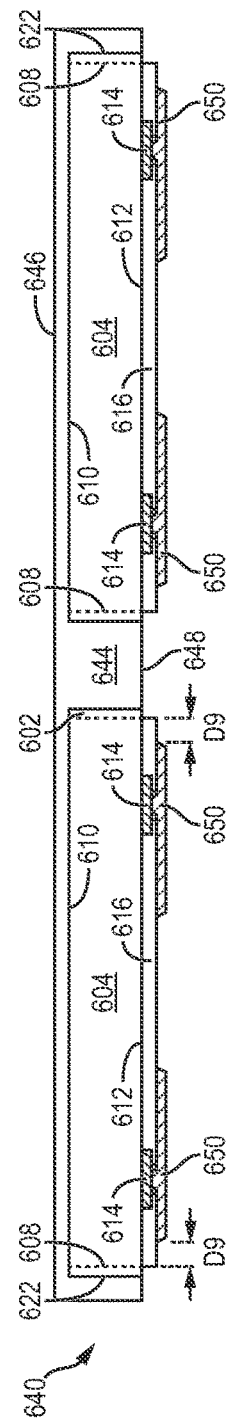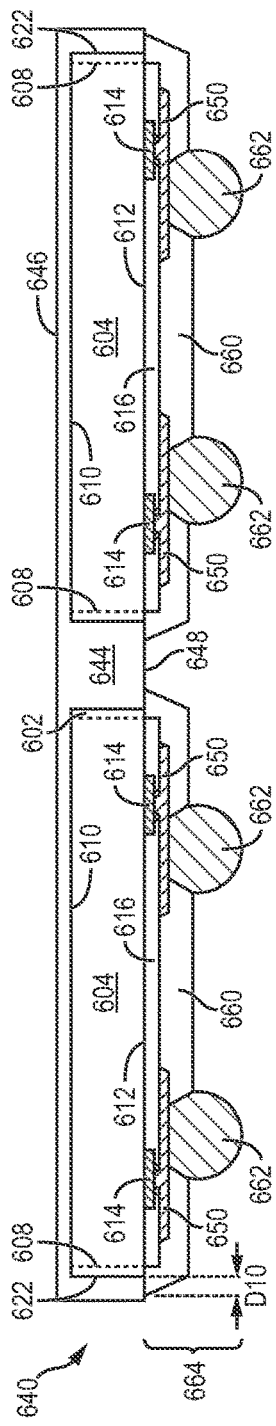

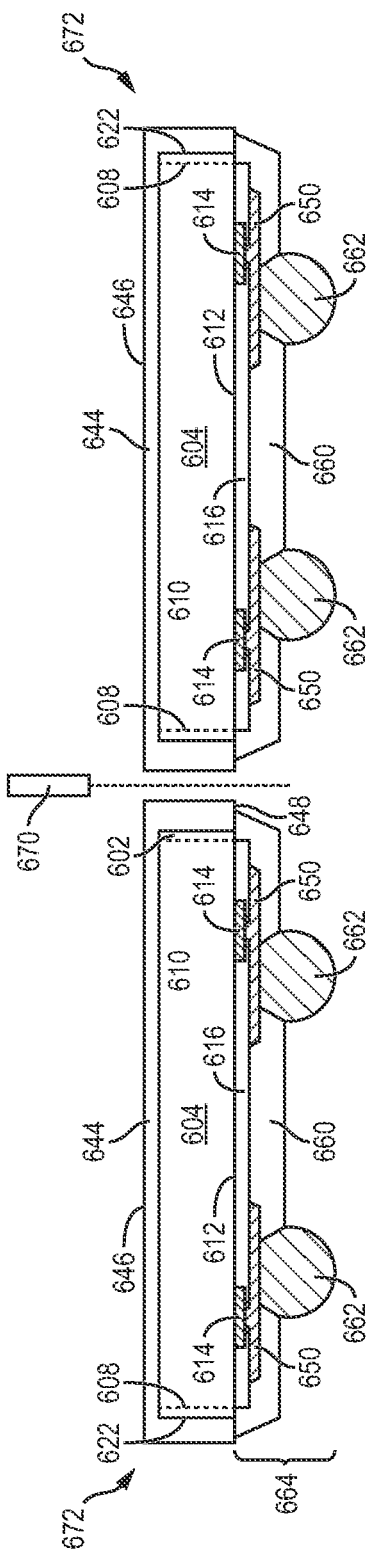
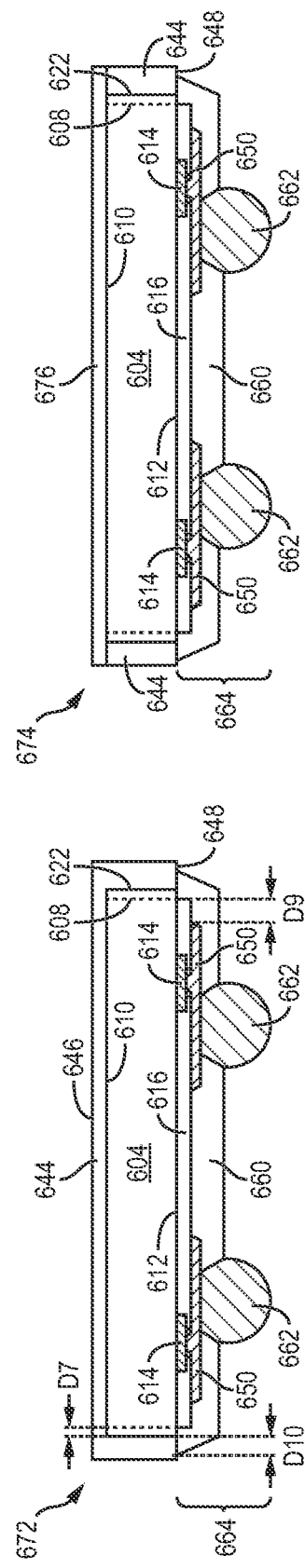

SEMICONDUCTOR DEVICE AND METHOD OF MAKING A WAFER-LEVEL CHIP-SCALE PACKAGE

CLAIM TO DOMESTIC PRIORITY

The present application is a continuation of U.S. patent application Ser. No. 16/204,737, now U.S. Pat. No. 11,011,423, filed Nov. 29, 2018, which is a continuation of U.S. patent application Ser. No. 15/414,469, filed Jan. 24, 2017, which is a continuation of U.S. patent application Ser. No. 14/097,534, now U.S. Pat. No. 9,620,413, filed Dec. 5, 2013, which is a continuation-in-part of U.S. patent application Ser. No. 13/832,809, now U.S. Pat. No. 9,496,195, filed Mar. 15, 2013, which claims the benefit of U.S. Provisional Application No. 61/744,699, filed Oct. 2, 2012, which applications are incorporated herein by reference.

FIELD OF THE INVENTION

The present invention relates in general to semiconductor devices and, more particularly, to a semiconductor device and method of forming wafer level chip scale packages (WLCSP) using a standardized carrier.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer typically contains a plurality of semiconductor die separated by a saw street. Active and passive circuits are formed in a surface of each semiconductor die. An interconnect structure can be formed over the surface of the semiconductor die. The semiconductor wafer is singulated into individual semiconductor die for use in a variety of electronic products. An important aspect of semiconductor manufacturing is high yield and corresponding low cost.

Semiconductor wafers are fabricated having various diameters and semiconductor die sizes depending on the equipment used to produce the semiconductor wafers and semiconductor die. Semiconductor processing equipment is typically developed according to each particular semiconductor die size and incoming semiconductor wafer size. For example, a 200 millimeter (mm) wafer is processed using 200 mm equipment, and a 300 mm wafer is processed using 300 mm equipment. Semiconductor die singulated from a wafer are processed on a carrier. The size of the carrier is selected according to the size of the semiconductor die to be processed. For example, 10 mm by 10 mm semiconductor die are processed using different equipment than 5 mm by 5 mm semiconductor die. Therefore, equipment for packaging semiconductor devices is limited in processing capability to the specific semiconductor die size or semiconductor wafer size for which the equipment is designed. As incoming semiconductor die sizes and semiconductor wafer sizes change, additional investment in manufacturing equipment is necessary. Investment in equipment for a specific size semiconductor die or semiconductor wafer creates capital investment risk for semiconductor device manufacturers. As incoming semiconductor wafer sizes change, wafer-specific equipment becomes obsolete. Similarly, carriers and equipment designed for specific sizes of semiconductor die can become obsolete, because the carriers are limited in capability to handle different sized semiconductor die. Constant development and implementation of different equipment increases the cost of the final semiconductor device.

Semiconductor wafers include various diameters and are typically processed with manufacturing equipment designed for each specific size of semiconductor die. Semiconductor die are typically enclosed within a semiconductor package for electrical interconnect, structural support, and environmental protection of the die. The semiconductor can be subject to damage or degradation if a portion of the semiconductor die is exposed to external elements, particularly when surface mounting the die. For example, the semiconductor die can be damaged or degraded during handling and exposure to light.

BRIEF DESCRIPTION OF THE DRAWINGS

FIGS. 3a-3d illustrate a semiconductor wafer with a plurality of semiconductor die separated by a saw street;

FIGS. 7a-7e illustrate another process of depositing an encapsulant over the sides and an exposed portion of an active surface of a semiconductor die in a WLCSP;

FIG. 14 illustrates an eWLCSP having encapsulant over the sidewall of the semiconductor die and a backside protection layer;

FIG. 15 illustrates an eWLCSP having a backside protection layer;

FIGS. 19a-19k illustrate an alternative process of forming an eWLCSP;

FIG. 20 illustrates an eWLCSP having an encapsulant over the sidewall and backside of the semiconductor die;

FIG. 21 illustrates an eWLCSP having encapsulant over the backside of the semiconductor die;

FIGS. 26a-26k illustrate a process of forming an eWLCSP having encapsulant over a backside of a semiconductor die;

FIG. 27 illustrates an eWLCSP with the semiconductor die having exposed sidewalls and backside;

FIG. 28 illustrates an eWLCSP having a backside protection layer;

FIGS. 29a-29i illustrate another process of forming an eWLCSP having thin sidewall encapsulation; and FIG. 30 illustrates an eWLCSP having a backside protection layer and thin sidewall encapsulation.

DETAILED DESCRIPTION OF THE DRAWINGS

Figure 1:
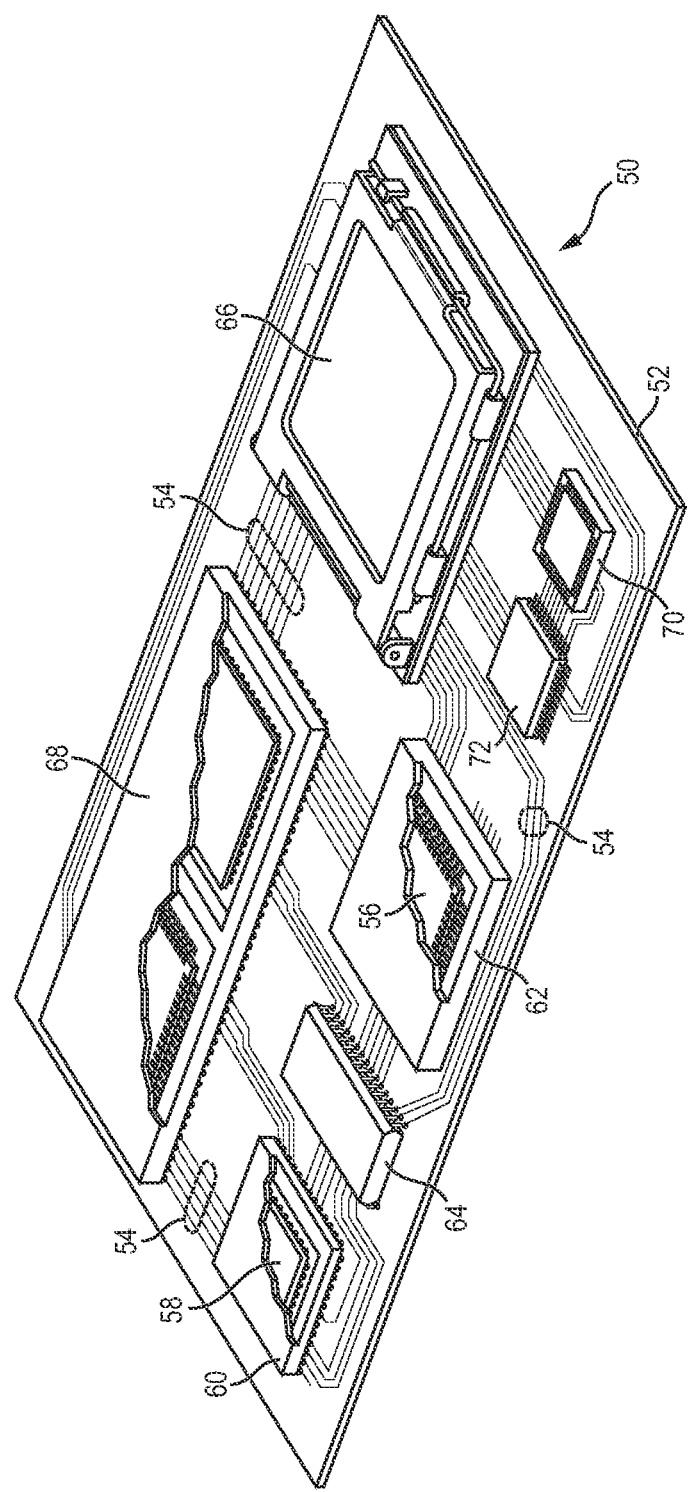
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
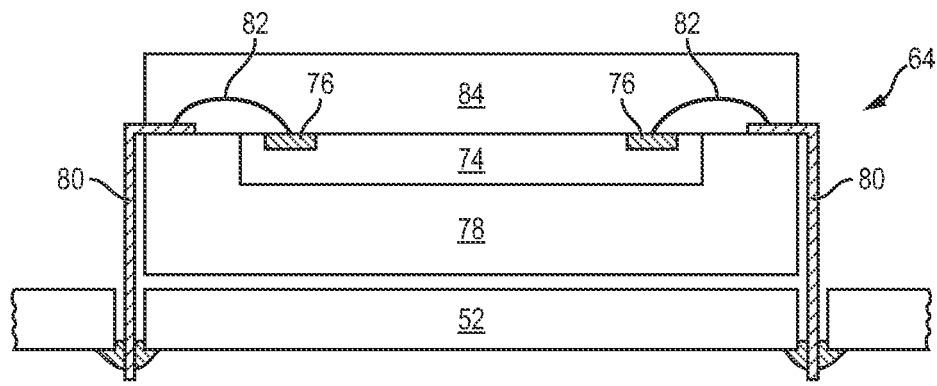
FIGS. 2a-2c illustrate further detail of the representative semiconductor packages mounted to the PCB.
Figure 2B:
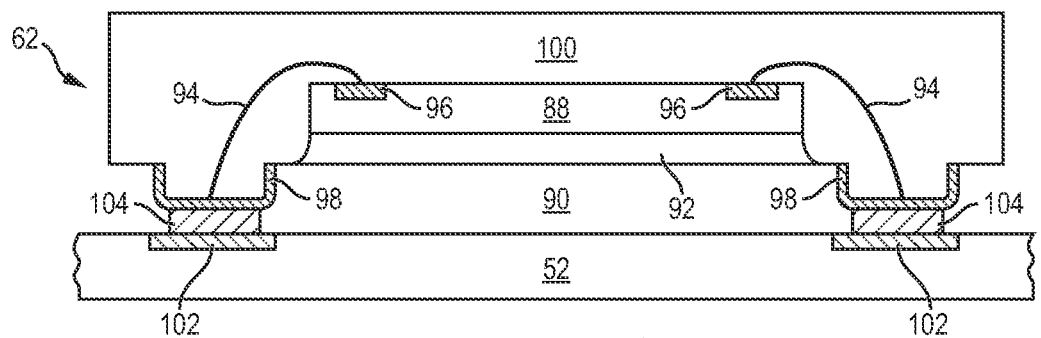
Figure 2C:
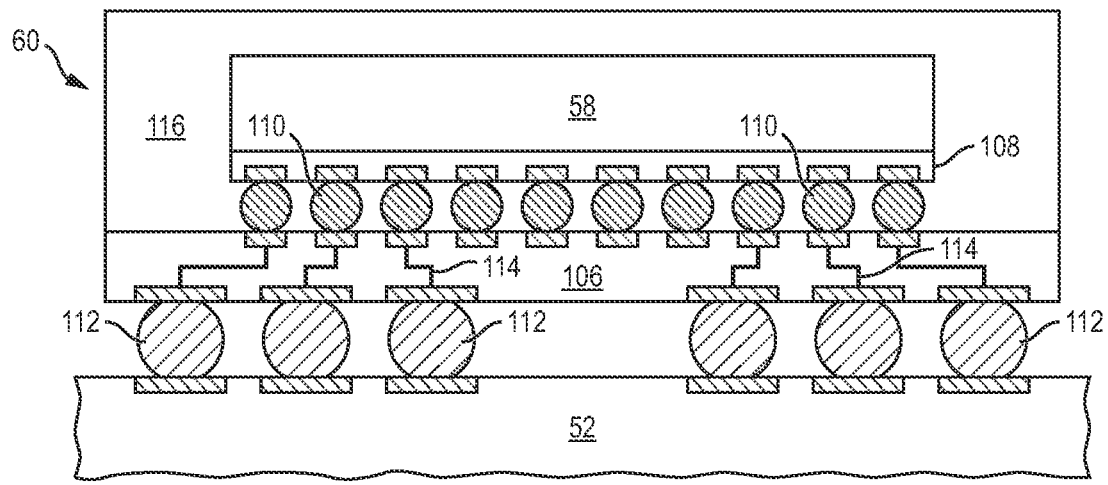

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
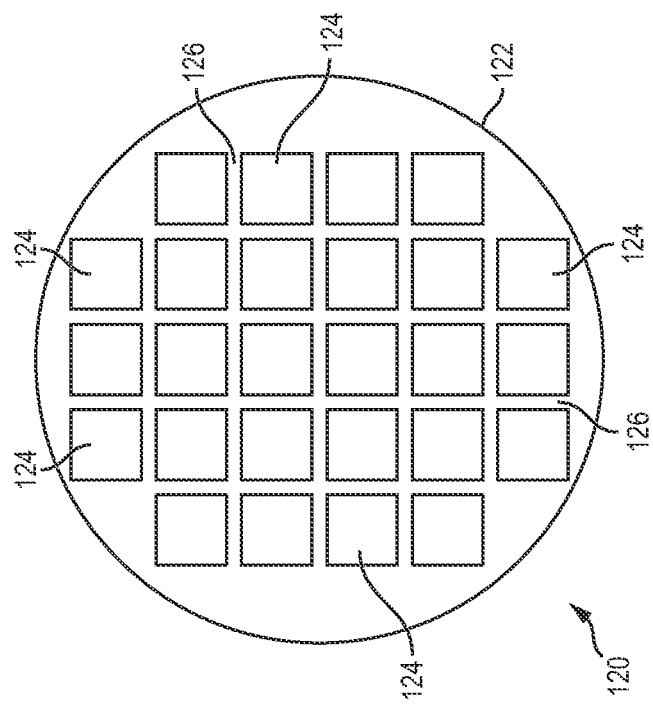

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 is 200-300 millimeters (mm) in diameter. In another embodiment, semiconductor wafer 120 is 100-450 mm in diameter. Semiconductor wafer 120 may have any diameter prior to singulating semiconductor wafer into individual semiconductor die 124.

Figure 3B:
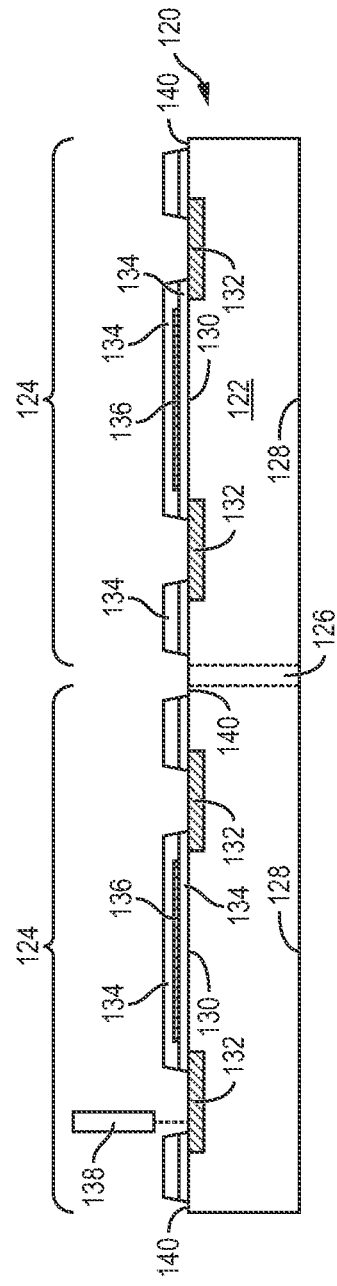

FIG. 3b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

A first insulating or passivation layer 134 is formed over semiconductor die 124 and conductive layer 132 using PVD, CVD, printing, spin coating, spray coating, sintering or thermal oxidation. Insulating layer 134 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), polymer, or other dielectric material having similar structural and insulating properties.

An electrically conductive layer or redistribution layer (RDL) 136 is formed over the first insulating layer 134 using a patterning and metal deposition process such as sputtering, electrolytic plating, and electroless plating. Conductive layer 136 can be one or more layers of Al, Cu, Sn, Ni, Au, Ag, or other suitable electrically conductive material. One portion of conductive layer 136 is electrically connected to conductive layer 132 of semiconductor die 124. Other portions of conductive layer 136 can be electrically common or electrically isolated depending on the design and function of semiconductor die 124.

A second insulating or passivation layer 134 is formed over conductive layer 136 and the first insulating layer 134. Multiple insulating layers 134 and conductive layers 136 can be formed over active surface 130 of semiconductor die 124. A surface inspection can be performed to detect passivation or RDL defects.

A portion of insulating layer 134 is removed by laser direct ablation (LDA) using laser 138 to expose conductive layer 132 and portion 140 of active surface 130 along a surface edge of semiconductor die 124. That is, portion 140 of active surface 130 along a surface edge of semiconductor die 124 is devoid of insulating layer 134. Alternatively, a portion of insulating layer 134 is removed by an etching process through a patterned photoresist layer to expose conductive layer 132 and portion 140 of active surface 130 along the surface edge of semiconductor die 124.

In FIG. 3c, an electrically conductive layer 142 is formed over the exposed portion of conductive layer 132 and insulating layer 134 after final repassivation using PVD, CVD, evaporation, electrolytic plating, electroless plating, or other suitable metal deposition process. Conductive layer 142 can be Al, Cu, Sn, Ni, Au, Ag, tungsten (W), or other suitable electrically conductive material. Conductive layer 142 is an under bump metallization (UBM) electrically connected to conductive layer 132. UBMs 142 can be a multi-metal stack with adhesion layer, barrier layer, and seed or wetting layer. The adhesion layer is formed over conductive layer 132 and can be titanium (Ti), titanium nitride (TiN), titanium tungsten (TiW), Al, or chromium (Cr). The barrier layer is formed over the adhesion layer and can be Ni, NiV, platinum (Pt), palladium (Pd), TiW, Ti, or chromium copper (CrCu). The barrier layer inhibits the diffusion of Cu into the active area of the die. The seed layer is formed over the barrier layer and can be Cu, Ni, NiV, Au, or Al. UBMs 142 provide a low resistive interconnect to conductive layer 132, as well as a barrier to solder diffusion and seed layer for solder wettability.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or contact pads 132 on each semiconductor die 124 and provides electrical stimuli to the contact pads. Semiconductor die 124 responds to the electrical stimuli, which is measured and compared to an expected response to test functionality of the semiconductor die. The electrical tests may include circuit functionality, lead integrity, resistivity, continuity, reliability, junction depth, electro-static discharge (ESD), radio frequency (RF) performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 3d, semiconductor wafer 120 is singulated through saw street 126 using a saw blade or laser cutting tool 144 into individual semiconductor die 124. Individual semiconductor die 124 can be inspected and electrically tested for identification of KGD post singulation.

Figure 4A:
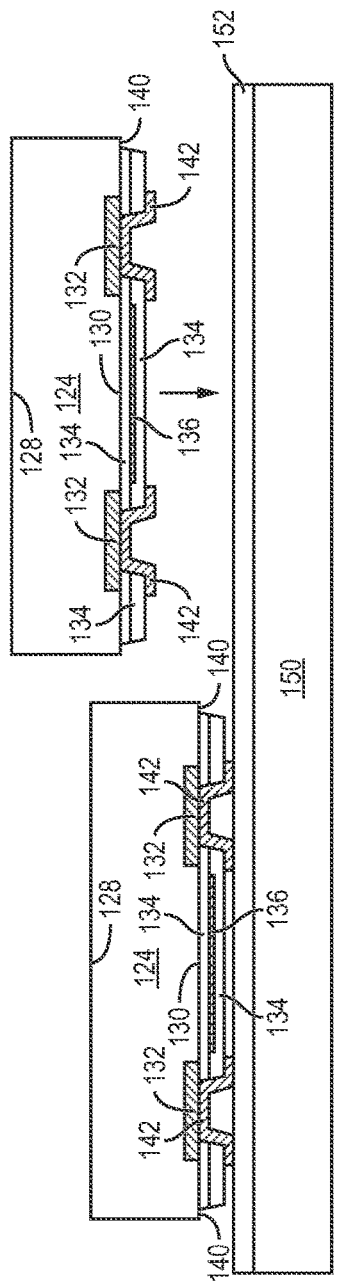
FIGS. 4a-4e illustrate a process of depositing an encapsulant over the sides and an exposed portion of an active surface of a semiconductor die in a WLCSP.

FIGS. 4a-4e illustrate, in relation to FIGS. 1 and 2a-2c, a process of depositing an encapsulant over the sides and an exposed portion of an active surface of a semiconductor die in a WLCSP. FIG. 4a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer.

Carrier 150 can be a round or rectangular panel (greater than 300 mm) with capacity for multiple semiconductor die 124. Carrier 150 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 150 is selected independent of the size of semiconductor die 124 or size of semiconductor wafer 120. That is, carrier 150 has fixed or standardized size, which can accommodate various size semiconductor die 124 singulated from one or more semiconductor wafers 120. In one embodiment, carrier 150 is circular with a diameter of 330 mm. In another embodiment, carrier 150 is rectangular with a width of 560 mm and length of 600 mm. Semiconductor die 124 may have dimensions of 10 mm by 10 mm, which are placed on standardized carrier 150. Alternatively, semiconductor die 124 may have dimensions of 20 mm by 20 mm, which are placed on the same standardized carrier 150. Accordingly, standardized carrier 150 can handle any size semiconductor die 124, which allows subsequent semiconductor processing equipment to be standardized to a common carrier, i.e., independent of die size or incoming wafer size. Semiconductor packaging equipment can be designed and configured for a standard carrier, which can be used to process any semiconductor die size from any incoming wafer size. Carrier 150 having a fixed size and shape allows different size semiconductor die 124 from different size semiconductor wafers 120 to be processed using a common set of processing tools, equipment, and materials. For example, 10 by 10 mm semiconductor die 124 from a 200 mm semiconductor wafer, or 20 by 20 mm semiconductor die 124 from a 450 mm semiconductor wafer, are processed on carrier 150 using the same equipment and bill of materials. The common or standardized carrier 150 lowers manufacturing costs by reducing or eliminating the need for specialized semiconductor processing lines based on die size or incoming wafer size. The standardized carrier size reduces capital risk, because the processing equipment remains constant even as semiconductor wafer sizes change. By selecting a predetermined carrier size to use for any size semiconductor die from all semiconductor wafers, a flexible manufacturing line can be implemented.

Figure 4B:
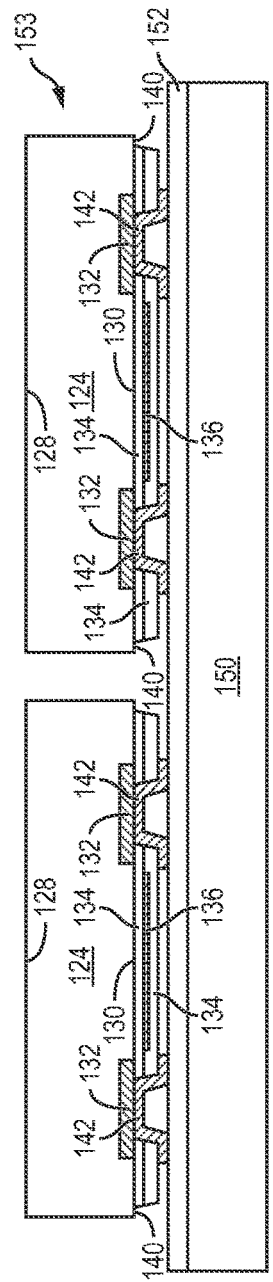

Semiconductor die 124 from FIG. 3d are mounted to carrier 150 and interface layer 152 using, for example, a pick and place operation with insulating layer 134 oriented toward the carrier. FIG. 4b shows semiconductor die 124 mounted to interface layer 152 of carrier 150 as reconstituted or reconfigured wafer 153. Active surface 130 of semiconductor die 124 is held off or offset from interface layer 152 by nature of insulating layer 134 and/or conductive layer 142 contacting the interface layer, i.e., there is a gap between portion 140 of active surface 130 and interface layer 152.

Reconstituted wafer or reconstituted panel 153 can be processed into many types of semiconductor packages, including fan-in wafer level chip scale packages (WLCSP), reconstituted or embedded wafer level chip scale packages (eWLCSP), fan-out WLCSP, flipchip packages, three dimensional (3D) packages, such as package-on-package (PoP), or other semiconductor packages. Reconstituted panel 153 is configured according to the specifications of the resulting semiconductor package. In one embodiment, semiconductor die 124 are placed on carrier 150 in a high-density arrangement, i.e., 300 micrometers (µm) apart or less, for processing fan-in devices. In another embodiment, semiconductor die 124 are separated by a distance of 50 µm on carrier 150. The distance between semiconductor die 124 on carrier 150 is optimized for manufacturing the semiconductor packages at the lowest unit cost. The larger surface area of carrier 150 accommodates more semiconductor die 124 and lowers manufacturing cost as more semiconductor die 124 are processed per reconstituted panel 153. The number of semiconductor die 124 mounted to carrier 150 can be greater than, less than, or equal to the number of semiconductor die 124 singulated from semiconductor wafer 120. Carrier 150 and reconstituted panel 153 provide the flexibility to manufacture many different types of semiconductor packages using different size semiconductor die 124 from different sized semiconductor wafers 120.

Figure 4C:
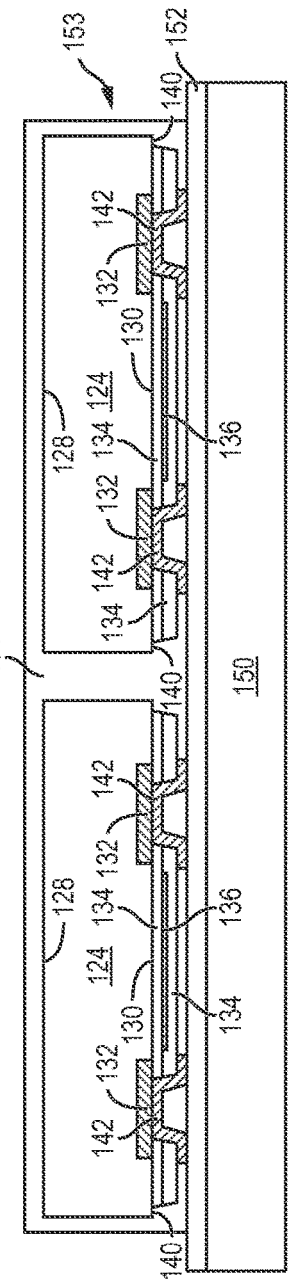

In FIG. 4c, an encapsulant or molding compound 154 is deposited over semiconductor die 124 and carrier 150 using a paste printing, compressive molding, transfer molding, liquid encapsulant molding, vacuum lamination, spin coating, or other suitable applicator. Encapsulant 154 can be polymer composite material, such as epoxy resin with filler, epoxy acrylate with filler, or polymer with proper filler. Encapsulant 154 is non-conductive and environmentally protects the semiconductor device from external elements and contaminants. In particular, encapsulant 154 is disposed along the sides of semiconductor die 124 and in the gap between active surface 130 and interface layer 152 and thus covers the sides of semiconductor die 124 and exposed portion 140 of active surface 130 along the surface edge of the semiconductor die up to insulating layer 134. Accordingly, encapsulant 154 covers or contacts at least five surfaces of semiconductor die 124, i.e., four side surfaces and portion 140 of active surface 130 of the semiconductor die.

Figure 4D:
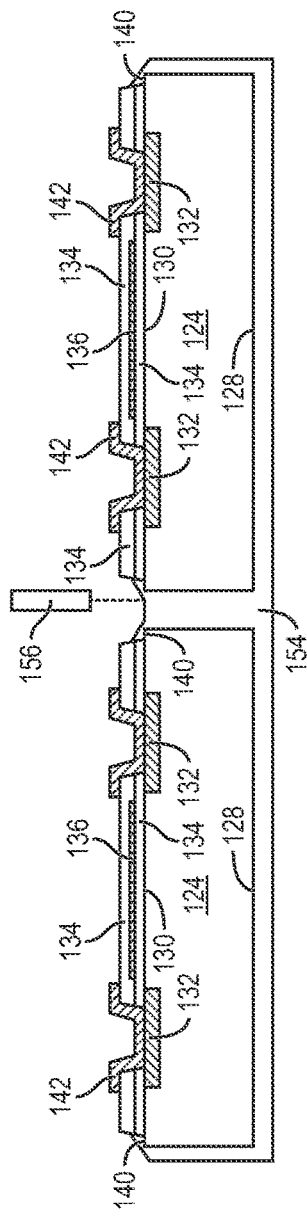

In FIG. 4d, carrier 150 and interface layer 152 are removed by chemical etching, mechanical peeling, chemical mechanical planarization (CMP), mechanical grinding, thermal bake, UV light, laser scanning, or wet stripping to expose insulating layer 134 and conductive layer 142. A portion of encapsulant 154 is removed by LDA using laser 156. Alternatively, a portion of encapsulant 154 is removed by an etching process through a patterned photoresist layer. Portion 140 of active surface 130 along the surface edge of semiconductor die 124, as well as the sides of the semiconductor die, remain covered by encapsulant 154 as a protective panel to increase yield, particularly when surface mounting the semiconductor die. Encapsulant 154 also protects semiconductor die 124 from degradation due to exposure to light. Semiconductor die 124 is prepared for electrical testing by cleaning insulating layer 134 and conductive layer 142 with one or more steps of plasma, wet solvent, copper oxide, or dry cleaning.

Figure 4E:
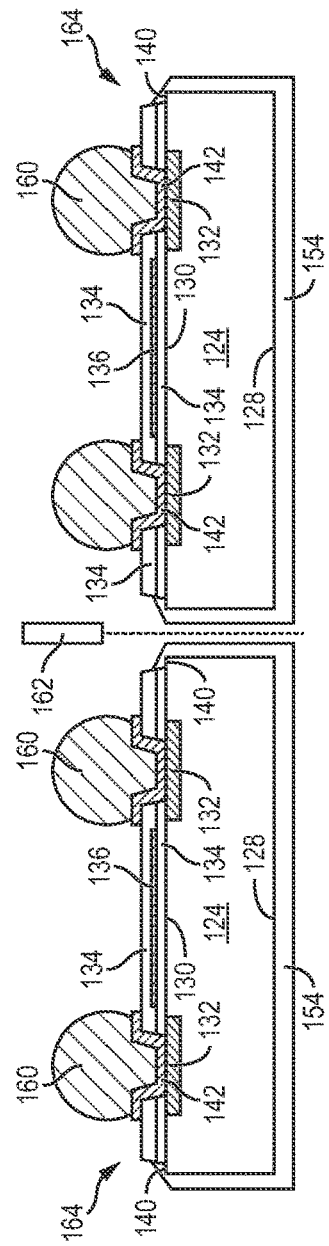

In FIG. 4e, an electrically conductive bump material is deposited over conductive layer 142 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 142 using a suitable attachment or bonding process. In one embodiment, the bump material is reflowed by heating the material above its melting point to form balls or bumps 160. In some applications, bumps 160 are reflowed a second time to improve electrical contact to conductive layer 142. Bumps 160 can also be compression bonded or thermocompression bonded to conductive layer 142. Bumps 160 represent one type of interconnect structure that can be formed over conductive layer 142. The interconnect structure can also use bond wires, conductive paste, stud bump, micro bump, or other electrical interconnect. Laser marking can be performed before or after bump formation, or after removal of carrier 150.

Figure 5:
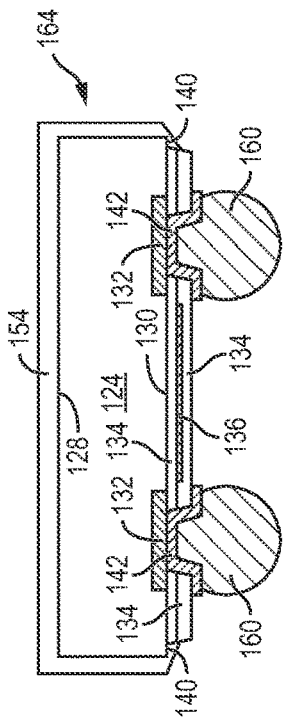
FIG. 5 illustrates the WLCSP with the sides and the exposed portion of the active surface of the semiconductor die covered with the encapsulant.

Semiconductor die 124 are singulated through encapsulant 154 with saw blade or laser cutting tool 162 into individual embedded WLCSP 164. FIG. 5 shows WLCSP 164 after singulation. In one embodiment, WLCSP 164 has dimensions of 3.0×2.6×0.7 millimeters mm with 0.4 mm pitch. Semiconductor die 124 is electrically connected to bumps 160 for external interconnect. Encapsulant 154 covers the sides of semiconductor die 124 and portion 140 of active surface 130 to protect the sides and surface edge of the semiconductor die and increase manufacturing yield, particularly when surface mounting the semiconductor die. Encapsulant 154 also protects semiconductor die 124 from degradation due to exposure to light. WLCSP 164 undergoes electrical testing before or after singulation.

Figure 6A:
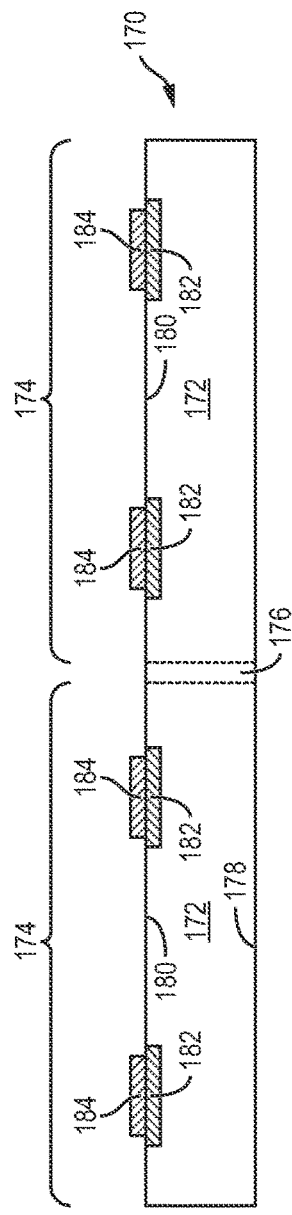
FIGS. 6a-6c illustrate a semiconductor wafer with a plurality of semiconductor die separated by a saw street.
Figure 6B:
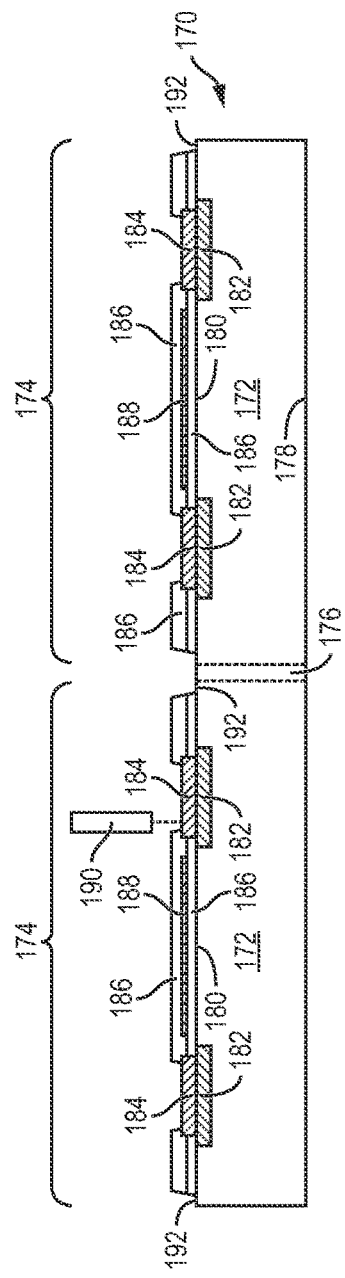
Figure 6C:
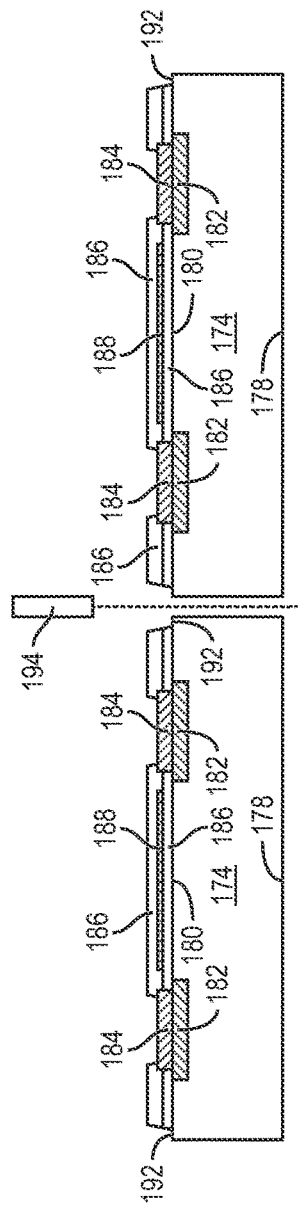

FIGS. 6a-6c illustrate another embodiment of semiconductor wafer 170 with a base substrate material 172, such as silicon, germanium, gallium arsenide, indium phosphide, or silicon carbide, for structural support, similar to FIG. 3a. A plurality of semiconductor die or components 174 is formed on wafer 170 separated by a non-active, inter-die wafer area or saw street 176 as described above. Saw street 176 provides cutting areas to singulate semiconductor wafer 170 into individual semiconductor die 174. In one embodiment, semiconductor wafer 170 is 200-300 mm in diameter. In another embodiment, semiconductor wafer 170 is 100-450 mm in diameter. Semiconductor wafer 170 may have any diameter prior to singulating semiconductor wafer into individual semiconductor die 174.

FIG. 6a shows a cross-sectional view of a portion of semiconductor wafer 170. Each semiconductor die 174 has a back or non-active surface 178 and active surface 180 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 180 to implement analog circuits or digital circuits, such as DSP, ASIC, memory, or other signal processing circuit. Semiconductor die 174 may also contain IPDs, such as inductors, capacitors, and resistors, for RF signal processing.

An electrically conductive layer 182 is formed over active surface 180 using PVD, CVD, electrolytic plating, electroless plating process, or other suitable metal deposition process. Conductive layer 182 can be one or more layers of Al, Cu, Sn, Ni, Au, Ag, or other suitable electrically conductive material. Conductive layer 182 operates as contact pads electrically connected to the circuits on active surface 180. Conductive layer 182 can be formed as contact pads disposed side-by-side a first distance from the edge of semiconductor die 174, as shown in FIG. 6a. Alternatively, conductive layer 182 can be formed as contact pads that are offset in multiple rows such that a first row of contact pads is disposed a first distance from the edge of the die, and a second row of contact pads alternating with the first row is disposed a second distance from the edge of the die.

An electrically conductive layer 184 is formed over conductive layer 182 using PVD, CVD, evaporation, electrolytic plating, electroless plating, or other suitable metal deposition process. Conductive layer 184 can be Al, Cu, Sn, Ni, Au, Ag, W, or other suitable electrically conductive material. Conductive layer 184 is a UBM electrically connected to conductive layer 182. UBMs 184 can be a multimetal stack with adhesion layer, barrier layer, and seed or wetting layer. The adhesion layer is formed over conductive layer 182 and can be Ti, TiN, TiW, Al, or Cr. The barrier layer is formed over the adhesion layer and can be Ni, NiV, Pt, Pd, TiW, Ti, or CrCu. The barrier layer inhibits the diffusion of Cu into the active area of the die. The seed layer is formed over the barrier layer and can be Cu, Ni, NiV, Au, or Al. UBMs 184 provide a low resistive interconnect to conductive layer 182, as well as a barrier to solder diffusion and seed layer for solder wettability.

In FIG. 6b, a first insulating or passivation layer 186 is formed over semiconductor die 174 and conductive layer 184 using PVD, CVD, printing, spin coating, spray coating, sintering or thermal oxidation, i.e., passivation occurs after formation of UBM 184. Insulating layer 186 contains one or more layers of SiO2, Si3N4, SiON, Ta2O5, Al2O3, HfO2, BCB, PI, PBO, polymer, or other dielectric material having similar structural and insulating properties.

An electrically conductive layer or RDL 188 is formed over the first insulating layer 186 using a patterning and metal deposition process such as sputtering, electrolytic plating, and electroless plating. Conductive layer 188 can be one or more layers of Al, Cu, Sn, Ni, Au, Ag, or other suitable electrically conductive material. One portion of conductive layer 188 is electrically connected to conductive layer 182 of semiconductor die 174. Other portions of conductive layer 188 can be electrically common or electrically isolated depending on the design and function of semiconductor die 174.

A second insulating or passivation layer 186 is formed over conductive layer 188 and the first insulating layer 186.

Multiple insulating layers 186 and conductive layers 188 can be formed over active surface 180 of semiconductor die 174. A surface inspection can be performed to detect passivation or RDL defects.

A portion of insulating layer 186 is removed by LDA using laser 190 to expose conductive layer 184 and portion 192 of active surface 180 along a surface edge of semiconductor die 174. That is, portion 192 of active surface 180 along a surface edge of semiconductor die 174 is devoid of insulating layer 186. Alternatively, a portion of insulating layer 186 is removed by an etching process through a patterned photoresist layer to expose conductive layer 182 and portion 192 of active surface 180 along the surface edge of semiconductor die 174.

In FIG. 6c, semiconductor wafer 170 is singulated through saw street 176 using a saw blade or laser cutting tool 194 into individual semiconductor die 174. Individual semiconductor die 174 can be inspected and electrically tested for identification of KGD post singulation.

Figure 7D:
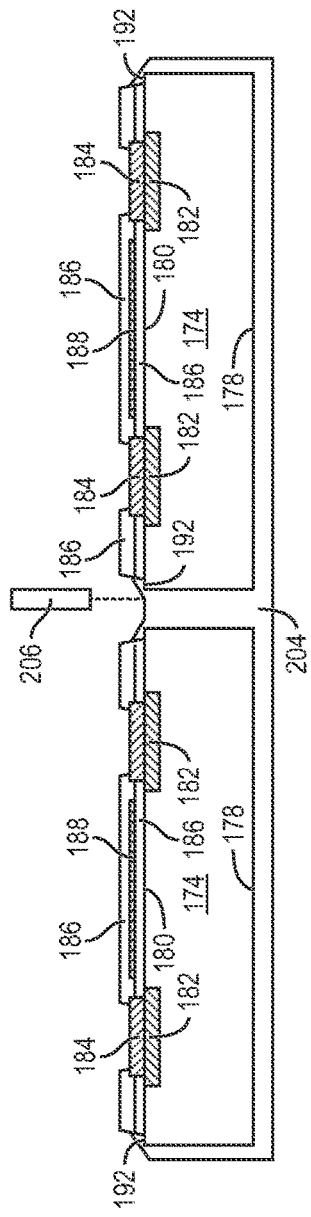

FIGS. 7a-7e illustrate, in relation to FIGS. 1 and 2a-2c, another process of depositing an encapsulant over the sides and an exposed portion of an active surface of a semiconductor die in a WLCSP. FIG. 7a shows a cross-sectional view of a portion of a carrier or temporary substrate 200 containing sacrificial base material such as silicon, polymer, beryllium oxide, glass, or other suitable low-cost, rigid material for structural support. An interface layer or double-sided tape 202 is formed over carrier 200 as a temporary adhesive bonding film, etch-stop layer, or thermal release layer.

Carrier 200 can be a large round or rectangular panel (greater than 300 mm) with capacity for multiple semiconductor die 174. Carrier 200 may have a larger surface area than the surface area of semiconductor wafer 170. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 200 is selected independent of the size of semiconductor die 174 or size of semiconductor wafer 170. That is, carrier 200 has a fixed or standardized size, which can accommodate various size semiconductor die 174 singulated from one or more semiconductor wafers 170. In one embodiment, carrier 200 is circular with a diameter of 330 mm. In another embodiment, carrier 200 is rectangular with a width of 560 mm and length of 600 mm. Semiconductor die 174 may have dimensions of 10 mm by 10 mm, which are placed on standardized carrier 200. Alternatively, semiconductor die 174 may have dimensions of 20 mm by 20 mm, which are placed on the same standardized carrier 140. Accordingly, standardized carrier 200 can handle any size semiconductor die 174, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 200 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Semiconductor die 174 from FIG. 6c are mounted to carrier 200 and interface layer 202 using, for example, a pick and place operation with insulating layer 186 oriented toward the carrier. FIG. 7b shows semiconductor die 174 mounted to interface layer 202 of carrier 200 as reconstituted or reconfigured wafer 203. Active surface 180 of semiconductor die 174 is held off or offset from interface layer 202 by nature of insulating layer 186 contacting the interface layer, i.e., there is a gap between portion 192 of active surface 180 and interface layer 202.

Reconstituted wafer or reconstituted panel 203 can be processed into many types of semiconductor packages, including fan-in WLCSP, reconstituted or embedded WLCSP or eWLCSP, fan-out WLCSP, 3D packages, such as PoP, or other semiconductor packages. Reconstituted panel 203 is configured according to the specifications of the resulting semiconductor package. In one embodiment, semiconductor die 174 are placed on carrier 200 in a high-density arrangement, i.e., 300 μm apart or less, for processing fan-in devices. In another embodiment, semiconductor die 174 are separated by a distance of 50 μm on carrier 200. The distance between semiconductor die 174 on carrier 200 is optimized for manufacturing the semiconductor packages at the lowest unit cost. The larger surface area of carrier 200 accommodates more semiconductor die 174 and lowers manufacturing cost as more semiconductor die 174 are processed per reconstituted panel 203. The number of semiconductor die 174 mounted to carrier 200 can be greater than, less than, or equal to the number of semiconductor die 174 singulated from semiconductor wafer 170. Carrier 200 and reconstituted panel 203 provide the flexibility to manufacture many different types of semiconductor packages using different size semiconductor die 174 from different sized semiconductor wafers 170.

In FIG. 7c, an encapsulant or molding compound 204 is deposited over semiconductor die 174 and carrier 200 using a paste printing, compressive molding, transfer molding, liquid encapsulant molding, vacuum lamination, spin coating, or other suitable applicator. Encapsulant 204 can be polymer composite material, such as epoxy resin with filler, epoxy acrylate with filler, or polymer with proper filler. Encapsulant 204 is non-conductive and environmentally protects the semiconductor device from external elements and contaminants. In particular, encapsulant 204 is disposed along the sides of semiconductor die 174 and in the gap between active surface 180 and interface layer 202 and thus covers the sides of semiconductor die 174 and exposed portion 192 of active surface 180 along the surface edge of the semiconductor die up to insulating layer 186. Accordingly, encapsulant 204 covers or contacts at least five surfaces of semiconductor die 174, i.e., four side surfaces and portion 192 of active surface 180 of the semiconductor die.

In FIG. 7d, carrier 200 and interface layer 202 are removed by chemical etching, mechanical peeling, CMP, mechanical grinding, thermal bake, UV light, laser scanning, or wet stripping to expose insulating layer 186 and conductive layer 184. A portion of encapsulant 204 is removed by LDA using laser 206. Alternatively, a portion of encapsulant 204 is removed by an etching process through a patterned photoresist layer. Portion 192 of active surface 180 along the surface edge of semiconductor die 124, as well as the sides of the semiconductor die, remain covered by encapsulant 204 as a protective panel to increase yield, particularly when surface mounting the semiconductor die. Encapsulant 204 also protects semiconductor die 174 from degradation due to exposure to light. Semiconductor die 174 is prepared for electrical testing by cleaning insulating layer 186 and conductive layer 184 with one or more steps of plasma, wet solvent, copper oxide, or dry cleaning.

Figure 7E:
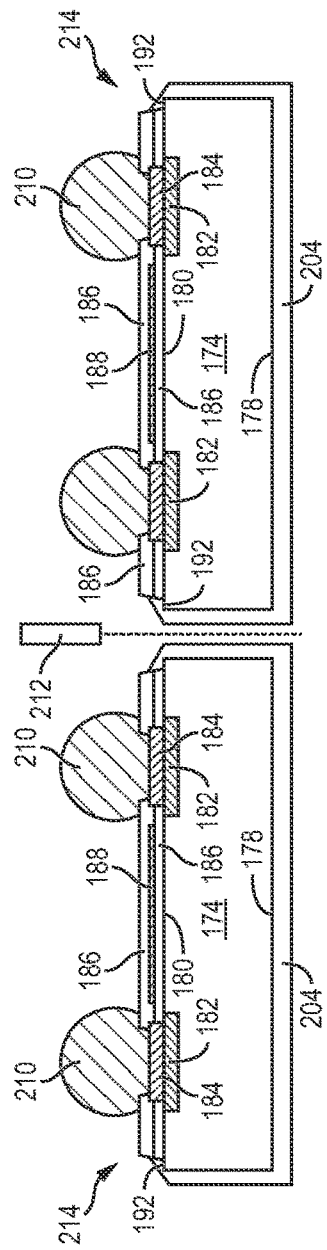

In FIG. 7e, an electrically conductive bump material is deposited over conductive layer 184 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 184 using a suitable attachment or bonding process. In one embodiment, the bump material is reflowed by heating the material above its melting point to form balls or bumps 210. In some applications, bumps 210 are reflowed a second time to improve electrical contact to conductive layer 184. Bumps 210 can also be compression bonded or thermocompression bonded to conductive layer 184. Bumps 210 represent one type of interconnect structure that can be formed over conductive layer 184. The interconnect structure can also use bond wires, conductive paste, stud bump, micro bump, or other electrical interconnect. Laser marking can be performed before or after bump formation, or after removal of carrier 200.

Figure 8:
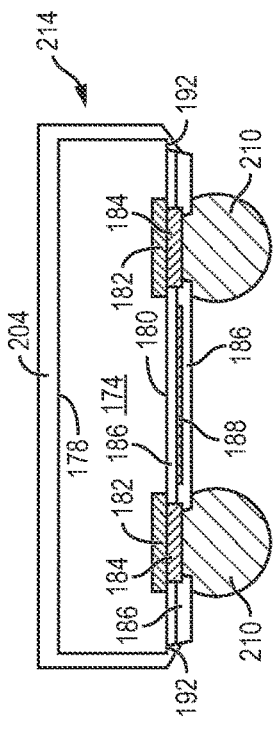
FIG. 8 illustrates the WLCSP with the sides and the exposed portion of the active surface of the semiconductor die covered with the encapsulant.

Semiconductor die 174 are singulated through encapsulant 204 with saw blade or laser cutting tool 212 into individual WLCSP 214. FIG. 8 shows WLCSP 214 after singulation. In one embodiment, WLCSP 214 has dimensions of 3.0×2.6×0.7 millimeters mm with 0.4 mm pitch. Semiconductor die 174 is electrically connected to bumps 210 for external interconnect. Encapsulant 204 covers the sides of semiconductor die 174 and portion 192 of active surface 180 to protect the sides and surface edge of semiconductor die 174 and increase manufacturing yield, particularly when surface mounting the semiconductor die. Encapsulant 204 also protects semiconductor die 174 from degradation due to exposure to light. WLCSP 214 undergoes electrical testing before or after singulation.

Figure 9A:
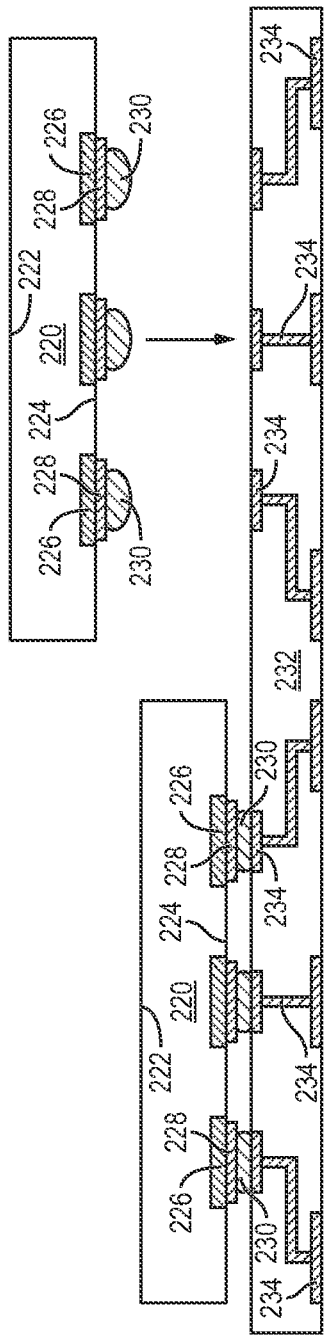
FIGS. 9a-9h illustrate a process of depositing a mold underfill (MUF) material with the sides and a portion of an active surface of a semiconductor die in a WLCSP.

FIGS. 9a-9h illustrate, in relation to FIGS. 1 and 2a-2c, a process of depositing MUF material over the sides and an exposed portion of an active surface of a semiconductor die in a WLCSP. FIG. 9a shows a semiconductor die 220, from a semiconductor wafer similar to FIG. 3a, having a back or non-active surface 222 and active surface 224 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 224 to implement analog circuits or digital circuits, such as DSP, ASIC, memory, or other signal processing circuit. Semiconductor die 220 may also contain IPDs, such as inductors, capacitors, and resistors, for RF signal processing. In one embodiment, semiconductor die 220 is a flipchip type semiconductor die.

An electrically conductive layer 226 is formed over active surface 224 using PVD, CVD, electrolytic plating, electroless plating process, or other suitable metal deposition process. Conductive layer 226 can be one or more layers of Al, Cu, Sn, Ni, Au, Ag, or other suitable electrically conductive material. Conductive layer 226 operates as contact pads electrically connected to the circuits on active surface 224.

An electrically conductive layer 228 is formed over conductive layer 226 using a patterning and metal deposition process such as sputtering, electrolytic plating, and electroless plating. Conductive layer 228 can be Al, Cu, Sn, Ni, Au, Ag, W, or other suitable electrically conductive material. Conductive layer 228 is a UBM electrically connected to conductive layer 226. UBMs 228 can be a multi-metal stack with adhesion layer, barrier layer, and seed or wetting layer. The adhesion layer is formed over conductive layer 226 and can be Ti, TiN, TiW, Al, or Cr. The barrier layer is formed over the adhesion layer and can be Ni, NiV, Pt, Pd, TiW, Ti, or CrCu. The barrier layer inhibits the diffusion of Cu into the active area of the die. The seed layer is formed over the barrier layer and can be Cu, Ni, NiV, Au, or Al. UBMs 228 provide a low resistive interconnect to conductive layer 226, as well as a barrier to solder diffusion and seed layer for solder wettability.

An electrically conductive bump material is deposited over conductive layer 228 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 228 using a suitable attachment or bonding process. In one embodiment, the bump material is reflowed by heating the material above its melting point to form balls or bumps 230. In some applications, bumps 230 are reflowed a second time to improve electrical contact to conductive layer 228. Bumps 230 can also be compression bonded or thermocompression bonded to conductive layer 228. Bumps 230 represent one type of interconnect structure that can be formed over conductive layer 228. The interconnect structure can also use stud bump, micro bump, or other electrical interconnect.

Figure 9B:
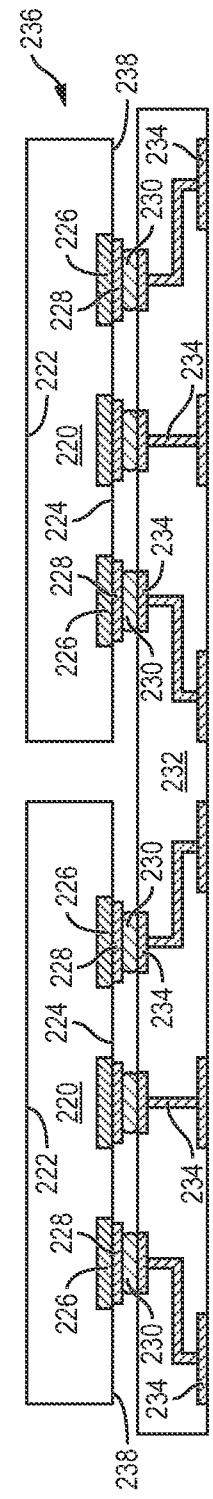

Semiconductor die 220 are mounted to substrate 232 using, for example, a pick and place operation with bumps 230 oriented toward the substrate. Substrate 232 includes conductive traces 234 for vertical and lateral interconnect through the substrate. FIG. 9b shows semiconductor die 220 mounted to substrate 232, as reconstituted or reconfigured wafer 236, with bumps 230 metallurgically and electrically bonded to conductive traces 234. Active surface 224 of semiconductor die 220 is held off or offset from substrate 232 by nature of bumps 230, i.e., there is a gap between portion 238 of active surface 224 and substrate 232. Substrate 232 can be a large round or rectangular panel (greater than 300 mm) with capacity for multiple semiconductor die 220.

Figure 9C:
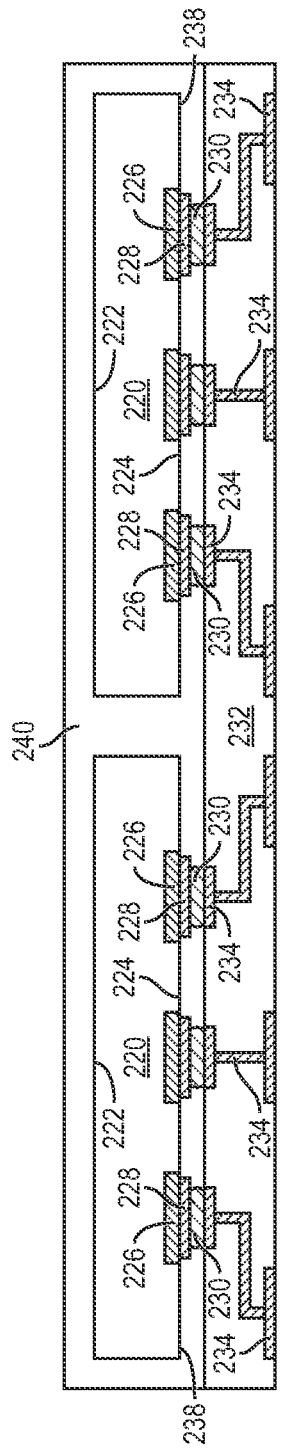

In FIG. 9c, a mold underfill (MUF) material 240 is deposited over semiconductor die 220 and substrate 232 using a paste printing, compressive molding, transfer molding, liquid encapsulant molding, vacuum lamination, spin coating, mold underfill, or other suitable application process. MUF material 240 can be polymer composite material, such as epoxy resin with filler, epoxy acrylate with filler, or polymer with proper filler. MUF material 240 is non-conductive and environmentally protects the semiconductor device from external elements and contaminants. In particular, MUF material 240 is disposed along the sides of semiconductor die 220 and in the gap between active surface 224 and substrate 232 and thus covers the sides of semiconductor die 220 and exposed portion 238 of active surface 224 along the surface edge of the semiconductor die.

Figure 9D:
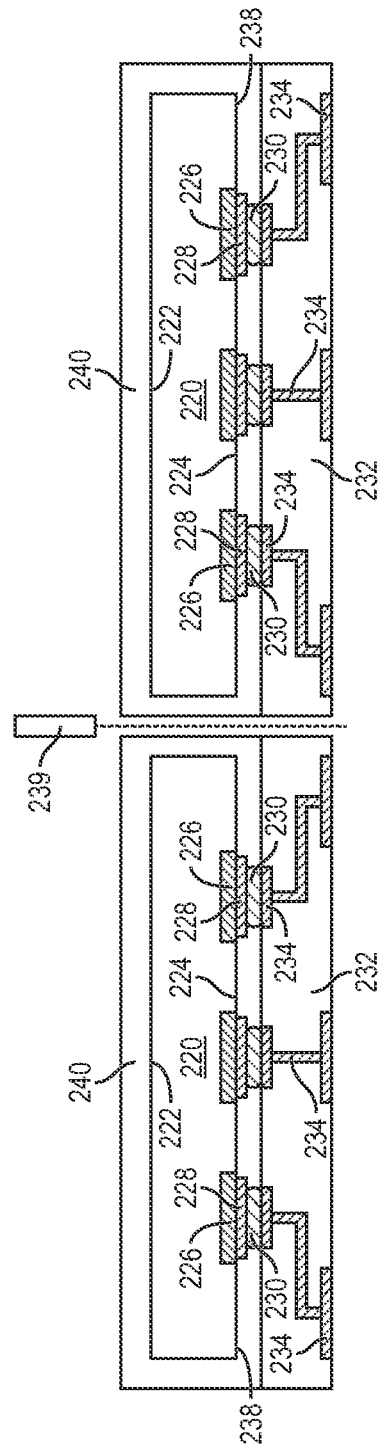

In FIG. 9d, semiconductor die 220 are singulated through MUF material 240 and substrate 232 with saw blade or laser cutting tool 239 to separate the semiconductor die and substrate units. Individual semiconductor die 220 can be inspected and electrically tested for identification of KGD post singulation.

Figure 9E:
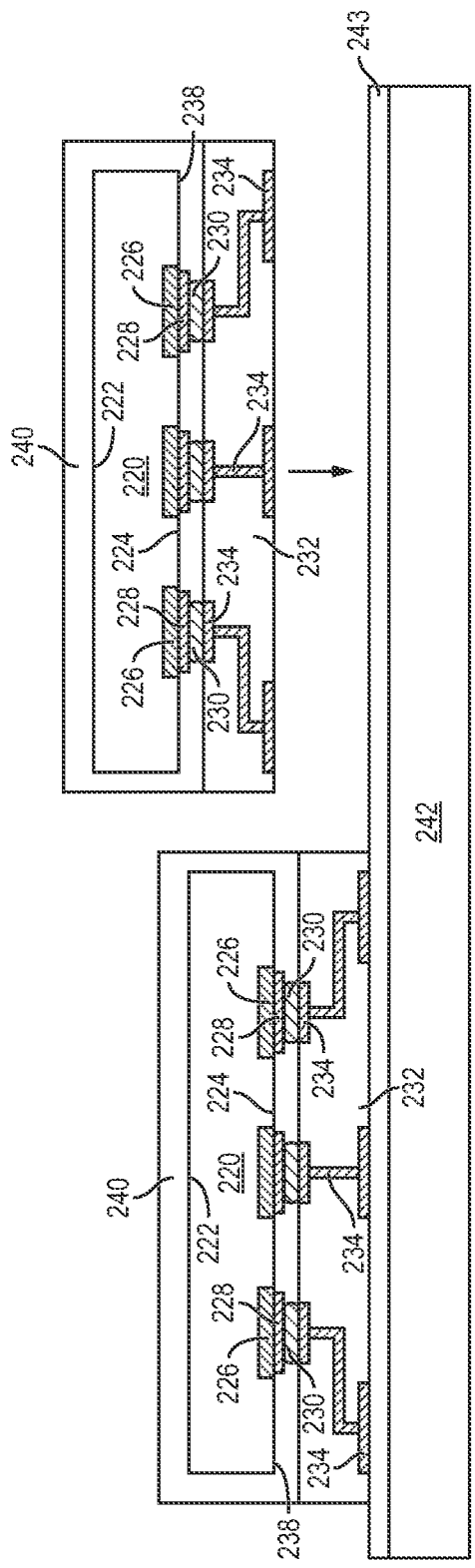

FIG. 9e shows a cross-sectional view of a portion of a carrier or temporary substrate 242 containing sacrificial base material such as silicon, polymer, beryllium oxide, glass, or other suitable low-cost, rigid material for structural support. An interface layer or double-sided tape 243 is formed over carrier 150 as a temporary adhesive bonding film, etch-stop layer, or thermal release layer.

Carrier 242 can be a large round or rectangular panel (greater than 300 mm) with capacity for multiple semiconductor die 220 and substrate 232 units. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 242 is selected independent of the size of semiconductor die 220. That is, carrier 242 has a fixed or standardized size, which can accommodate various size semiconductor die 220 singulated from one or more semiconductor wafers. In one embodiment, carrier 242 is circular with a diameter of 330 mm. In another embodiment, carrier 242 is rectangular with a width of 560 mm and length of 600 mm. Semiconductor die 220 may have dimensions of 10 mm by 10 mm, which are placed on standardized carrier 242. Alternatively, semiconductor die 220 may have dimensions of 20 mm by 20 mm, which are placed on the same standardized carrier 242. Accordingly, standardized carrier 242 can handle any size semiconductor die 220, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 242 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Figure 9F:
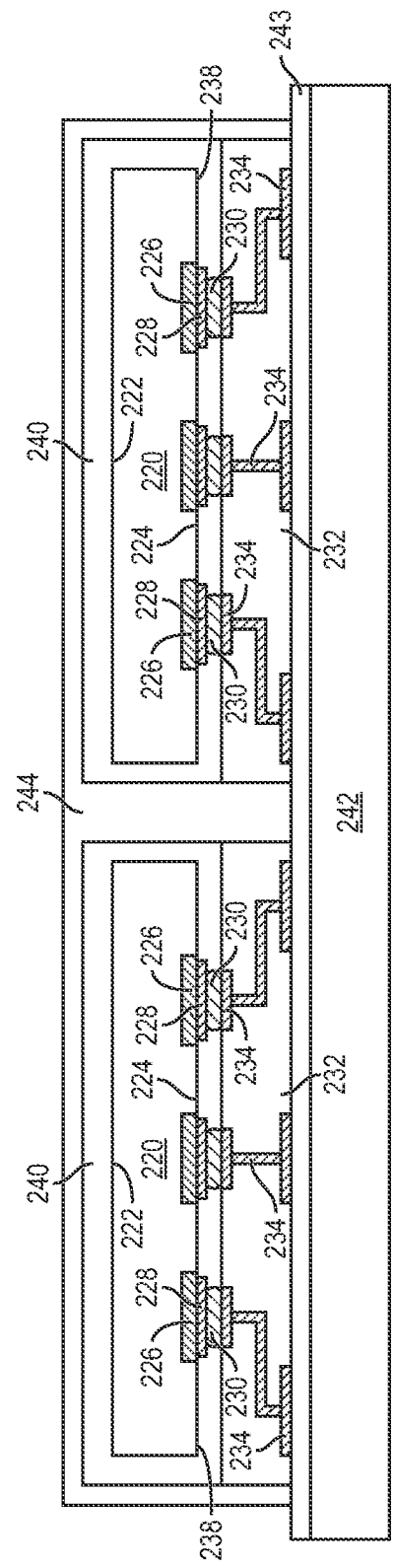

Semiconductor die 220 and substrate 232 units are mounted to carrier 242 and interface layer 243 using, for example, a pick and place operation with the substrate oriented toward the carrier. FIG. 9f shows semiconductor die 220 and substrate 232 units mounted to interface layer 243 of carrier 242.

An encapsulant or molding compound 244 is deposited over MUF material 240, substrate 232, and carrier 242 using a paste printing, compressive molding, transfer molding, liquid encapsulant molding, vacuum lamination, spin coating, or other suitable applicator. Encapsulant 244 can be polymer composite material, such as epoxy resin with filler, epoxy acrylate with filler, or polymer with proper filler. Encapsulant 244 is non-conductive and environmentally protects the semiconductor device from external elements and contaminants.

Figure 9G:
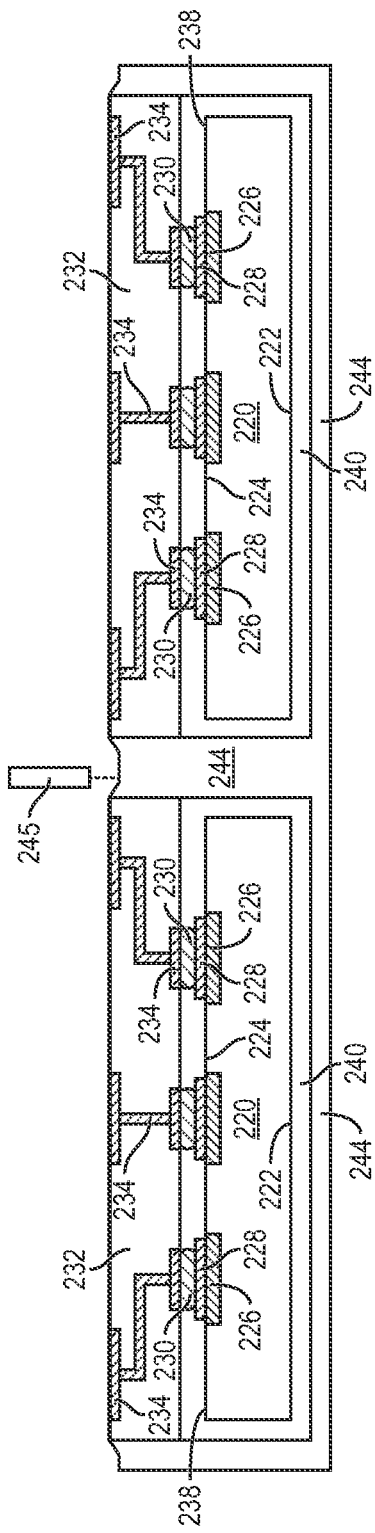

In FIG. 9g, carrier 242 and interface layer 243 are removed by chemical etching, mechanical peeling, CMP, mechanical grinding, thermal bake, UV light, laser scanning, or wet stripping to expose substrate 232 and encapsulant 244. A portion of encapsulant 244 is removed by LDA using laser 245. Alternatively, a portion of encapsulant 244 is removed by an etching process through a patterned photoresist layer.

Figure 9H:
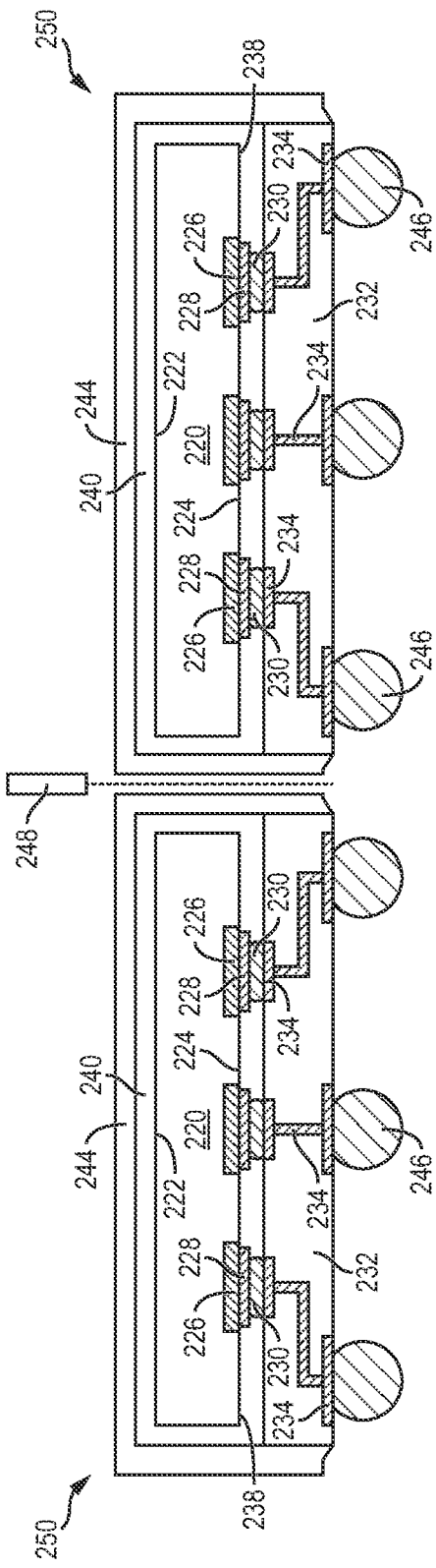

In FIG. 9h, an electrically conductive bump material is deposited over conductive layer 234 of substrate 232 opposite semiconductor die 220 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 234 using a suitable attachment or bonding process. In one embodiment, the bump material is reflowed by heating the material above its melting point to form balls or bumps 246. In some applications, bumps 246 are reflowed a second time to improve electrical contact to conductive layer 234. Bumps 246 can also be compression bonded or thermocompression bonded to conductive layer 234. Bumps 246 represent one type of interconnect structure that can be formed over conductive layer 234. The interconnect structure can also use bond wires, conductive paste, stud bump, micro bump, or other electrical interconnect.

Laser marking can be performed before or after bump formation, or after removal of carrier 242. The assembly undergoes plasma cleaning and flux printing.

Figure 10:
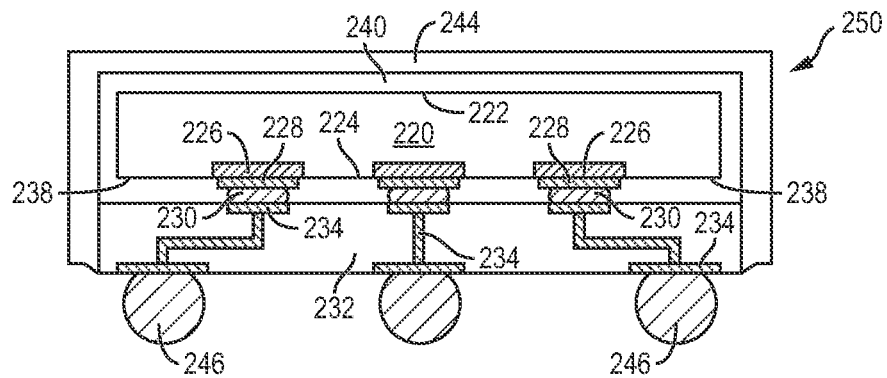
FIG. 10 illustrates the WLCSP with the sides and the portion of the active surface of the semiconductor die covered with the MUF material.

Semiconductor die 220 are singulated through encapsulant 244 with saw blade or laser cutting tool 248 into individual WLCSP 250. FIG. 10 shows WLCSP 250 after singulation. In one embodiment, WLCSP 250 has dimensions of 3.0×2.6×0.7 millimeters mm with 0.4 mm pitch. Semiconductor die 220 is electrically connected to substrate 232 and bumps 246 for external interconnect. MUF material 240 covers the sides of semiconductor die 220 and portion 238 of active surface 224 to protect the sides and surface edge of the semiconductor die and increase manufacturing yield, particularly when surface mounting the semiconductor die. MUF material 240 also protects semiconductor die 220 from degradation due to exposure to light. Encapsulant 244 covers WLCSP 250 to protect the device. WLCSP 250 undergoes electrical testing before or after singulation.

Figure 11:
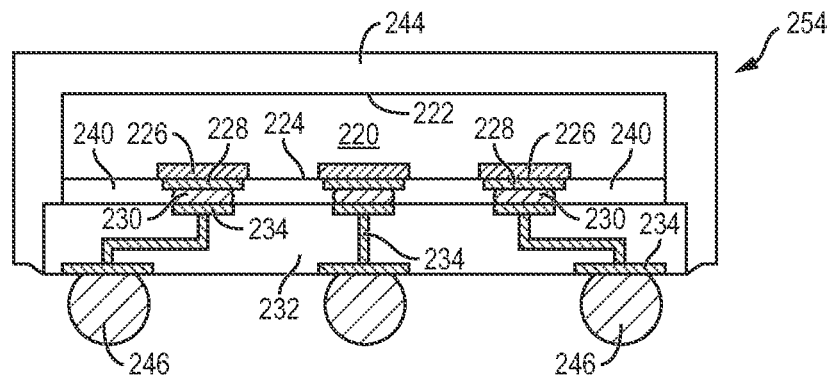
FIG. 11 illustrates the MUF material disposed between the semiconductor die and substrate.

FIG. 11 illustrates an embodiment of WLCSP 254, similar to FIG. 10, with MUF material 240 disposed under semiconductor die 220 and encapsulant 244 covering the side surfaces of the semiconductor die.

Figure 12:
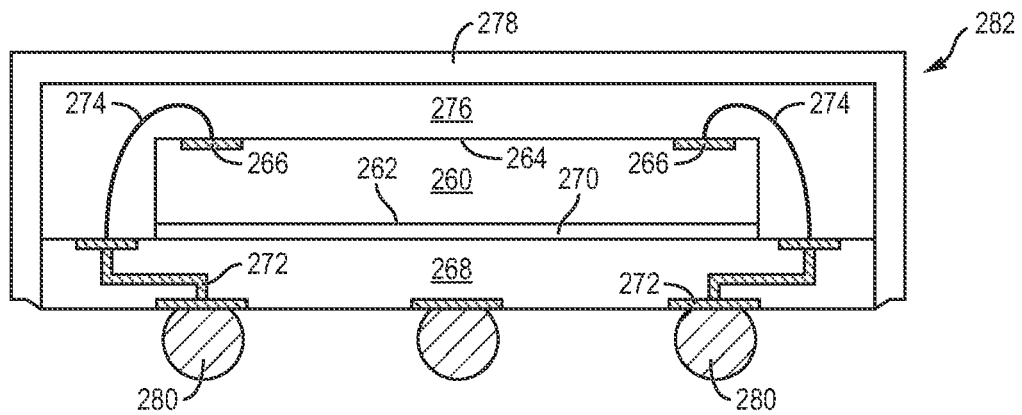
FIG. 12 illustrates a semiconductor package with the sides and the portion of the active surface of the semiconductor die covered with the MUF material.

FIG. 12 illustrates another embodiment of a semiconductor package including semiconductor die 260, from a semiconductor wafer similar to FIG. 3a, having a back or non-active surface 262 and active surface 264 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 264 to implement analog circuits or digital circuits, such as DSP, ASIC, memory, or other signal processing circuit. Semiconductor die 260 may also contain IPDs, such as inductors, capacitors, and resistors, for RF signal processing. In one embodiment, semiconductor die 260 is a wire bond type semiconductor die.

An electrically conductive layer 266 is formed over active surface 264 using PVD, CVD, electrolytic plating, electroless plating process, or other suitable metal deposition process. Conductive layer 266 can be one or more layers of Al, Cu, Sn, Ni, Au, Ag, or other suitable electrically conductive material. Conductive layer 266 operates as contact pads electrically connected to the circuits on active surface 264.

Semiconductor die 260 is mounted to substrate 268 with die attach adhesive 270, such as epoxy resin, similar to FIGS. 9a-9b. Substrate 268 includes conductive traces 272 for vertical and lateral interconnect through the substrate. Bond wires 274 are formed between conductive layer 266 of semiconductor die 260 and conductive traces 272 on substrate 268. Substrate 268 can be a large round or rectangular panel (greater than 300 mm) with capacity for multiple semiconductor die 260.

An encapsulant or molding compound 276 is deposited over semiconductor die 260 and substrate 268 using a paste printing, compressive molding, transfer molding, liquid encapsulant molding, vacuum lamination, spin coating, or other suitable applicator, similar to FIG. 9c. Encapsulant 276 can be polymer composite material, such as epoxy resin with filler, epoxy acrylate with filler, or polymer with proper filler. Encapsulant 276 is non-conductive and environmentally protects the semiconductor device from external elements and contaminants.

Semiconductor die 260 are singulated through encapsulant 276 and substrate 268, similar to FIG. 9d. The singulated semiconductor die 260 and substrate 268 are mounted to a carrier, similar to FIG. 9e. An encapsulant or molding compound 278 is deposited over encapsulant 276 and substrate 268 using a paste printing, compressive molding, transfer molding, liquid encapsulant molding, vacuum lamination, spin coating, or other suitable applicator, similar to FIG. 9f. Encapsulant 278 can be polymer composite material, such as epoxy resin with filler, epoxy acrylate with filler, or polymer with proper filler. Encapsulant 278 is non-conductive and environmentally protects the semiconductor device from external elements and contaminants. The carrier is removed.

An electrically conductive bump material is deposited over conductive layer 272 of substrate 268 opposite semiconductor die 260 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 272 using a suitable attachment or bonding process. In one embodiment, the bump material is reflowed by heating the material above its melting point to form balls or bumps 280. In some applications, bumps 280 are reflowed a second time to improve electrical contact to conductive layer 272. Bumps 280 can also be compression bonded or thermocompression bonded to conductive layer 272. Bumps 280 represent one type of interconnect structure that can be formed over conductive layer 272. The interconnect structure can also use bond wires, conductive paste, stud bump, micro bump, or other electrical interconnect.

Laser marking can be performed before or after bump formation, or after removal of the carrier. The assembly undergoes plasma cleaning and flux printing.

Semiconductor die 260 are singulated through encapsulant 244 into individual semiconductor packages 282 having dimensions of 3.0×2.6×0.7 millimeters mm with 0.4 mm pitch. Semiconductor die 260 is electrically connected to substrate 268 and bumps 280 for external interconnect. Encapsulant 276 covers the side surfaces of semiconductor die 260 to protect the surface edge of the semiconductor die and increase manufacturing yield, particularly when surface mounting the semiconductor die.

Figure 13A:
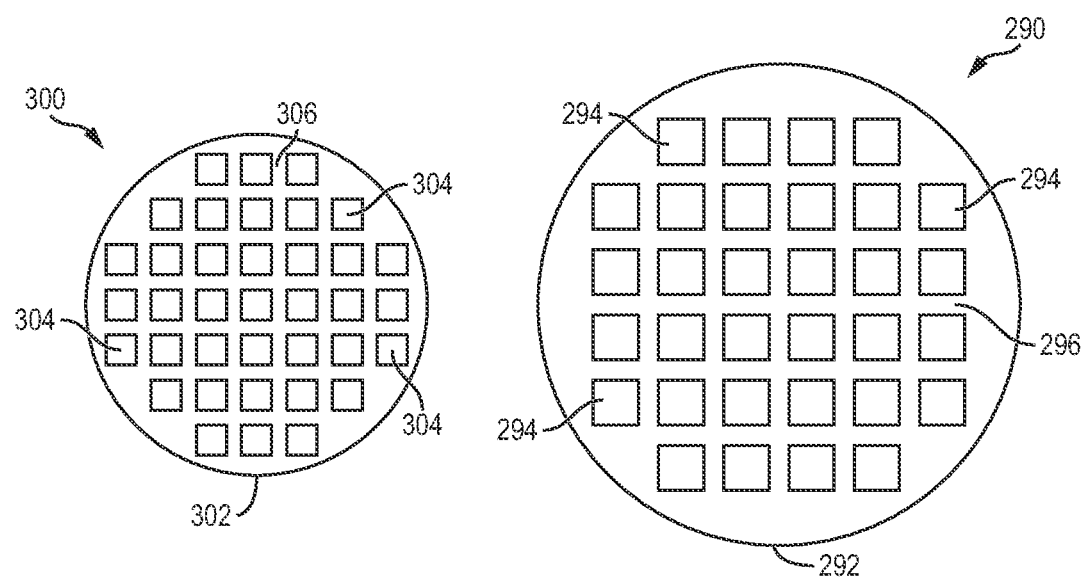
FIGS. 13a-13p illustrate a process of forming a reconstituted or embedded wafer level chip scale package (eWLCSP)

FIGS. 13a-13p illustrate, in relation to FIGS. 1 and 2a-2c, a process of forming a reconstituted or embedded fan-in WLCSP. FIG. 13a shows a semiconductor wafer 290 with a base substrate material 292, such as silicon, germanium, gallium arsenide, indium phosphide, or silicon carbide, for structural support. A plurality of semiconductor die or components 294 is formed on wafer 290 separated by a non-active, inter-die wafer area or saw street 296 as described above. Saw street 296 provides cutting areas to singulate semiconductor wafer 290 into individual semiconductor die 294. Semiconductor wafer 290 may have any diameter prior to singulating semiconductor wafer into individual semiconductor die 294. In one embodiment, semiconductor wafer 290 is 200-300 mm in diameter. In another embodiment, semiconductor wafer 290 is 100-450 mm in diameter. Semiconductor die 294 may have any size, and in one embodiment, semiconductor die 294 have dimensions of 10 mm by 10 mm.

FIG. 13a also shows semiconductor wafer 300, which is similar to semiconductor wafer 290. Semiconductor wafer 300 includes a base substrate material 302, such as silicon, germanium, gallium arsenide, indium phosphide, or silicon carbide, for structural support. A plurality of semiconductor die or components 304 is formed on wafer 300 separated by a non-active, inter-die wafer area or saw street 306 as described above. Saw street 306 provides cutting areas to singulate semiconductor wafer 300 into individual semiconductor die 304. Semiconductor wafer 300 may have the same diameter or a different diameter from semiconductor wafer 290. Semiconductor wafer 300 may have any diameter prior to singulating semiconductor wafer into individual semiconductor die 304. In one embodiment, semiconductor wafer 300 is 200-300 mm in diameter. In another embodiment, semiconductor wafer 300 is 100-450 mm in diameter. Semiconductor die 304 may have any size, and in one embodiment, semiconductor die 304 are smaller than semiconductor die 294 and have dimensions of 5 mm by 5 mm.

Figure 13B:
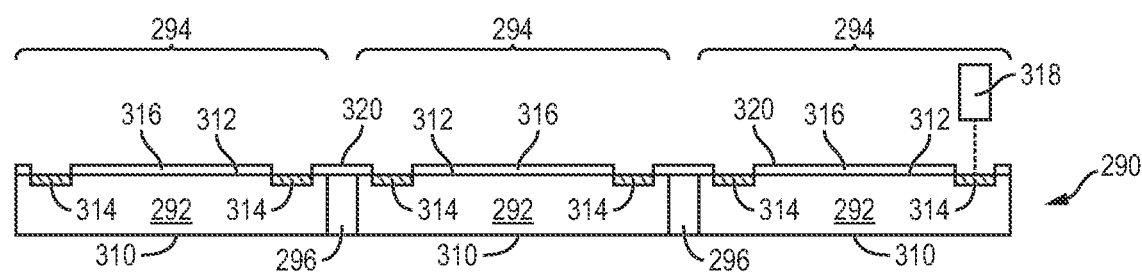

FIG. 13b shows a cross-sectional view of a portion of semiconductor wafer 290. Each semiconductor die 294 has a back or non-active surface 310 and active surface 312 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 312 to implement analog circuits or digital circuits, such as DSP, ASIC, memory, or other signal processing circuit. Semiconductor die 294 may also contain IPDs, such as inductors, capacitors, and resistors, for RF signal processing.

An electrically conductive layer 314 is formed over active surface 312 using PVD, CVD, electrolytic plating, electroless plating process, or other suitable metal deposition process. Conductive layer 314 can be one or more layers of Al, Cu, Sn, Ni, Au, Ag, or other suitable electrically conductive material. Conductive layer 314 operates as contact pads electrically connected to the circuits on active surface 312. Conductive layer 314 can be formed as contact pads disposed side-by-side a first distance from the edge of semiconductor die 294, as shown in FIG. 13b. Alternatively, conductive layer 314 can be formed as contact pads that are offset in multiple rows such that a first row of contact pads is disposed a first distance from the edge of semiconductor die 294, and a second row of contact pads alternating with the first row is disposed a second distance from the edge of semiconductor die 294.

A first insulating or passivation layer 316 is formed over semiconductor die 294 and conductive layer 314 using PVD, CVD, printing, spin coating, spray coating, sintering or thermal oxidation. Insulating layer 316 contains one or more layers of SiO2, Si3N4, SiON, Ta2O5, Al2O3, HfO2, BCB, PI, PBO, polymer, or other dielectric material having similar structural and insulating properties. In one embodiment, insulating layer 316 is a low temperature curing photosensitive dielectric polymer with or without insulating fillers cured at less than 200° C. Insulating layer 316 covers and provides protection for active surface 312. A portion of insulating layer 316 is removed by LDA using laser 318 or an etching process through a patterned photoresist layer to expose conductive layer 314 through surface 320 of insulating layer 316 and provides for subsequent electrical interconnect.

Semiconductor wafer 290 undergoes electrical testing and inspection as part of a quality control process. Manual visual inspection and automated optical systems are used to perform inspections on semiconductor wafer 290. Software can be used in the automated optical analysis of semiconductor wafer 290. Visual inspection methods may employ equipment such as a scanning electron microscope, high-intensity or ultra-violet light, or metallurgical microscope. Semiconductor wafer 290 is inspected for structural characteristics including warpage, thickness variation, surface particulates, irregularities, cracks, delamination, and discoloration.

The active and passive components within semiconductor die 294 undergo testing at the wafer level for electrical performance and circuit function. Each semiconductor die 294 is tested for functionality and electrical parameters using a probe or other testing device. A probe is used to make electrical contact with nodes or contact pads 314 on each semiconductor die 294 and provides electrical stimuli to the contact pads. Semiconductor die 294 respond to the electrical stimuli, which is measured and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 290 enables semiconductor die 294 that pass to be designated as KGD for use in a semiconductor package.

Figure 13C:
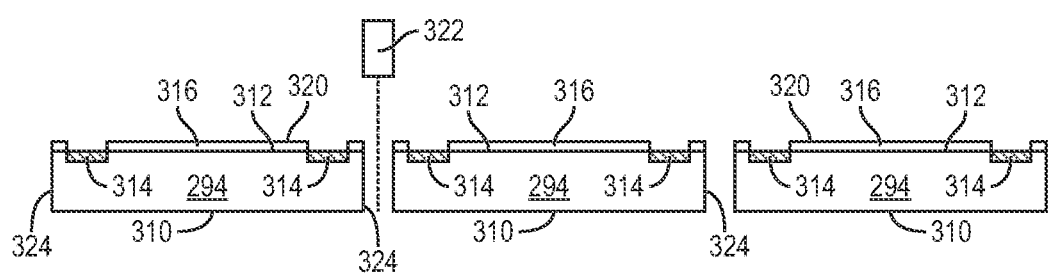

In FIG. 13c, semiconductor wafer 290 is singulated through saw streets 296 using a saw blade or laser cutting tool 322 into individual semiconductor die 294 having edges, sidewalls, or side surfaces 324. Similarly, semiconductor wafer 300 from FIG. 13a is singulated through saw streets 306 using a saw blade or laser cutting tool 322 into individual semiconductor die 304. Individual semiconductor die 294 and 304 can be inspected and electrically tested for identification of KGD post singulation.

FIG. 13d shows a cross-sectional view of a portion of a carrier or temporary substrate 330 containing sacrificial base material such as silicon, polymer, beryllium oxide, glass, or other suitable low-cost, rigid material for structural support. An interface layer or double-sided tape 332 is formed over carrier 330 as a temporary adhesive bonding film, etch-stop layer, or thermal release layer.

Carrier 330 is a standardized carrier with capacity for multiple semiconductor die and can accommodate semiconductor die of multiple sizes singulated from semiconductor wafers having any diameter. For example, carrier 330 can be a round panel with a diameter of 305 mm or greater or can be a rectangular panel with a length of 300 mm or greater and a width of 300 mm or greater. Carrier 330 may have a larger surface area than the surface area of semiconductor wafer 290 or 300. In one embodiment, semiconductor wafer 290 has a diameter of 300 mm and contains semiconductor die 294 which have a length of 10 mm and a width of 10 mm. In one embodiment, semiconductor wafer 300 has a diameter of 200 mm and contains semiconductor 304 which have a length of 5 mm and a width of 5 mm. Carrier 330 can accommodate both 10 mm by 10 mm semiconductor die 294 and 5 mm by 5 mm semiconductor die 304. Carrier 330 carries a greater quantity of 5 mm by 5 mm semiconductor die 304 than a quantity of 10 mm by 10 mm semiconductor die 294. In another embodiment, semiconductor die 294 and 304 have the same dimensions. Carrier 330 is standardized in size and shape to accommodate any size semiconductor die. A larger carrier reduces the manufacturing cost of the semiconductor package as more semiconductor die can be processed on the larger carrier thereby reducing the cost per unit.

Semiconductor packaging and processing equipment are designed and configured for the size of the semiconductor die and carrier being processed. To further reduce manufacturing costs, the size of carrier 330 is selected independent of the size of semiconductor die 294 or 304 and independent of the size of semiconductor wafers 290 and 300. That is, carrier 330 has a fixed or standardized size, which can accommodate various sizes of semiconductor die 294 and 304 singulated from one or more semiconductor wafers 290 or 300. In one embodiment, carrier 330 is circular or round with a diameter of 330 mm. In another embodiment, carrier 330 is rectangular with a width of 560 mm and length of 600 mm.

The size and dimensions of the standardized carrier, carrier 330, is selected during the design of the processing equipment in order to develop a manufacturing line that is uniform for all back-end semiconductor manufacturing of semiconductor devices. Carrier 330 remains constant in size regardless of the size and type of semiconductor packages to be manufactured. For example, semiconductor die 294 may have dimensions of 10 mm by 10 mm and are placed on standardized carrier 330. Alternatively, semiconductor die 294 may have dimensions of 20 mm by 20 mm and are placed on the same standardized carrier 330. Accordingly, standardized carrier 330 can handle any size semiconductor die 294 and 304, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 330 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

In FIG. 13e, semiconductor die 294 from FIG. 13c are mounted to carrier 330 and interface layer 332 using, for example, a pick and place operation with insulating layer 316 oriented toward carrier 330. Semiconductor die 294 are mounted to interface layer 332 of carrier 330 to form reconstituted or reconfigured wafer 336. In one embodiment, insulating layer 316 is embedded within interface layer 332. For example, active surface 312 of semiconductor die 294 may be coplanar with surface 334 of interface layer 332. In another embodiment, insulating layer 316 is mounted over interface layer 332 such that active surface 312 of semiconductor die 294 is offset from interface layer 332.

Reconstituted wafer or reconstituted panel 336 can be processed into many types of semiconductor packages, including fan-in WLCSP, reconstituted or eWLCSP, fan-out WLCSP, flipchip packages, 3D packages, such as PoP, or other semiconductor packages. Reconstituted panel 336 is configured according to the specifications of the resulting semiconductor package. In one embodiment, semiconductor die 294 are placed on carrier 330 in a high-density arrangement, i.e., 300 μm apart or less, for processing fan-in devices. Semiconductor die 294 are placed onto carrier 330 separated by a gap or distance D between semiconductor die 294. Distance D between semiconductor die 294 is selected based on the design and specifications of the semiconductor package to be processed. In one embodiment, distance D between semiconductor die 294 is 50 μm or less. In another embodiment, distance D between semiconductor die 294 is 100 μm or less. Distance D between semiconductor die 294 on carrier 330 is optimized for manufacturing the semiconductor packages at the lowest unit cost.

FIG. 13f shows a plan view of reconstituted panel 336 with semiconductor die 294 mounted to or disposed over carrier 330. Carrier 330 is a standardized shape and size, and therefore constitutes a standardized carrier. Carrier 330 has capacity for various sizes and quantities of semiconductor die, which are singulated from various sizes of semiconductor wafers. In one embodiment, carrier 330 is rectangular in shape and has a width W1 of 560 mm and a length L1 of 600 mm. In another embodiment, carrier 330 is rectangular in shape and has a width W1 of 330 mm and a length L1 of 330 mm. In another embodiment, carrier 330 is round in shape and has a diameter of 330 mm.

The number of semiconductor die 294 disposed over carrier 330 depends on the size of semiconductor die 294 and distance D between semiconductor die 294 within the structure of reconstituted panel 336. The number of semiconductor die 294 mounted to carrier 330 can be greater than, less than, or equal to the number of semiconductor die 294 singulated from semiconductor wafer 290. The larger surface area of carrier 330 accommodates more semiconductor die 294 and lowers manufacturing cost as more semiconductor die 294 are processed per reconstituted panel 336. In one example, semiconductor wafer 290 has a diameter of 300 mm with a quantity of approximately 600 individual 10 mm by 10 mm semiconductor die 294 formed on semiconductor wafer 290. Semiconductor die 294 are singulated from one or more semiconductor wafers 290. Carrier 330 is prepared, for example, with a standard width W1 of 560 mm and a standard length L1 of 600 mm. Carrier 330 with a width W1 of 560 mm is sized to accommodate a quantity of approximately 54 semiconductor die 294, with dimensions of 10 mm by 10 mm and spaced a distance D of 200 μm apart, across width W1 of carrier 330. Carrier 330 with a length L1 of 600 mm is sized to accommodate a quantity of approximately 58 semiconductor die 294, with dimensions of 10 mm by 10 mm spaced a distance D of 200 μm apart, across length L1 of carrier 330. Accordingly, the surface area of carrier 330, width W1 multiplied by length L1, accommodates a quantity of approximately 3,000 semiconductor die 294 with dimensions of 10 mm by 10 mm and a gap or distance D of 200 μm between semiconductor die 294. Semiconductor die 294 can be placed on carrier 330 with a gap or distance D of less than 200 μm between semiconductor die 294 to increase the density of semiconductor die 294 on carrier 330 and further reduce the cost of processing semiconductor die 294.

Automated pick and place equipment is used to prepare reconstituted panel 336 based on the quantity and size of semiconductor die 294 and based on the dimensions of carrier 330. For example, semiconductor die 294 is selected with dimensions of 10 mm by 10 mm. Carrier 330 has standard dimensions, for example, 560 mm width W1 and 600 mm length L1. Automated equipment is programmed with the dimensions of semiconductor die 294 and carrier 330 in order to process reconstituted panel 336. After singulating semiconductor wafer 290, a first semiconductor die 294 is selected by the automated pick and place equipment. A first semiconductor die 294 is mounted to carrier 330 in a position on carrier 330 determined by the programmable automated pick and place equipment. A second semiconductor die 294 is selected by the automated pick and place equipment, and placed on carrier 330 and positioned in a first row on carrier 330. Distance D between adjacent semiconductor die 294 is programmed into the automated pick and place equipment and is selected based on the design and specifications of the semiconductor package to be processed. In one embodiment, the gap or distance D between adjacent semiconductor die 294 on carrier 330 is 200 μm. A third semiconductor die 294 is selected by the automated pick and place equipment, and placed on carrier 330 and positioned in the first row on carrier 330 a distance D of 200 μm from an adjacent semiconductor die 294. The pick and place operation is repeated until a first row of approximately 54 semiconductor die 294 is disposed across width W1 of carrier 330.

Another semiconductor die 294 is selected by the automated pick and place equipment, and placed on carrier 330 and positioned in a second row adjacent to the first row on carrier 330. Distance D between adjacent rows of semiconductor die 294 is preselected and programmed into the automated pick and place equipment. In one embodiment, the distance D between a first row of semiconductor die 294 and a second row of semiconductor die 294 is 200 μm. The pick and place operation is repeated until approximately 58 rows of semiconductor die 294 are disposed across length L1 of carrier 330. The standardized carrier, carrier 330 with width W1 of 560 mm and length L1 of 600 mm, accommodates approximately 54 columns and 58 rows of 10 mm by 10 mm semiconductor die 294 for a total quantity of approximately 3,000 semiconductor die 294 disposed on carrier 330. The pick and place operation is repeated until carrier 330 is partially or completely populated with semiconductor die 294. With a standardized carrier, such as carrier 330, the automated pick and place equipment can mount any size semiconductor die 294 on carrier 330 to form reconstituted panel 336. Reconstituted panel 336 can subsequently be processed using back-end processing equipment that is standardized for standardized carrier 330.

Figure 13G:
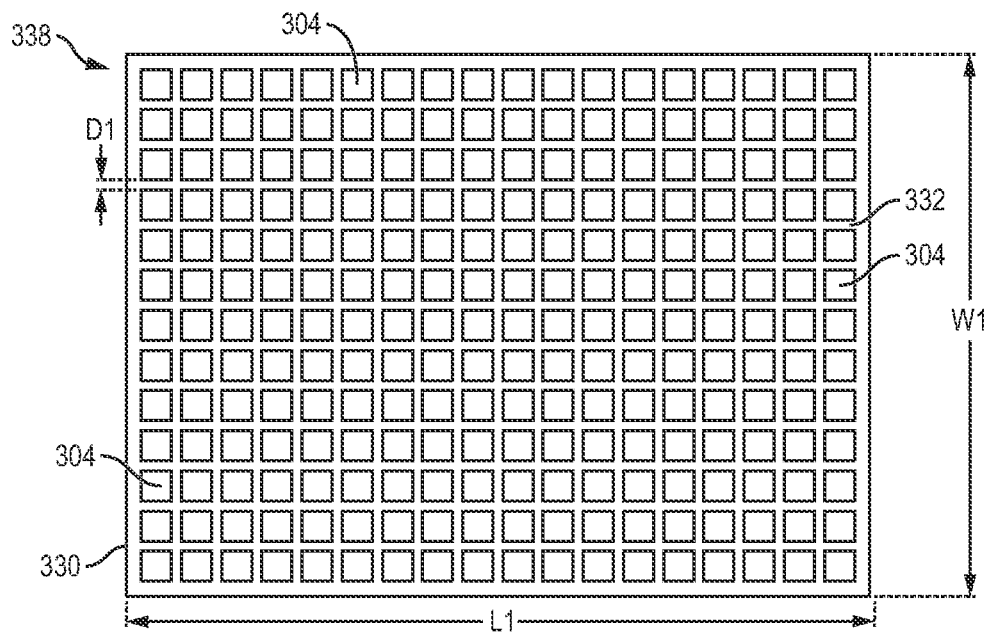

FIG. 13g shows a plan view of reconstituted wafer or reconstituted panel 338 with semiconductor die 304 mounted to or disposed over carrier 330. The same standardized carrier 330, or a standardized carrier with the same size as carrier 330, is used to process reconstituted panel 338 as was used to process reconstituted panel 336. Any configuration of semiconductor die on a reconstituted wafer or panel can be supported by carrier 330. The number of semiconductor die 304 disposed over carrier 330 depends on the size of semiconductor die 304 and distance D1 between semiconductor die 304 within the structure of reconstituted panel 338. The number of semiconductor die 304 mounted to carrier 330 can be greater than, less than, or equal to the number of semiconductor die 304 singulated from semiconductor wafer 300. The larger surface area of carrier 330 accommodates more semiconductor die 304 and lowers manufacturing cost as more semiconductor die 304 are processed per reconstituted panel 338.

In one example, semiconductor wafer 300 has a diameter of 200 mm with a quantity of approximately 1,000 individual 5 mm by 5 mm semiconductor die 304 formed on semiconductor wafer 300. Semiconductor die 304 are singulated from one or more semiconductor wafers 300. Carrier 330 is prepared, for example, with a standard width W1 of 560 mm and a standard length L1 of 600 mm. Carrier 330 with a width W1 of 560 mm is sized to accommodate a quantity of approximately 107 semiconductor die 304, with dimensions of 5 mm by 5 mm spaced a distance D1 of 200 µm apart, across width W1 of carrier 330. Carrier 330 with a length L1 of 600 mm is sized to accommodate a quantity of approximately 115 semiconductor die 304, with dimensions of 5 mm by 5 mm spaced a distance D1 of 200 µm apart, across length L1 of carrier 330. Accordingly, the surface area of carrier 330, width W1 multiplied by length L1, accommodates approximately 12,000 semiconductor die 304 with dimensions of 5 mm by 5 mm spaced a distance D1 of 200 µm apart. Semiconductor die 304 can be placed on carrier 330 with a gap or distance D1 of less than 200 µm between semiconductor die 304 to increase the density of semiconductor die 304 on carrier 330 and further reduce the cost of processing semiconductor die 304.

Automated pick and place equipment is used to prepare reconstituted panel 338 based on the quantity and size of semiconductor die 304 and based on the dimensions of carrier 330. For example, semiconductor die 304 is selected with dimensions of 5 mm by 5 mm. Carrier 330 has standard dimensions, for example, 560 mm width W1 and 600 mm length L1. Automated equipment is programmed with the dimensions of semiconductor die 304 and carrier 330 in order to process reconstituted panel 338. After singulating semiconductor wafer 300, a first semiconductor die 304 is selected by the automated pick and place equipment. A first semiconductor die 304 is mounted to carrier 330 in a position on carrier 330 determined by the programmable automated pick and place equipment. A second semiconductor die 304 is selected by the automated pick and place equipment, and placed on carrier 330 and positioned in a first row on carrier 330 a distance D1 from the first semiconductor die 304. Distance D1 between adjacent semiconductor die 304 is programmed into the automated pick and place equipment and is selected based on the design and specifications of the semiconductor package to be processed. In one embodiment, the gap or distance D1 between adjacent semiconductor die 304 on carrier 330 is 200 µm. A third semiconductor die 304 is selected by the automated pick and place equipment, and placed on carrier 330 and positioned in the first row on carrier 330. The pick and place operation is repeated until a row of approximately 107 semiconductor die 304 is disposed across width W1 of carrier 330.

Another semiconductor die 304 is selected by the automated pick and place equipment, placed on carrier 330, and positioned in a second row adjacent to the first row on carrier 330. Distance D1 between adjacent rows of semiconductor die 304 is preselected and programmed into the automated pick and place equipment. In one embodiment, distance D1 between a first row of semiconductor die 304 and a second row of semiconductor die 304 is 200 µm. The pick and place operation is repeated until approximately 115 rows of semiconductor die 304 are disposed across length L1 of carrier 330. The standardized carrier, carrier 330 with width W1 of 560 mm and length L1 of 600 mm, accommodates approximately 107 columns and 115 rows of 5 mm by 5 mm semiconductor die 304 for a total quantity of approximately 12,000 semiconductor die 304 disposed on carrier 330. The pick and place operation is repeated until carrier 330 is partially or completely populated with semiconductor die 304. With a standardized carrier, such as carrier 330, the automated pick and place equipment can mount any size semiconductor die on carrier 330 to form reconstituted panel 338. Reconstituted panel 338 can be processed using the same carrier 330 and same back-end processing equipment as was used to process reconstituted panel 336.

Both reconstituted panel 336 from FIG. 13f and reconstituted panel 338 from FIG. 13g use the same carrier 330 or use a carrier having the same standardized size for both reconstituted panels 336 and 338. The processing equipment designed for back-end processing of the reconstituted wafers or panels is standardized for carrier 330 and is capable of processing any configuration of reconstituted wafer or panel formed on carrier 330 and any size semiconductor die placed on carrier 330. Because both reconstituted panels 336 and 338 use the same standardized carrier 330, the reconstituted panels can be processed on the same manufacturing line. Accordingly, a purpose of standardized carrier 330 is to simplify the equipment needed to manufacture semiconductor packages.

In another example, reconstituted panel 338 includes semiconductor die 294 and 304 where each semiconductor die 294 and 304 has the same dimensions, and the semiconductor die originate from semiconductor wafers 290 and 300 which have different diameters. Semiconductor wafer 290 has a diameter of 450 mm with a quantity of approximately 2,200 individual 8 mm by 8 mm semiconductor die 294 formed on semiconductor wafer 290. Semiconductor die 294 having dimensions of 8 mm by 8 mm are singulated from one or more semiconductor wafers 290. Additionally, semiconductor wafer 300 has a diameter of 300 mm with a quantity of approximately 900 individual 8 mm by 8 mm semiconductor die 304 formed on semiconductor wafer 300. Semiconductor die 304 having dimensions of 8 mm by 8 mm are singulated from one or more semiconductor wafers 300. Carrier 330 is prepared, for example, with a standard width W1 of 560 mm and a standard length L1 of 600 mm. Carrier 330 with a width W1 of 560 mm is sized to accommodate a quantity of approximately 69 semiconductor die 294 or 304, with dimensions of 8 mm by 8 mm spaced a distance D or D1 of 100 µm apart, across width W1 of carrier 330. Carrier 330 with a length L1 of 560 mm is sized to accommodate a quantity of approximately 74 semiconductor die 294 or 304, with dimensions of 8 mm by 8 mm spaced a distance D or D1 of 100 µm apart, across length L1 of carrier 330. The surface area of carrier 330, width W1 multiplied by length L1, accommodates approximately 5,000 semiconductor die 294 or 304 with dimensions of 8 mm by 8 mm spaced a distance D or D1 of 100 µm apart. Semiconductor die 294 and 304 can be placed on carrier 330 with a gap or distance D or D1 of less than 100 µm between semiconductor die 294 or 304 to increase the density of semiconductor die 294 and 304 on carrier 330 and further reduce the cost of processing semiconductor die 294 and 304.

Automated pick and place equipment is used to prepare reconstituted panel 338 based on the quantity and size of semiconductor die 294 and 304 and based on the dimensions of carrier 330. After singulating semiconductor wafer 300, a first semiconductor die 294 or 304 is selected by the automated pick and place equipment. 8 mm by 8 mm semiconductor die 294 or 304 can originate from either semiconductor wafer 290, having a 450 mm diameter, or from semiconductor wafer 300, having a 300 mm diameter. Alternatively, the 8 mm by 8 mm semiconductor die originate from another semiconductor wafer having a different diameter. A first semiconductor die 294 or 304 is mounted to carrier 330 in a position on carrier 330 determined by the programmed automated pick and place equipment. A second semiconductor die 294 or 304 is selected by the automated pick and place equipment, placed on carrier 330, positioned in a first row on carrier 330. Distance D or D1 between adjacent semiconductor die 294 or 304 is programmed into the automated pick and place equipment and is selected based on the design and specifications of the semiconductor package to be processed. In one embodiment, the gap or distance D or D1 between adjacent semiconductor die 294 or 304 on carrier 330 is 100 µm. The pick and place operation is repeated until a row of approximately 69 semiconductor die 294 or 304 is disposed across width W1 of carrier 330.

Another semiconductor die 294 or 304 is selected by the automated pick and place equipment, placed on carrier 330, and positioned in a second row adjacent to the first row on carrier 330. In one embodiment, distance D or D1 between a first row of semiconductor die 294 or 304 and a second row of semiconductor die 294 or 304 is 100 µm. The pick and place operation is repeated until approximately 74 rows of semiconductor die 294 or 304 are disposed across length L1 of carrier 330. The standardized carrier, carrier 330 with width W1 of 560 mm and length L1 of 600 mm, accommodates approximately 69 columns and 74 rows of 8 mm by 8 mm semiconductor die 294 and 304 for a total quantity of approximately 5,000 semiconductor die 294 disposed on carrier 330. The pick and place operation is repeated until carrier 330 is partially or completely populated with semiconductor die 294 or 304. Therefore, reconstituted panel 338 may include semiconductor die 294 and 304 singulated from any size semiconductor wafer. The size of carrier 330 is independent of the size of semiconductor die 294 and 304 and is independent of the size of semiconductor wafers 290 and 300. Reconstituted panel 338 can be processed using the same carrier 330 and same back-end processing equipment as was used to process reconstituted panel 336. For reconstituted wafers or panels having the same size semiconductor die singulated from different size incoming wafers, standardized carrier 330 allows the same materials to be used for each reconstituted wafer or panel. Therefore, the bill of materials for a reconstituted panel 336 or 338 on carrier 330 remains constant. A consistent and predictable bill of materials allows for improved cost analysis and planning for semiconductor packaging.

In another embodiment, a reconstituted panel 338 contains a variety of semiconductor die sizes disposed on carrier 330. For example, 10 mm by 10 mm semiconductor die 294 are mounted to carrier 330, and 5 mm by 5 mm semiconductor die 304 are mounted to carrier 330 to form reconstituted panel 338. The reconstituted panel contains multiple sizes of semiconductor die on the same reconstituted panel. In other words, a portion of reconstituted panel 338 contains one size semiconductor die and another portion of the reconstituted panel contains another size semiconductor die. Reconstituted panel 338 containing different sizes of semiconductor die 294 and 304 simultaneously on carrier 330 is processed using the same back-end processing equipment as was used to process another reconstituted panel 336 having uniformly sized semiconductor die disposed over carrier 330.

In summary, carrier 330 has capacity for various sizes and quantities of semiconductor die, which are singulated from various sizes of semiconductor wafers. The size of carrier 330 does not vary with the size of semiconductor die being processed. The standardized carrier, carrier 330, is fixed in size and can accommodate multiple sizes of semiconductor die. The size of standardized carrier 330 is independent of the dimensions of the semiconductor die or semiconductor wafer. More small semiconductor die than larger semiconductor die can fit on carrier 330. The number of semiconductor die 294 or 304, which fit on carrier 330, varies with the size of semiconductor die 294 or 304 and space or distance D or D1 between semiconductor die 294 or 304. For example, carrier 330 having length L1 and width W1 accommodates a greater number of 5 mm by 5 mm semiconductor die 304 over the surface area of carrier 330 than a number of 10 mm by 10 mm semiconductor die 294 over the surface area of carrier 330. For example, carrier 330 holds approximately 3,000 10 mm by 10 mm semiconductor die or approximately 12,000 5 mm by 5 mm semiconductor die. The size and shape of carrier 330 remains fixed and independent of the size of semiconductor die 294 or 304 or semiconductor wafer 290 or 300 from which semiconductor die 294 or 304 are singulated. Carrier 330 provides the flexibility to manufacture reconstituted panels 336 and 338 into many different types of semiconductor packages with different size semiconductor die 294 and 304 from different sized semiconductor wafers 290 and 300 using a common set of processing equipment.

Figure 13H:
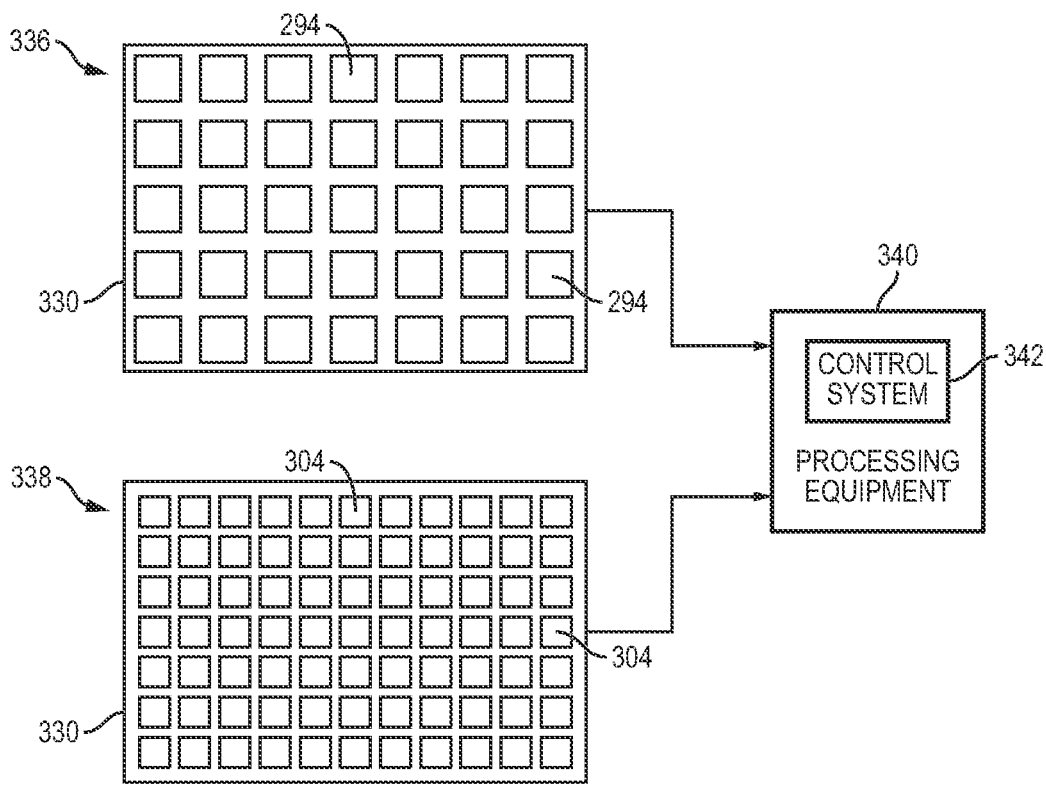

FIG. 13h shows a process of using carrier 330 to manufacture semiconductor packages. Processing equipment 340 is used to perform the back-end manufacturing processes on semiconductor die, such as deposition of encapsulant and insulating layers, deposition of conductive layers, bumping, reflowing, marking, singulation, and other back-end processes. Processing equipment 340 is designed for the size and shape of a standardized carrier, such as carrier 330. Processing equipment 340 is compatible with carrier 330, because the mechanical and electrical components of processing equipment 340 are customized for the standardized size and shape of carrier 330.

Processing equipment 340 is controlled by control system 342. Control system 342 can be a software program or algorithm used to configure processing equipment 340 according to the size and shape of the semiconductor die on carrier 330. Control system 342 is programmed and customized in order for processing equipment 340 to handle each different reconstituted wafer or panel, such as reconstituted panels 336 and 338, formed on standardized carrier 330.

By standardizing the dimensions of carrier 330, processing equipment 340 can remain constant, because the dimensions of carrier 330 do not change with variables of semiconductor die size and semiconductor wafer size. Control system 342 uses various algorithms for each reconstituted panel on carrier 330. For example, control system 342 can be used to optimize the spacing during the initial pick and place operation of semiconductor die 294 on carrier 330. The specifications of reconstituted panel 336 are inputted into control system 342. Control system 342 is programmed to control processing equipment 340 to pick individual semiconductor die 294 and place semiconductor die 294 onto carrier 330 a distance D apart to form reconstituted panel 336. Reconstituted panel 336 includes, for example, 10 mm by 10 mm semiconductor die 294 and standard dimensions of carrier 330, width W1 and length L1. Processing equipment 340 is configured with control system 342 to perform back-end processes on reconstituted panel 336, which is on carrier 330. Control system 342 directs processing equipment 340 to perform deposition and other manufacturing steps according to the 10 mm by 10 mm size of semiconductor die 294 and standard size carrier 330.

Control system 342 allows processing equipment 340 to be customized for each reconstituted wafer or panel on standardized carrier 330. Processing equipment 340 does not need to be re-built for a different size of semiconductor die. After processing reconstituted panel 336, processing equipment 340 is ready to process another reconstituted panel on carrier 330 with the same or different semiconductor die size and spacing. The specifications of reconstituted panel 338 are inputted into control system 342. Control system 342 is programmed to control processing equipment 340 to pick individual semiconductor die 304 and place semiconductor die 304 onto carrier 330 a distance D1 apart to form reconstituted panel 338. Reconstituted panel 338 includes, for example, 5 mm by 5 mm semiconductor die 304 and standard dimensions of carrier 330, width W1 and length L1. Processing equipment 340 is configured with control system 342 to perform back-end processes on reconstituted panel 338, which is on carrier 330. Control system 342 directs processing equipment 340 to perform deposition and other manufacturing steps according to the 5 mm by 5 mm size of semiconductor die 304 and standard size carrier 330.

Processing equipment 340 remains constant whether processing equipment 340 is processing reconstituted panel 336 or 338, or other reconstituted panel on standardized carrier 330. Control system 342 is programmable and processing equipment 340 is easily adaptable to any reconstituted wafer or panel which uses carrier 330. Therefore, the mechanical and physical characteristics of processing equipment 340 are designed to accommodate the physical characteristics of standardized carrier 330, while processing equipment 340 is also programmable with control system 342 to perform manufacturing processes on any configuration of semiconductor die on carrier 330.

Processing equipment 340 is used for manufacturing a variety of semiconductor packages from a reconstituted wafer or panel on carrier 330. For example, processing equipment 340 can be used to process reconstituted panel 336 or 338 into fan-in WLCSP, reconstituted or eWLCSP, fan-out WLCSP, flipchip packages, 3D packages, such as PoP, or other semiconductor packages. Control system 342 is used to modify and control the operation of processing equipment 340 to perform back-end manufacturing steps according to the semiconductor package to be produced. Therefore, processing equipment 340 can be used to manufacture each semiconductor package described herein. Processing equipment 340 can be used across multiple product manufacturing lines which share the same size carrier 330. Accordingly, the cost associated with changes in the size of semiconductor die, the size of semiconductor wafer, and type of semiconductor package can be reduced. The risk of investment in processing equipment 340 is reduced, because the design of processing equipment 340 is simplified where carrier 330 is standardized.

In FIG. 13i, an encapsulant or molding compound 344 is deposited over semiconductor die 294 and carrier 330 using a paste printing, transfer molding, liquid encapsulant molding, vacuum lamination, spin coating, or other suitable applicator. Encapsulant 344 can be polymer composite material, such as epoxy resin with filler, epoxy acrylate with filler, or polymer with proper filler. Encapsulant 344 is non-conductive and environmentally protects the semiconductor device from external elements and contaminants. In another embodiment, encapsulant 344 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, SiO2, Si3N4, SiON, Ta2O5, Al2O3, prepreg, or other dielectric material having similar insulating and structural properties deposited using printing, spin coating, spray coating, vacuum or pressure lamination with or without heat, or other suitable process. In one embodiment, encapsulant 344 is a low temperature curing photosensitive dielectric polymer with or without insulating fillers cured at less than 200° C.

In particular, encapsulant 344 is disposed along side surfaces 324 of semiconductor die 294 and thus covers each side surface 324 of semiconductor die 294. Accordingly, encapsulant 344 covers or contacts at least four surfaces of semiconductor die 294, i.e., four side surfaces 324 of semiconductor die 294. Encapsulant 344 also covers back surface 310 of semiconductor die 294. Encapsulant 344 protects semiconductor die 294 from degradation due to exposure to photons from light or other emissions. In one embodiment, encapsulant 344 is opaque and dark or black in color. FIG. 13i shows composite substrate or reconstituted panel 336 covered by encapsulant 344. Encapsulant 344 can be used for laser marking reconstituted panel 336 for alignment and singulation. Encapsulant 344 is formed over back surface 310 of semiconductor die 294, and can be thinned in a subsequent backgrinding step. Encapsulant 344 can also be deposited such that the encapsulant is coplanar with back surface 310 and does not cover the back surface.

In FIG. 13j, a backside surface 346 of encapsulant 344 undergoes a grinding operation with grinder 345 to planarize and reduce a thickness of encapsulant 344. A chemical etch can also be used to remove and planarize encapsulant 344 and to form planar backside surface 347. In one embodiment, a thickness of encapsulant 344 maintains coverage over back surface 310 of semiconductor die 294. In one embodiment, the thickness of encapsulant 344 remaining over back surface 310 of semiconductor die 294 after deposition or backgrinding ranges from approximately 170-230 μm or less. In another embodiment, the thickness of encapsulant 344 remaining over back surface 310 of semiconductor die 294 ranges from approximately 5-150 μm. A surface 348 of encapsulant 344 opposite backside surface 346 is disposed over carrier 330 and interface layer 332 such that surface 348 of encapsulant 344 may be coplanar with active surface 312 of semiconductor die 294.

FIG. 13k illustrates an alternative backgrinding step where encapsulant 344 is completely removed from back surface 310 of semiconductor die 294. After the grinding operation in FIG. 13k is completed, back surface 310 of semiconductor die 294 is exposed. A thickness of semiconductor die 294 can also be reduced by the grinding operation. In one embodiment, semiconductor die 294 has a thickness of 225-305 μm or less.

In FIG. 13l, insulating or passivation layer 349 is formed over encapsulant 344 and back surface 310 of semiconductor die 294 after completion of the backgrinding step in FIG. 13k. Insulating layer 349 contains one or more layers of photosensitive low curing temperature dielectric resist, photosensitive composite resist, laminate compound film, insulation paste with filler, solder mask resist film, liquid molding compound, granular molding compound, polyimide, BCB, PBO, SiO2, Si3N4, SiON, Ta2O5, Al2O3, prepreg, or other dielectric material having similar insulating and structural properties. Insulating layer 349 is deposited using printing, spin coating, spray coating, vacuum or pressure lamination with or without heat, or other suitable process. In one embodiment, insulating layer 349 is a low temperature curing photosensitive dielectric polymer with or without insulating fillers cured at less than 200° C. Insulating layer 349 is a backside protection layer and provides mechanical protection for semiconductor die 294 and protection from light. In one embodiment, insulating layer 349 has a thickness ranging from approximately 5-150 μm.

Carrier 330 and interface layer 332 are removed by chemical etching, mechanical peeling, CMP, mechanical grinding, thermal bake, UV light, laser scanning, or wet stripping to expose insulating layer 316, conductive layer 314, and surface 348 of encapsulant 344.

In FIG. 13m, an insulating or passivation layer 350 is formed over insulating layer 316 and conductive layer 314 using PVD, CVD, printing, spin coating, spray coating, screen printing or lamination. Insulating layer 350 can be one or more layers of SiO2, Si3N4, SiON, Ta2O5, Al2O3, or other material having similar insulating and structural properties. In one embodiment, insulating layer 350 is a photosensitive dielectric polymer low-cured at less than 200° C. In one embodiment, insulating layer 350 is formed within the footprint of semiconductor die 294 and does not extend beyond the footprint of semiconductor die 294 and over surface 348 of encapsulant 344. In other words, a peripheral region of semiconductor die 294 adjacent to semiconductor die 294 is devoid of insulating layer 350. In another embodiment, insulating layer 350 is formed over insulating layer 316, semiconductor die 294, and surface 348 of encapsulant 344, and a portion of insulating layer 350 over surface 348 of encapsulant 344 is removed by an etching process with a patterned photoresist layer or by LDA. A portion of insulating layer 350 is removed by an etching process with a patterned photoresist layer or by LDA to form openings 352 to expose conductive layer 314.

In FIG. 13n, an electrically conductive layer 354 is formed over insulating layer 350 and conductive layer 314 using a patterning and metal deposition process such as printing, PVD, CVD, sputtering, electrolytic plating, and electroless plating. Conductive layer 354 can be one or more layers of Al, Cu, Sn, Ti, Ni, Au, Ag, W, or other suitable electrically conductive material. A portion of conductive layer 354 extends horizontally along insulating layer 350 and parallel to active surface 312 of semiconductor die 294 to laterally redistribute the electrical interconnect to conductive layer 314. Conductive layer 354 operates as an RDL for the electrical signals of semiconductor die 294. Conductive layer 354 is formed over a footprint of semiconductor die 294 and does not extend beyond the footprint of semiconductor die 294 or over surface 348 of encapsulant 344. In other words, a peripheral region of semiconductor die 294 adjacent to semiconductor die 294 is devoid of conductive layer 354 such that a surface 348 of encapsulant 344 remains exposed from conductive layer 354. A portion of conductive layer 354 is electrically connected to conductive layer 314. Other portions of conductive layer 354 are electrically common or electrically isolated depending on the connectivity of semiconductor die 294.

An insulating or passivation layer 356 is formed over insulating layer 350 and conductive layer 354 using PVD, CVD, printing, spin coating, spray coating, screen printing or lamination. Insulating layer 356 can be one or more layers of SiO2, Si3N4, SiON, Ta2O5, Al2O3, or other material having similar insulating and structural properties. In one embodiment, insulating layer 356 is a photosensitive dielectric polymer low-cured at less than 200° C. In one embodiment, insulating layer 356 is formed within the footprint of semiconductor die 294 and does not extend beyond the footprint of semiconductor die 294 over encapsulant 344. In other words, a peripheral region of semiconductor die 294 adjacent to semiconductor die 294 is devoid of insulating layer 356 such that surface 348 of encapsulant 344 remains exposed from insulating layer 356. In another embodiment, insulating layer 356 is formed over insulating layer 316, semiconductor die 294, and encapsulant 344 and a portion of insulating layer 350 over encapsulant 344 is removed by an etching process with a patterned photoresist layer or by LDA. A portion of insulating layer 350 is removed by an etching process with a patterned photoresist layer or by LDA to form openings 358 to expose conductive layer 354.

In FIG. 13o, an electrically conductive layer 360 is formed over the exposed portion of conductive layer 354 and over insulating 356 after final repassivation using PVD, CVD, evaporation, electrolytic plating, electroless plating, or other suitable metal deposition process. Conductive layer 360 can be Al, Cu, Sn, Ti, Ni, Au, Ag, W, or other suitable electrically conductive material. Conductive layer 360 is a UBM electrically connected to conductive layers 354 and 314. UBMs 360 can be a multi-metal stack with adhesion layer, barrier layer, and seed or wetting layer. The adhesion layer is formed over conductive layer 354 and can be Ti, TiN, TiW, Al, or Cr. The barrier layer is formed over the adhesion layer and can be Ni, NiV, Pt, Pd, TiW, Ti, or CrCu. The barrier layer inhibits the diffusion of Cu into active surface 312 of semiconductor die 294. The seed layer is formed over the barrier layer and can be Cu, Ni, NiV, Au, or Al. UBMs 360 provide a low resistive interconnect to conductive layer 354, as well as a barrier to solder diffusion and seed layer for solder wettability.

An electrically conductive bump material is deposited over conductive layer 360 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 360 using a suitable attachment or bonding process. In one embodiment, the bump material is reflowed by heating the material above its melting point to form balls or bumps 362. In some applications, bumps 362 are reflowed a second time to improve electrical contact to conductive layer 360. Bumps 362 can also be compression bonded or thermocompression bonded to conductive layer 360. Bumps 362 represent one type of interconnect structure that can be formed over conductive layer 360. The interconnect structure can also use bond wires, conductive paste, stud bump, micro bump, or other electrical interconnect. Laser marking can be performed before or after bump formation, or after removal of carrier 330.

Collectively, insulating layers 350 and 356, conductive layers 354 and 360, and bumps 362 constitute a build-up interconnect structure 366 formed over semiconductor die 294 and within a footprint of semiconductor die 294. A peripheral region of semiconductor die 294 adjacent to semiconductor die 294 is devoid of interconnect structure 366 such that surface 348 of encapsulant 344 remains exposed from interconnect structure 366. Build-up interconnect structure 366 may include as few as one RDL or conductive layer, such as conductive layer 354, and one insulating layer, such as insulating layer 350. Additional insulating layers and RDLs can be formed over insulating layer 356 prior to forming bumps 362, to provide additional vertical and horizontal electrical connectivity across the package according to the design and functionality of semiconductor die 294.

In FIG. 13p, semiconductor die 294 are singulated through encapsulant 344 with saw blade or laser cutting tool 370 into individual eWLCSP 372. eWLCSP 372 undergoes electrical testing before or after singulation. Reconstituted panel 336 is singulated into eWLCSP 372 to leave a thin layer of encapsulant 344 over side surfaces 324 of semiconductor die 294. Alternatively, reconstituted panel 336 is singulated to completely remove encapsulant 344 from side surfaces 324.

FIG. 14 shows eWLCSP 372 after singulation having encapsulant over sidewall 324 and insulating layer 349 over back surface 310 of semiconductor die 294. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Backside insulating layer 349 is formed over back surface 310 of semiconductor die 294 for mechanical protection and protection from degradation due to exposure to photons from light or other emissions.

Encapsulant 344 covers side surfaces 324 of semiconductor die 294 to protect semiconductor die 294 from degradation due to exposure to photons from light or other emissions. The thickness of encapsulant 344 over side surfaces 324 is less than 150 μm for eWLCSP 372. In one embodiment, eWLCSP 372 has dimensions of 4.595 mm in length× 4.025 mm in width×0.470 mm in height with a pitch of 0.4 mm for bumps 362 where semiconductor die 294 has a length of 4.445 mm and a width of 3.875 mm. In another embodiment, the thickness of encapsulant 344 over side surfaces 324 of semiconductor die 294 is 75 μm or less. eWLCSP 372 has dimensions of 6.075 mm in length×6.075 mm in width×0.8 mm in height with a pitch of 0.5 mm for bumps 362 where semiconductor die 294 has dimensions of 6.0 mm in length×6.0 mm in width×0.470 mm in height. In yet another embodiment, eWLCSP 372 has dimensions of 5.92 mm in length×5.92 mm in width×0.765 mm in height with a pitch of 0.5 mm for bumps 362 where semiconductor die 294 has dimensions of 5.75 mm in length×5.75 mm in width×0.535 mm in height. In another embodiment, the thickness of encapsulant 344 over side surface 324 of semiconductor die 294 is 25 μm or less. In yet another embodiment, the thickness of encapsulant 344 over side surface 324 of semiconductor die 294 is approximately 50 μm or less. eWLCSP 372 is manufactured by forming a reconstituted wafer or panel on standardized carrier 330 using equipment designed for a single standardized carrier size, which reduces equipment and material costs for eWLCSP 372. eWLCSP 372 is manufactured at a higher volume using standardized carrier 330, thereby simplifying the manufacturing process and reducing unit cost.

FIG. 15 shows an alternative eWLCSP 380 with insulating layer 349 over back surface 310 of semiconductor die 294 and with exposed sidewalls 324 of semiconductor die 294. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Backside insulating layer 349 is formed over back surface 310 of semiconductor die 294 for mechanical protection and protection from degradation due to exposure to photons from light or other emissions. Encapsulant 344 is completely removed from side surfaces 324 of semiconductor die 294 during singulation to expose side surfaces 324. The length and width of eWLCSP 380 is the same as the length and width of semiconductor die 294. In one embodiment, eWLCSP 380 has dimensions of approximately 4.4 mm in length×3.9 mm in width with a pitch of 0.35-0.50 mm for bumps 362. eWLCSP 380 is manufactured by forming a reconstituted wafer or panel on standardized carrier 330 using equipment designed for a single standardized carrier size, which reduces equipment and material costs for eWLCSP 380. eWLCSP 380 is manufactured at a higher volume using standardized carrier 330, thereby simplifying the manufacturing process and reducing unit cost.

Figure 16:
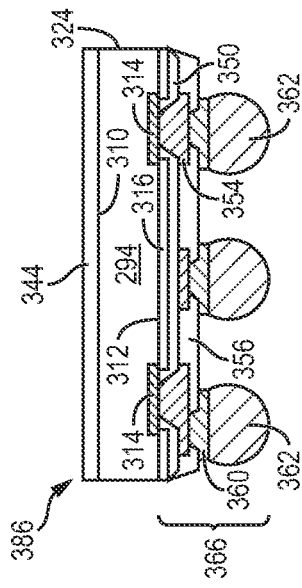
FIG. 16 illustrates an eWLCSP having an encapsulant over the sidewall and backside of the semiconductor die.

FIG. 16 shows another eWLCSP 384 with encapsulant 344 formed over back surface 310 and sidewalls 324 of semiconductor die 294. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Encapsulant 344 remains over back surface 310 of semiconductor die 294 after the grinding operation shown in FIG. 13j. After singulation, encapsulant 344 remains over side surfaces 324 of semiconductor die 294 for mechanical protection and protection from degradation due to exposure to photons from light or other emissions. Therefore, encapsulant 344 is formed over five sides of semiconductor die 294, i.e., over four side surfaces 324 and over back surface 310. Encapsulant 344 over back surface 310 of semiconductor die 294 eliminates the need for a backside protection layer or backside laminate, thereby reducing the cost of eWLCSP 384.

The thickness of encapsulant 344 over side surfaces 324 is less than 150 μm for eWLCSP 384. In one embodiment, eWLCSP 384 has dimensions of 4.595 mm in length×4.025 mm in width×0.470 mm in height with a pitch of 0.4 mm for bumps 362 where semiconductor die 294 has a length of 4.445 mm and a width of 3.875 mm. In another embodiment, the thickness of encapsulant 344 over side surfaces 324 of semiconductor die 294 is 75 μm or less. eWLCSP 384 has dimensions of 6.075 mm in length×6.075 mm in width×0.8 mm in height with a pitch of 0.5 mm for bumps 362 where semiconductor die 294 has dimensions of 6.0 mm in length× 6.0 mm in width×0.470 mm in height. In yet another embodiment, eWLCSP 384 has dimensions of 5.92 mm in length×5.92 mm in width×0.765 mm in height with a pitch of 0.5 mm for bumps 362 where semiconductor die 294 has dimensions of 5.75 mm in length×5.75 mm in width×0.535 mm in height. In another embodiment, the thickness of encapsulant 344 over side surface 324 of semiconductor die 294 is 25 μm or less. In yet another embodiment, the thickness of encapsulant 344 over side surface 324 of semiconductor die 294 is approximately 50 μm or less. eWLCSP 384 is manufactured by forming a reconstituted wafer or panel on standardized carrier 330 using equipment designed for a single standardized carrier size, which reduces equipment and material costs for eWLCSP 384. eWLCSP 384 is manufactured at a higher volume using standardized carrier 330, thereby simplifying the manufacturing process and reducing unit cost.

Figure 17:
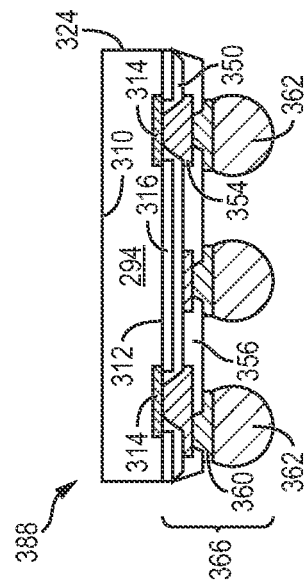
FIG. 17 illustrates an eWLCSP having encapsulant over the backside of the semiconductor die.

FIG. 17 shows another eWLCSP 386 with backside encapsulant and exposed sidewalls. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Encapsulant 344 remains over back surface 310 of semiconductor die 294 after the grinding operation shown in FIG. 13*j*. Encapsulant 344 over back surface 310 of semiconductor die 294 eliminates the need for a backside protection layer or backside laminate, thereby reducing the cost of eWLCSP 386. Encapsulant 344 is completely removed from side surfaces 324 of semiconductor die 294 during singulation to expose side surfaces 324. The length and width of eWLCSP 386 is the same as the length and width of semiconductor die 294. In one embodiment, eWLCSP 386 has dimensions of approximately 4.445 mm in length×3.875 mm in width with a pitch of 0.35-0.50 mm for bumps 362. eWLCSP 386 is manufactured by forming a reconstituted wafer or panel on standardized carrier 330 using equipment designed for a single standardized carrier size, which reduces equipment and material costs for eWLCSP 386. eWLCSP 386 is manufactured at a higher volume using standardized carrier 330, thereby simplifying the manufacturing process and reducing unit cost.

Figure 18:
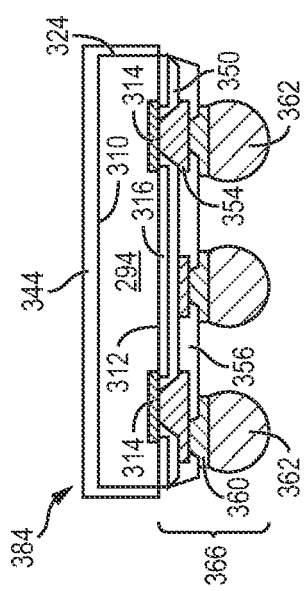
FIG. 18 illustrates an eWLCSP with the semiconductor die having exposed sidewalls and backside.

FIG. 18 shows another eWLCSP 388 with exposed back surface 310 and sidewalls 324 of semiconductor die 294. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Encapsulant 344 is completely removed from back surface 310 of semiconductor die 294 during the grinding operation shown in FIG. 13*k*. Encapsulant 344 is completely removed from side surfaces 324 of semiconductor die 294 during singulation to expose side surfaces 324. No encapsulant 344 remains covering a surface of semiconductor die 294 in eWLCSP 388. The length and width of eWLCSP 388 is the same as the length and width of semiconductor die 294. In one embodiment, eWLCSP 388 has dimensions of approximately 4.4 mm in length×3.9 mm in width with a pitch of 0.35-0.50 mm for bumps 362. eWLCSP 388 is manufactured by forming a reconstituted wafer or panel on standardized carrier 330 using equipment designed for a single standardized carrier size, which reduces equipment and material costs for eWLCSP 388. eWLCSP 388 is manufactured at a higher volume using standardized carrier 330, thereby simplifying the manufacturing process and reducing unit cost.

Figure 19A:
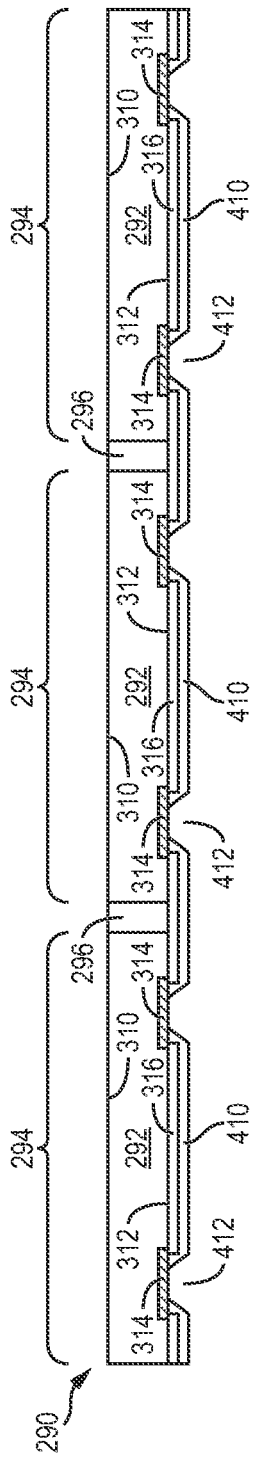

FIGS. 19*a*-19*k* illustrate, in relation to FIGS. 1 and 2*a*-2*c*, a process of forming a reconstituted or embedded fan-in WLCSP. Continuing from FIG. 13*b*, FIG. 19*a* shows a cross-sectional view of a portion of semiconductor wafer 290. Conductive layer 314 is formed over active surface 312 of semiconductor die 294. Insulating layer 316 is formed over active surface 312 and conductive layer 314 with openings formed through insulating layer 316 to expose conductive layer 314.

In FIG. 19*a*, an insulating layer 410 is formed over insulating layer 316 and conductive layer 314. Insulating layer 410 contains one or more layers of SiO2, Si3N4, SiON, Ta2O5, Al2O3, or other material having similar insulating and structural properties. Insulating layer 410 is deposited using PVD, CVD, printing, spin coating, spray coating, sintering, thermal oxidation, or other suitable process. In one embodiment, insulating layer 410 is a photosensitive dielectric polymer low-cured at less than 200° C. In one embodiment, insulating layer 410 is formed over insulating layer 316, semiconductor die 294 and outside a footprint of semiconductor die 294 over base semiconductor material 292. In other words, a peripheral region of semiconductor die 294 adjacent to semiconductor die 294 includes insulating layer 410. A portion of insulating layer 410 is removed by an exposure or development process, LDA, etching, or other suitable process to form openings 412 to expose conductive pads 314.

Figure 19B:
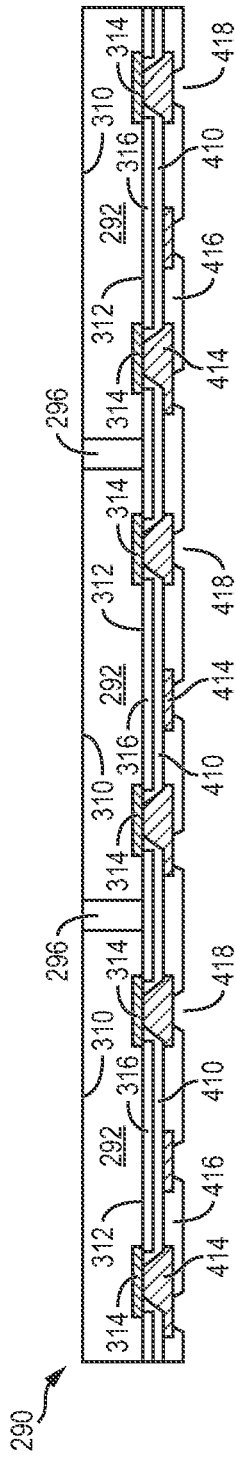

In FIG. 19*b*, an electrically conductive layer 414 is formed over insulating layer 410 and conductive layer 314 using a patterning and metal deposition process such as printing, PVD, CVD, sputtering, electrolytic plating, and electroless plating. Conductive layer 414 can be one or more layers of Al, Cu, Sn, Ti, Ni, Au, Ag, W, or other suitable electrically conductive material. A portion of conductive layer 414 extends horizontally along insulating layer 410 and parallel to active surface 312 of semiconductor die 294 to laterally redistribute the electrical interconnect to conductive layer 314. Conductive layer 414 operates as an RDL for the electrical signals of semiconductor die 294. Conductive layer 414 is formed over a footprint of semiconductor die 294 and does not extend beyond the footprint of semiconductor die 294. In other words, a peripheral region of semiconductor die 294 adjacent to semiconductor die 294 is devoid of conductive layer 414. A portion of conductive layer 414 is electrically connected to conductive layer 314. Other portions of conductive layer 414 are electrically common or electrically isolated depending on the connectivity of semiconductor die 294.

An insulating or passivation layer 416 is formed over insulating layer 410 and conductive layer 414 using PVD, CVD, printing, spin coating, spray coating, screen printing or lamination. Insulating layer 416 can be one or more layers of SiO2, Si3N4, SiON, Ta2O5, Al2O3, or other material having similar insulating and structural properties. In one embodiment, insulating layer 416 is a photosensitive dielectric polymer low-cured at less than 200° C. In one embodiment, insulating layer 416 is formed over semiconductor die 294 and outside a footprint of semiconductor die 294 over base semiconductor material 292. In another embodiment, insulating layer 416 is formed within the footprint of semiconductor die 294 and does not extend beyond the footprint of semiconductor die 294. A portion of insulating layer 416 is removed by an etching process with a patterned photoresist layer or by LDA to form openings 418 to expose conductive layer 414.

Figure 19C:
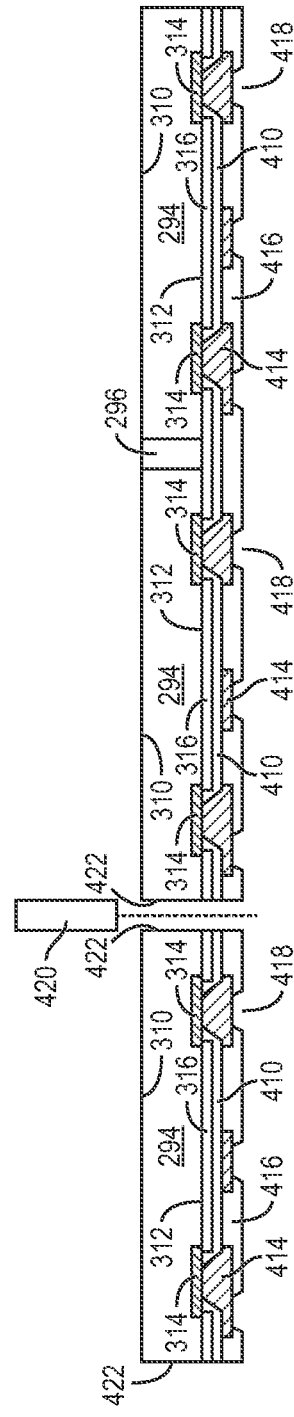

In FIG. 19*c*, semiconductor wafer 290 is singulated through saw street 296 using a saw blade or laser cutting tool 420 into individual semiconductor die 294. Semiconductor wafer 290 is also singulated through insulating layer 316, insulating layer 410, and insulating layer 416 to form side walls or side surfaces 422. Side surfaces 422 include sides of semiconductor die 294 and insulating layers 316, 410, and 416. Individual semiconductor die 294 can be inspected and electrically tested for identification of KGD post singulation.

Figure 19D:
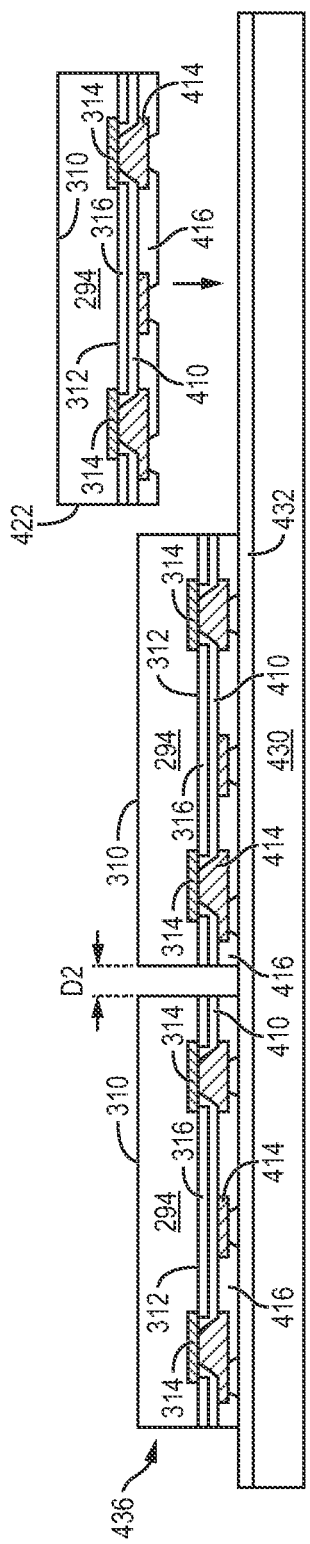

In FIG. 19*d*, semiconductor die 294 from FIG. 19*c* are mounted to carrier 430 and interface layer 432 using, for example, a pick and place operation with active surface 312 oriented toward carrier 430. Semiconductor die 294 mounted to interface layer 432 of carrier 430 to form reconstituted or reconfigured wafer or panel 436.

Carrier 430 can be a round or rectangular panel (greater than 300 mm) with capacity for multiple semiconductor die 294. Carrier 430 may have a larger surface area than the surface area of semiconductor wafer 290 or 300. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 430 is selected independent of the size of semiconductor die 294 or size of semiconductor wafers 290 and 300. That is, carrier 430 has fixed or standardized size, which can accommodate various size semiconductor die 294 singulated from one or more semiconductor wafers 290 and 300. In one embodiment, carrier 430 is circular with a diameter of 330 mm. In another embodiment, carrier 430 is rectangular with a width of 560 mm and length of 600 mm. Semiconductor die 294 may have dimensions of 10 mm by 10 mm, which are placed on standardized carrier 430. Alternatively, semiconductor die 294 may have dimensions of 20 mm by 20 mm, which are placed on the same standardized carrier 430. Accordingly, standardized carrier 430 can handle any size semiconductor die 294, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 430 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Reconstituted wafer or reconstituted panel 436 can be processed into many types of semiconductor packages, including fan-in WLCSP, reconstituted or eWLCSP, fan-out WLCSP, flipchip packages, 3D packages, such as PoP, or other semiconductor packages. Reconstituted panel 436 is configured according to the specifications of the resulting semiconductor package. In one embodiment, semiconductor die 294 are placed on carrier 430 in a high-density arrangement, i.e., 300 µm apart or less, for processing fan-in devices. Semiconductor die 294 are placed onto carrier 430 separated by a gap or distance D2 between semiconductor die 294. Distance D2 between semiconductor die 294 is selected based on the design and specifications of the semiconductor package to be processed. In one embodiment, distance D2 between semiconductor die 294 is 50 µm or less. In another embodiment, distance D2 between semiconductor die 294 is 100 µm or less. Distance D2 between semiconductor die 294 on carrier 430 is optimized for manufacturing the semiconductor packages at the lowest unit cost.

Figure 19E:
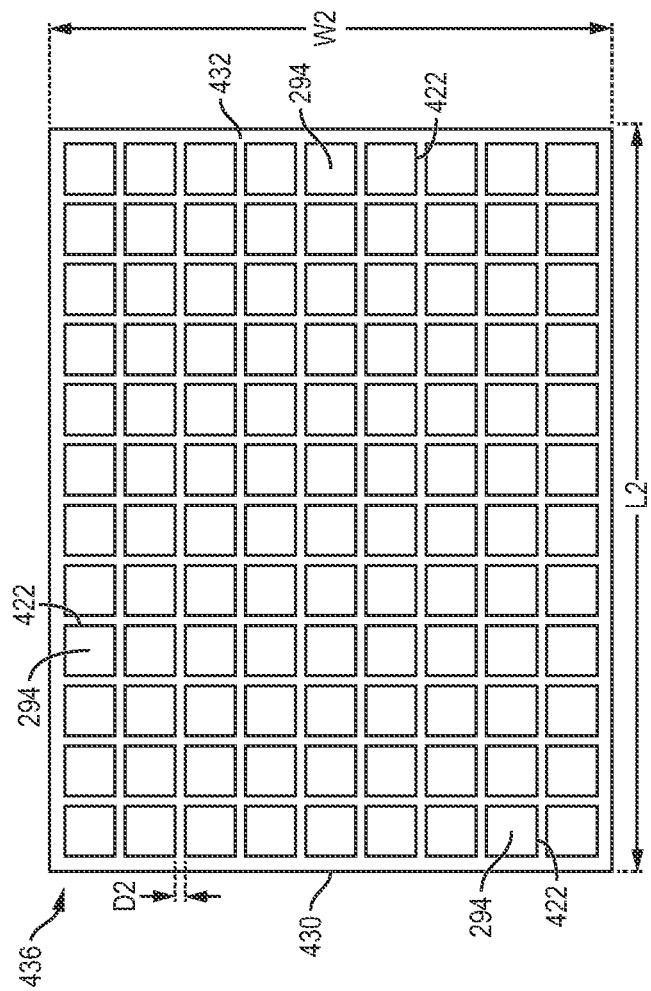

FIG. 19e shows a plan view of reconstituted panel 436 with semiconductor die 294 disposed over carrier 430. Carrier 430 is a standardized shape and size with capacity for various sizes and quantities of semiconductor die, which are singulated from various sizes of semiconductor wafers. In one embodiment, carrier 430 is rectangular in shape and has a width W2 of 560 mm and a length L2 of 600 mm. The number of semiconductor die 294 mounted to carrier 430 can be greater than, less than, or equal to the number of semiconductor die 294 singulated from semiconductor wafer 290. The larger surface area of carrier 430 accommodates more semiconductor die 294 and lowers manufacturing cost as more semiconductor die 294 are processed per reconstituted panel 436.

The standardized carrier, carrier 430, is fixed in size and can accommodate multiple sizes of semiconductor die. The size of standardized carrier 430 is independent of the dimensions of the semiconductor die or semiconductor wafer. More small semiconductor die than larger semiconductor die can fit on carrier 430. For example, carrier 430 accommodates a greater number of 5 mm by 5 mm die over the surface area of carrier 430 than a number of 10 mm by 10 mm die over the surface area of carrier 430.

For example, semiconductor die 294 having dimensions of 10 mm by 10 mm are placed on carrier 430 with a distance D2 of 200 µm between adjacent semiconductor die 294. The number of semiconductor die 294 singulated from semiconductor wafer 290 is approximately 600 semiconductor die, where semiconductor wafer 290 has a diameter of 300 mm. The number of 10 mm by 10 mm semiconductor die 294 which can fit on carrier 430 is approximately 3,000 semiconductor die. Alternatively, semiconductor die 294 having dimensions of 5 mm by 5 mm are placed on carrier 430 with a distance D2 of 200 µm between adjacent semiconductor die 294. The number of semiconductor die 294 singulated from semiconductor wafer 290, where semiconductor wafer 290 has a diameter of 200 mm, is approximately 1,000 semiconductor die. The number of 5 mm by 5 mm semiconductor die 294, which can fit on carrier 430, is approximately 12,000 semiconductor die.

The size of carrier 430 does not vary with the size of semiconductor die being processed. The number of semiconductor die 294, which fit on carrier 430, varies with the size of semiconductor die 294 and space or distance D2 between semiconductor die 294. The size and shape of carrier 430 remains fixed and independent of the size of semiconductor die 294 or semiconductor wafer 290 from which semiconductor die 294 are singulated. Carrier 430 and reconstituted panel 436 provide the flexibility to manufacture many different types of semiconductor packages with different size semiconductor die 294 from different sized semiconductor wafers 290 using a common set of processing equipment, such as processing equipment 340 from FIG. 13h.

Figure 19F:
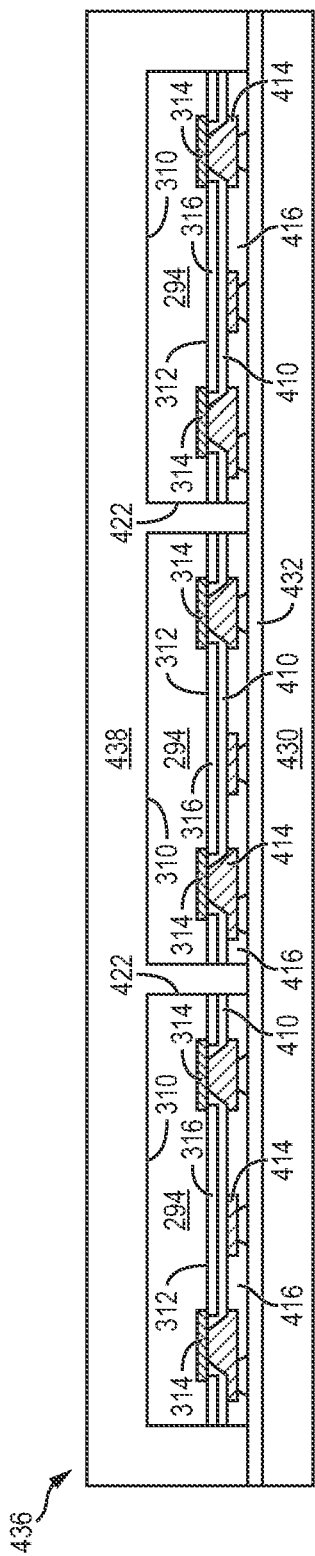

In FIG. 19f, an encapsulant or molding compound 438 is deposited over semiconductor die 294 and carrier 430 using a paste printing, transfer molding, liquid encapsulant molding, vacuum lamination, spin coating, or other suitable applicator. Encapsulant 438 can be polymer composite material, such as epoxy resin with filler, epoxy acrylate with filler, or polymer with proper filler. Encapsulant 438 is non-conductive and environmentally protects the semiconductor device from external elements and contaminants. In another embodiment, encapsulant 438 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, SiO2, Si3N4, SiON, Ta2O5, Al2O3, prepreg, or other dielectric material having similar insulating and structural properties deposited using printing, spin coating, spray coating, vacuum or pressure lamination with or without heat, or other suitable process. In one embodiment, encapsulant 438 is a low temperature curing photosensitive dielectric polymer with or without insulating fillers cured at less than 200° C.

In particular, encapsulant 438 is disposed along side surfaces 422 of semiconductor die 294 and thus covers each side surface 422 of semiconductor die 294 and insulating layers 316, 410, and 416. Accordingly, encapsulant 438 covers or contacts at least four surfaces of semiconductor die 294, i.e., four side surfaces 422 of semiconductor die 294. Encapsulant 438 also covers back surface 310 of semiconductor die 294. Encapsulant 438 protects semiconductor die 294 from degradation due to exposure to photons from light or other emissions. In one embodiment, encapsulant 438 is opaque and dark or black in color. Encapsulant 438 can be used for laser marking reconstituted panel 436 for alignment and singulation. In another embodiment, encapsulant 438 is deposited such that encapsulant 438 is coplanar with back surface 310 of semiconductor die 294 and does not cover back surface 310.

Figure 19G:
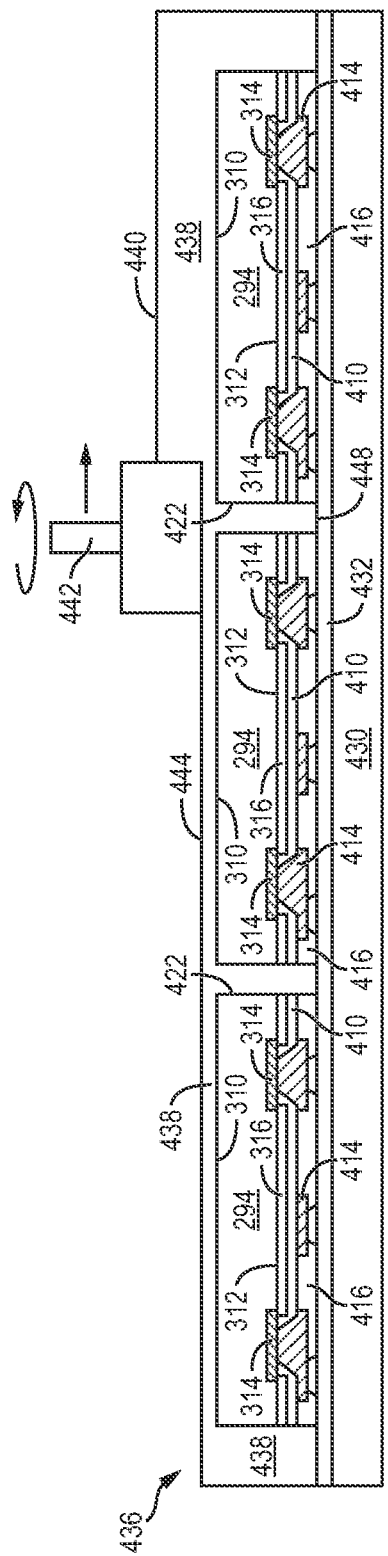

In FIG. 19g, a backside surface 440 of encapsulant 344 undergoes a grinding operation with grinder 442 to planarize and reduce a thickness of encapsulant 438. A chemical etch can also be used to remove and planarize encapsulant 438 and to form planar backside surface 444. In one embodiment, a thickness of encapsulant 438 maintains coverage over back surface 310 of semiconductor die 294. In another embodiment, back surface 310 of semiconductor die 294 is exposed during the backgrinding step. A thickness of semiconductor die 294 can also be reduced by the grinding operation. In one embodiment, semiconductor die 294 has a thickness of 225-305 µm or less.

Figure 19H:
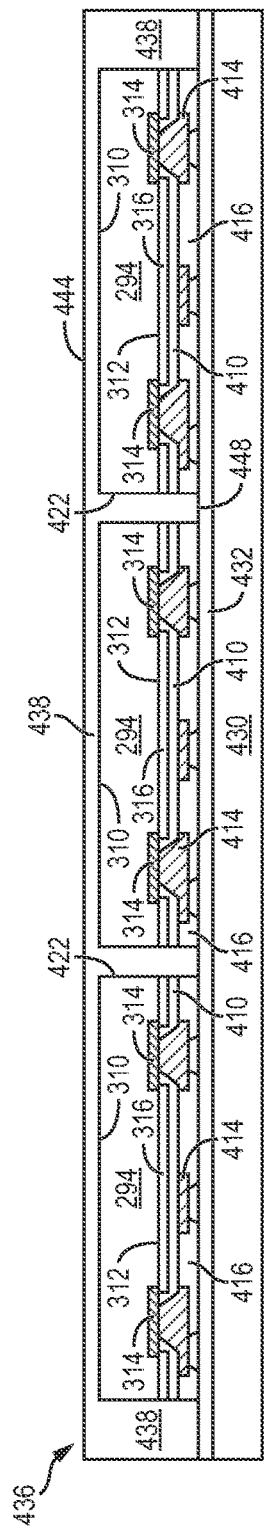

FIG. 19h shows reconstituted panel 436 covered by encapsulant 438. In one embodiment, the thickness of encapsulant 438 remaining over back surface 310 of semiconductor die 294 after deposition or backgrinding ranges from approximately 170-230 µm or less. In another embodiment, the thickness of encapsulant 438 remaining over back surface 310 of semiconductor die 294 ranges from approximately 5-150 µm. A surface 448 of encapsulant 438 opposite backside surface 440 is disposed over carrier 430 and interface layer 432.

Figure 19I:
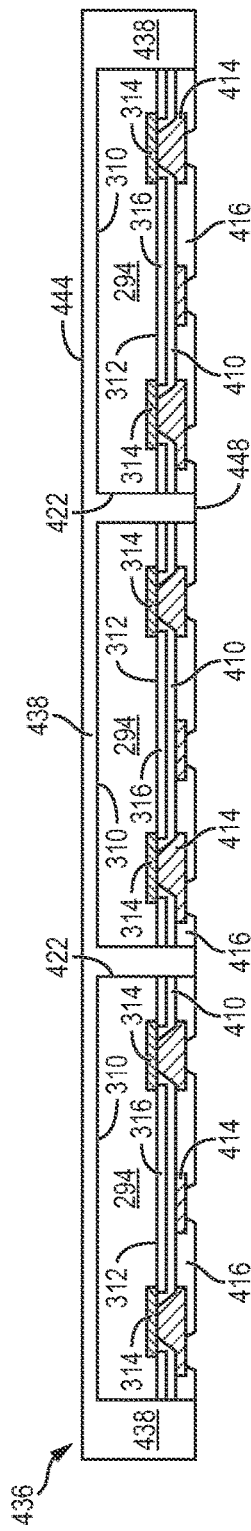

In FIG. 19i, carrier 430 and interface layer 432 are removed by chemical etching, mechanical peeling, CMP, mechanical grinding, thermal bake, UV light, laser scanning, or wet stripping to expose insulating layer 416, conductive layer 414, and surface 448 of encapsulant 438.

Figure 19J:
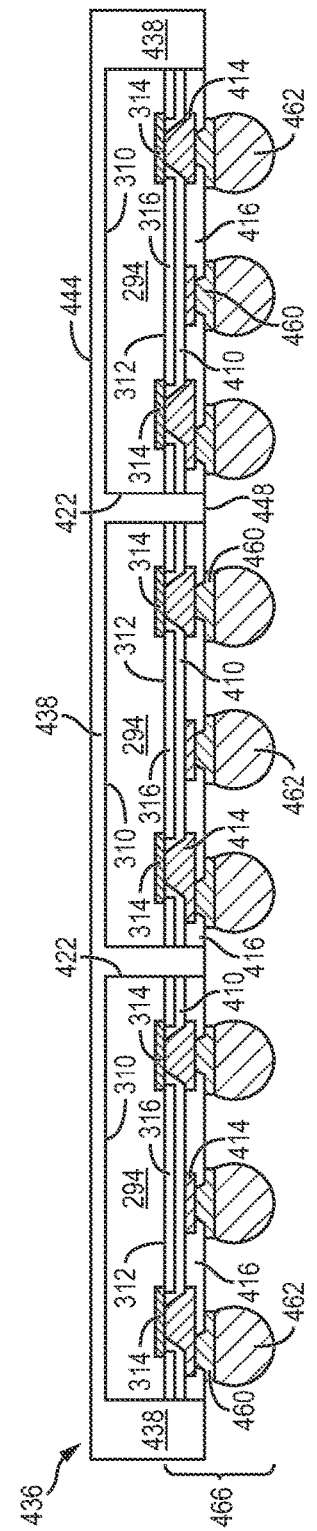

In FIG. 19j, an electrically conductive layer 460 is formed over the exposed portion of conductive layer 414 and over insulating 416 after final repassivation using PVD, CVD, evaporation, electrolytic plating, electroless plating, or other suitable metal deposition process. Conductive layer 460 can be Al, Cu, Sn, Ti, Ni, Au, Ag, W, or other suitable electrically conductive material. Conductive layer 460 is a UBM electrically connected to conductive layers 414 and 314. UBMs 460 can be a multi-metal stack with adhesion layer, barrier layer, and seed or wetting layer. The adhesion layer is formed over conductive layer 414 and can be Ti, TiN, TiW, Al, or Cr. The barrier layer is formed over the adhesion layer and can be Ni, NiV, Pt, Pd, TiW, Ti, or CrCu. The barrier layer inhibits the diffusion of Cu into active surface 312 of semiconductor die 294. The seed layer is formed over the barrier layer and can be Cu, Ni, NiV, Au, or Al. UBMs 460 provide a low resistive interconnect to conductive layer 414, as well as a barrier to solder diffusion and seed layer for solder wettability.

An electrically conductive bump material is deposited over conductive layer 460 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 460 using a suitable attachment or bonding process. In one embodiment, the bump material is reflowed by heating the material above its melting point to form balls or bumps 462. In some applications, bumps 462 are reflowed a second time to improve electrical contact to conductive layer 460. Bumps 462 can also be compression bonded or thermocompression bonded to conductive layer 460. Bumps 462 represent one type of interconnect structure formed over conductive layer 460. The interconnect structure can also use bond wires, conductive paste, stud bump, micro bump, or other electrical interconnect. Laser marking can be performed before or after bump formation, or after removal of carrier 430.

Collectively, insulating layers 410 and 416, conductive layers 414 and 460, and bumps 462 constitute a build-up interconnect structure 466 formed over semiconductor die 294 and within a footprint of semiconductor die 294. A peripheral region of semiconductor die 294 adjacent to semiconductor die 294 is devoid of interconnect structure 466, and surface 448 of encapsulant 438 remains exposed from interconnect structure 466. Build-up interconnect structure 466 may include as few as one RDL or conductive layer, such as conductive layer 414, and one insulating layer, such as insulating layer 410. Additional insulating layers and RDLs can be formed over insulating layer 416 prior to forming bumps 462, to provide additional vertical and horizontal electrical connectivity across the package according to the design and functionality of semiconductor die 294.

In FIG. 19k, semiconductor die 294 are singulated through encapsulant 438 with saw blade or laser cutting tool 470 into individual eWLCSP 472. Reconstituted panel 436 is singulated into eWLCSP 472 to leave a thin layer of encapsulant 438 over side surfaces 422 of semiconductor die 294 and insulating layers 316, 410, and 416. Alternatively, reconstituted panel 436 is singulated to completely remove encapsulant 438 from side surfaces 422. eWLCSP 472 undergoes electrical testing before or after singulation.

FIG. 20 shows eWLCSP 472 with encapsulant formed over back surface 310 and sidewalls 422 of semiconductor die 294. Semiconductor die 294 is electrically connected through conductive layers 314, 414, and 460 to bumps 462 for external interconnect through interconnect structure 466. Interconnect structure 466 does not extend beyond a footprint of semiconductor die 294 and thus forms a fan-in package. Encapsulant 438 remains over back surface 310 of semiconductor die 294 after the grinding operation shown in FIG. 19g. Encapsulant 438 remains over side surfaces 422 of semiconductor die 294 and insulating layers 316, 410, and 416 for mechanical protection and protection from degradation due to exposure to photons from light or other emissions. Therefore, encapsulant 438 is formed over five sides of semiconductor die 294, i.e., over four side surfaces 422 and over back surface 310. Encapsulant 438 over back surface 310 of semiconductor die 294 eliminates the need for a backside protection layer or backside laminate, thereby reducing the cost of eWLCSP 472.

The thickness of encapsulant 438 over side surfaces 422 is less than 150 µm for eWLCSP 472. In one embodiment, eWLCSP 472 has dimensions of 4.595 mm in length×4.025 mm in width×0.470 mm in height with a pitch of 0.4 mm for bumps 462 where semiconductor die 294 has a length of 4.445 mm and a width of 3.875 mm. In another embodiment, the thickness of encapsulant 438 over side surfaces 324 of semiconductor die 294 is 75 µm or less. eWLCSP 472 has dimensions of 6.075 mm in length×6.075 mm in width×0.8 mm in height with a pitch of 0.5 mm for bumps 462 where semiconductor die 294 has dimensions of 6.0 mm in length× 6.0 mm in width×0.470 mm in height. In yet another embodiment, eWLCSP 472 has dimensions of 5.92 mm in length×5.92 mm in width×0.765 mm in height with a pitch of 0.5 mm for bumps 462 where semiconductor die 294 has dimensions of 5.75 mm in length×5.75 mm in width×0.535 mm in height. In another embodiment, the thickness of encapsulant 438 over side surface 422 is 25 μm or less. In yet another embodiment, the thickness of encapsulant 438 over side surface 422 is approximately 50 μm or less. eWLCSP 472 is manufactured by forming a reconstituted wafer or panel on standardized carrier 430 using equipment designed for a single standardized carrier size, which reduces equipment and material costs for eWLCSP 472. eWLCSP 472 is manufactured at a higher volume using standardized carrier 430, thereby simplifying the manufacturing process and reducing unit cost.

FIG. 21 shows another eWLCSP 480 with encapsulant 438 over back surface 310 of semiconductor die 294 and with exposed sidewalls 422 of semiconductor die 294. Semiconductor die 294 is electrically connected through conductive layers 314, 414, and 460 to bumps 462 for external interconnect through interconnect structure 466. Interconnect structure 466 does not extend beyond a footprint of semiconductor die 294 and thus forms a fan-in package. Encapsulant 438 remains over back surface 310 of semiconductor die 294 after the grinding operation shown in FIG. 19g. Encapsulant 438 over back surface 310 of semiconductor die 294 eliminates the need for a backside protection layer or backside laminate, thereby reducing the cost of eWLCSP 480. Encapsulant 438 is completely removed from side surfaces 422 of semiconductor die 294 and insulating layers 316, 410, and 416 during singulation to expose side surfaces 422. The length and width of eWLCSP 480 is the same as the length and width of semiconductor die 294. In one embodiment, eWLCSP 480 has dimensions of approximately 4.445 mm in length×3.875 mm in width with a pitch of 0.35-0.50 mm for bumps 462. eWLCSP 480 is manufactured by forming a reconstituted wafer or panel on standardized carrier 430 using equipment designed for a single standardized carrier size, which reduces equipment and material costs for eWLCSP 480. eWLCSP 480 is manufactured at a higher volume using standardized carrier 430, thereby simplifying the manufacturing process and reducing unit cost.

Figure 22:
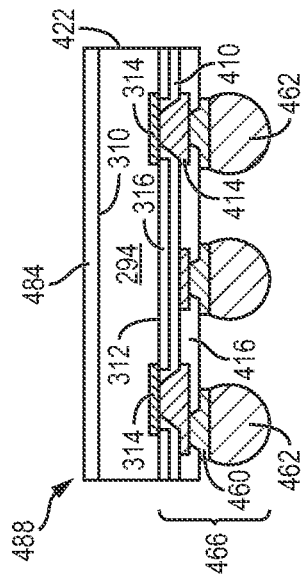
FIG. 22 illustrates an eWLCSP having encapsulant over the sidewall and a backside protection layer.

FIG. 22 shows eWLCSP 482 after singulation having encapsulant 438 over sidewalls 422 of semiconductor die 294 and backside insulating layer 484. Semiconductor die 294 is electrically connected through conductive layers 314, 414, and 460 to bumps 462 for external interconnect through interconnect structure 466. Interconnect structure 466 does not extend beyond a footprint of semiconductor die 294 and thus forms a fan-in package. Encapsulant 438 is completely removed from back surface 310 of semiconductor die 294. Backside insulating layer 484 is formed over back surface 310 of semiconductor die 294 for mechanical protection and protection from degradation due to exposure to photons from light or other emissions. Backside insulating layer 484 contains one or more layers of photosensitive low curing temperature dielectric resist, photosensitive composite resist, laminate compound film, insulation paste with filler, solder mask resist film, liquid molding compound, granular molding compound, polyimide, BCB, PBO, SiO2, Si3N4, SiON, Ta2O5, Al2O3, prepreg, or other dielectric material having similar insulating and structural properties. Backside insulating layer 484 is deposited using printing, spin coating, spray coating, vacuum or pressure lamination with or without heat, or other suitable process. In one embodiment, backside insulating layer 484 is a low temperature curing photosensitive dielectric polymer with or without insulating fillers cured at less than 200° C. Backside insulating layer 484 is a backside protection layer and provides mechanical protection for semiconductor die 294 and protection from light. In one embodiment, backside insulating layer 484 has a thickness ranging from approximately 5-150 μm.

Encapsulant 438 covers side surfaces 422 of semiconductor die 294 to protect semiconductor die 294 from degradation due to exposure to photons from light or other emissions. The thickness of encapsulant 438 over side surfaces 422 is less than 150 μm for eWLCSP 482. In one embodiment, eWLCSP 482 has dimensions of 4.595 mm in length×4.025 mm in width×0.470 mm in height with a pitch of 0.4 mm for bumps 462 where semiconductor die 294 has a length of 4.445 mm and a width of 3.875 mm. In another embodiment, the thickness of encapsulant 438 over side surfaces 422 is 75 μm or less. eWLCSP 482 has dimensions of 6.075 mm in length×6.075 mm in width×0.8 mm in height with a pitch of 0.5 mm for bumps 462 where semiconductor die 294 has dimensions of 6.0 mm in length×6.0 mm in width×0.470 mm in height. In yet another embodiment, eWLCSP 482 has dimensions of 5.92 mm in length×5.92 mm in width×0.765 mm in height with a pitch of 0.5 mm for bumps 462 where semiconductor die 294 has dimensions of 5.75 mm in length×5.75 mm in width×0.535 mm in height. In another embodiment, the thickness of encapsulant 438 over side surface 422 is 25 μm or less. In yet another embodiment, the thickness of encapsulant 438 over side surface 422 is approximately 50 μm or less. eWLCSP 482 is manufactured by forming a reconstituted wafer or panel on standardized carrier 430 using equipment designed for a single standardized carrier size, which reduces equipment and material costs for eWLCSP 482. eWLCSP 482 is manufactured at a higher volume using standardized carrier 430, thereby simplifying the manufacturing process and reducing unit cost.

Figure 23:
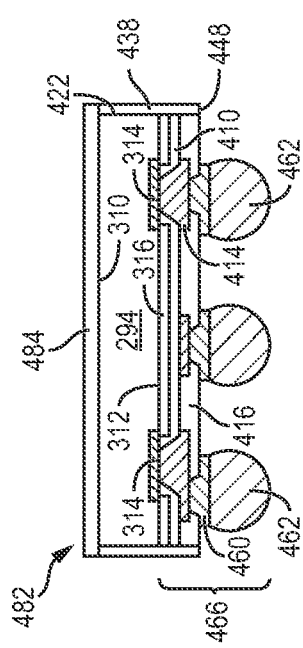
FIG. 23 illustrates another eWLCSP having encapsulant over the sidewall and a backside protection layer.

FIG. 23 shows an eWLCSP 486, similar to eWLCSP 482, but without conductive layer 460. Bumps 462 are formed directly on conductive layer 414. The bump material is bonded to conductive layer 414 using a suitable attachment or bonding process. In one embodiment, the bump material is reflowed by heating the material above its melting point to form balls or bumps 462. In some applications, bumps 462 are reflowed a second time to improve electrical contact to conductive layer 414. Bumps 462 can also be compression bonded or thermocompression bonded to conductive layer 414. Bumps 462 represent one type of interconnect structure that can be formed over conductive layer 414. The interconnect structure can also use bond wires, conductive paste, stud bump, micro bump, or other electrical interconnect.

Semiconductor die 294 is electrically connected through conductive layers 314 and 414 to bumps 462 for external interconnect through interconnect structure 466. Interconnect structure 466 does not extend beyond a footprint of semiconductor die 294 and thus forms a fan-in package. Encapsulant 438 is completely removed from back surface 310 of semiconductor die 294. Backside insulating layer 484 is formed over back surface 310 of semiconductor die 294 for mechanical protection and protection from degradation due to exposure to photons from light or other emissions. Encapsulant 438 covers side surfaces 422 of semiconductor die 294 to protect semiconductor die 294 from degradation due to exposure to photons from light or other emissions. The thickness of encapsulant 438 over side surfaces 422 is less than 150 μm for eWLCSP 486. eWLCSP 486 is manufactured by forming a reconstituted wafer or panel on standardized carrier 430 using equipment designed for a single standardized carrier size, which reduces equipment and material costs for eWLCSP 486. eWLCSP 486 is manufactured at a higher volume using standardized carrier 430, thereby simplifying the manufacturing process and reducing unit cost.

Figure 24:
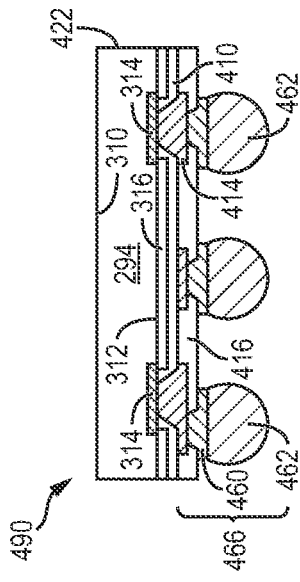
FIG. 24 illustrates an eWLCSP having a backside protection layer.

FIG. 24 shows an alternative eWLCSP 488 with backside insulating layer 484 and exposed sidewalls 422. Semiconductor die 294 is electrically connected through conductive layers 314, 414, and 460 to bumps 462 for external interconnect through interconnect structure 466. Interconnect structure 466 does not extend beyond a footprint of semiconductor die 294 and thus forms a fan-in package. Encapsulant 438 is completely removed from back surface 310 of semiconductor die 294. Backside insulating layer 484 is formed over back surface 310 of semiconductor die 294 for mechanical protection and protection from degradation due to exposure to photons from light or other emissions. Encapsulant 438 is completely removed from side surfaces 324 of semiconductor die 294 during singulation to expose side surfaces 422. The length and width of eWLCSP 488 is the same as the length and width of semiconductor die 294. In one embodiment, eWLCSP 488 has dimensions of approximately 4.4 mm in length×3.9 mm in width with a pitch of 0.35-0.50 mm for bumps 462. eWLCSP 488 is manufactured by forming a reconstituted wafer or panel on standardized carrier 430 using equipment designed for a single standardized carrier size, which reduces equipment and material costs for eWLCSP 488. eWLCSP 488 is manufactured at a higher volume using standardized carrier 430, thereby simplifying the manufacturing process and reducing unit cost.

Figure 25:
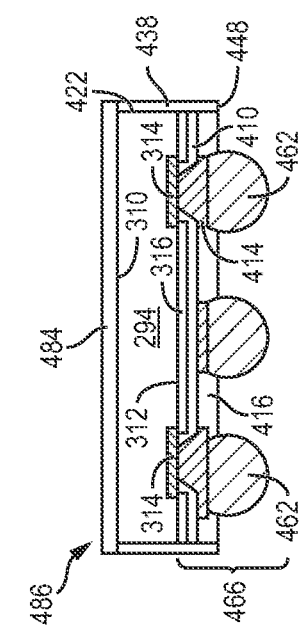
FIG. 25 illustrates an eWLCSP with a semiconductor die having exposed sidewalls and backside.

FIG. 25 shows another eWLCSP 490 with exposed back surface 310 and sidewalls 422 of semiconductor die 294. Semiconductor die 294 is electrically connected through conductive layers 314, 414, and 460 to bumps 462 for external interconnect through interconnect structure 466. Interconnect structure 466 does not extend beyond a footprint of semiconductor die 294 and thus forms a fan-in package. Encapsulant 438 is completely removed from back surface 310 of semiconductor die 294 during the grinding operation shown in FIG. 19g. Encapsulant 438 is completely removed from side surfaces 422 of semiconductor die 294 during singulation to expose side surfaces 422. The length and width of eWLCSP 490 is the same as the length and width of semiconductor die 294. In one embodiment, eWLCSP 490 has dimensions of approximately 4.4 mm in length×3.9 mm in width with a pitch of 0.35-0.50 mm for bumps 462. eWLCSP 490 is manufactured by forming a reconstituted wafer or panel on standardized carrier 430 using equipment designed for a single standardized carrier size, which reduces equipment and material costs for eWLCSP 490. eWLCSP 490 is manufactured at a higher volume using standardized carrier 430, thereby simplifying the manufacturing process and reducing unit cost.

Figure 26E:
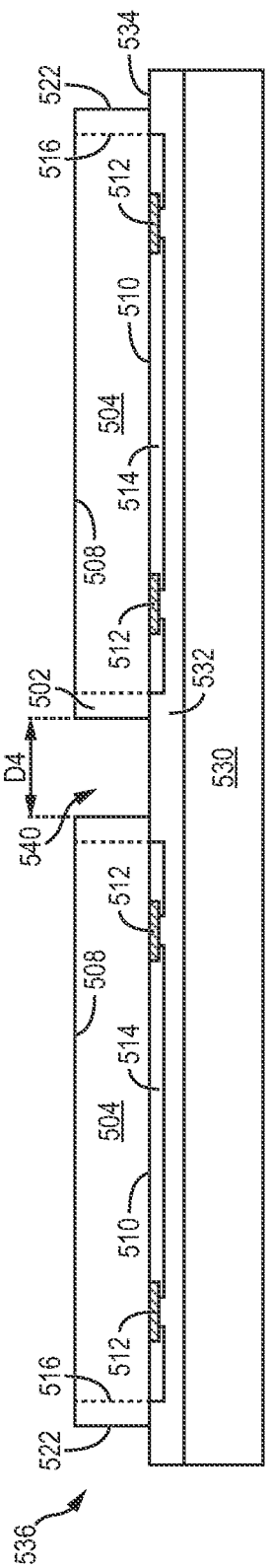

FIGS. 26a-26k illustrate, in relation to FIGS. 1 and 2a-2c, a process of forming a reconstituted or embedded fan-in WLCSP. FIG. 26a shows a semiconductor wafer 500 with a base substrate material 502, such as silicon, germanium, gallium arsenide, indium phosphide, or silicon carbide, for structural support. A plurality of semiconductor die or components 504 is formed on wafer 500 separated by a non-active, inter-die wafer area or saw street 506 as described above. Saw street 506 provides cutting areas to singulate semiconductor wafer 500 into individual semiconductor die 504. In one embodiment, semiconductor wafer 500 is 200-300 mm in diameter. In another embodiment, semiconductor wafer 500 is 100-450 mm in diameter. Semiconductor wafer 500 may have any diameter prior to singulating semiconductor wafer into individual semiconductor die 504.

FIG. 26a shows a cross-sectional view of a portion of semiconductor wafer 500. Each semiconductor die 504 has a back or non-active surface 508 and active surface 510 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 510 to implement analog circuits or digital circuits, such as DSP, ASIC, memory, or other signal processing circuit. Semiconductor die 504 may also contain IPDs, such as inductors, capacitors, and resistors, for RF signal processing.

An electrically conductive layer 512 is formed over active surface 510 using PVD, CVD, electrolytic plating, electroless plating process, or other suitable metal deposition process. Conductive layer 512 can be one or more layers of Al, Cu, Sn, Ni, Au, Ag, or other suitable electrically conductive material. Conductive layer 512 operates as contact pads electrically connected to the circuits on active surface 510. Conductive layer 512 can be formed as contact pads disposed side-by-side a first distance from the edge of semiconductor die 504, as shown in FIG. 26a. Alternatively, conductive layer 512 can be formed as contact pads that are offset in multiple rows such that a first row of contact pads is disposed a first distance from the edge of the die, and a second row of contact pads alternating with the first row is disposed a second distance from the edge of the die.

A first insulating or passivation layer 514 is formed over semiconductor die 504 and conductive layer 512 using PVD, CVD, printing, spin coating, spray coating, sintering or thermal oxidation. Insulating layer 514 contains one or more layers of SiO2, Si3N4, SiON, Ta2O5, Al2O3, HfO2, BCB, PI, PBO, polymer, or other dielectric material having similar structural and insulating properties. In one embodiment, insulating layer 514 is a low temperature curing photosensitive dielectric polymer with or without insulating fillers cured at less than 200° C. Insulating layer 514 covers and provides protection for active surface 510. Insulating layer 514 is conformally applied over conductive layer 512 and active surface 510 of semiconductor die 504 and does not extend beyond edges or sidewalls 516 of semiconductor die 504 or beyond a footprint of semiconductor die 504. In other words, a peripheral region of semiconductor die 504 adjacent to semiconductor die 504 is devoid of insulating layer 514. A portion of insulating layer 514 is removed by LDA using laser 518 or an etching process through a patterned photoresist layer to expose conductive layer 512 through insulating layer 514 and provide for subsequent electrical interconnect.

Semiconductor wafer 500 undergoes electrical testing and inspection as part of a quality control process. Manual visual inspection and automated optical systems are used to perform inspections on semiconductor wafer 500. Software can be used in the automated optical analysis of semiconductor wafer 500. Visual inspection methods may employ equipment such as a scanning electron microscope, high-intensity or ultra-violet light, or metallurgical microscope. Semiconductor wafer 500 is inspected for structural characteristics including warpage, thickness variation, surface particulates, irregularities, cracks, delamination, and discoloration.

The active and passive components within semiconductor die 504 undergo testing at the wafer level for electrical performance and circuit function. Each semiconductor die 504 is tested for functionality and electrical parameters using a probe or other testing device. A probe is used to make electrical contact with nodes or contact pads 512 on each semiconductor die 504 and provides electrical stimuli to the contact pads. Semiconductor die 504 responds to the electrical stimuli, which is measured and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 500 enables semiconductor die 504 that pass to be designated as KGD for use in a semiconductor package.

In FIG. 26b, semiconductor wafer 500 is singulated through saw streets 506 using a saw blade or laser cutting tool 520 into individual semiconductor die 504. Semiconductor wafer 500 is singulated along a portion of base substrate material 502 within saw street area 506 with a thin cut along base substrate side surface 522 to allow a portion of base substrate material 502 to remain disposed on sidewalls 516 of semiconductor die 504. The thin cut slightly oversizes semiconductor die 504 by a distance D3 between semiconductor sidewall 516 and base substrate side surface 522. Base substrate material 502 over sidewall 516 of semiconductor die 504 strengthens the device during reconstitution and a later singulation process by reducing dielectric material cracking. In one embodiment, distance D3 between sidewall 516 and base substrate side surface 522 is at least 10 μm. In another embodiment, distance D3 between sidewall 516 and base substrate side surface 522 ranges from 14-36 μm. Individual semiconductor die 504 can be inspected and electrically tested for identification of KGD post singulation.

FIG. 26c shows a cross-sectional view of a portion of a carrier or temporary substrate 530 containing sacrificial base material such as silicon, polymer, beryllium oxide, glass, or other suitable low-cost, rigid material for structural support. An interface layer or double-sided tape 532 is formed over carrier 530 as a temporary adhesive bonding film, etch-stop layer, or thermal release layer.

Carrier 530 can be a round or rectangular panel (greater than 300 mm) with capacity for multiple semiconductor die 504. Carrier 530 may have a larger surface area than the surface area of semiconductor wafer 500. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 530 is selected independent of the size of semiconductor die 504 or size of semiconductor wafer 500. That is, carrier 530 has fixed or standardized size, which can accommodate various size semiconductor die 504 singulated from one or more semiconductor wafer 500. In one embodiment, carrier 530 is circular with a diameter of 330 mm. In another embodiment, carrier 530 is rectangular with a width of 560 mm and length of 600 mm. Semiconductor die 504 may have dimensions of 10 mm by 10 mm, which are placed on standardized carrier 530. Alternatively, semiconductor die 504 may have dimensions of 20 mm by 20 mm, which are placed on the same standardized carrier 530. Accordingly, standardized carrier 530 can handle any size semiconductor die 504, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 530 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

In FIG. 26d, semiconductor die 504 from FIG. 26b are mounted to carrier 530 and interface layer 532 using, for example, a pick and place operation with insulating layer 514 oriented toward carrier 530.

FIG. 26e shows semiconductor die 504 mounted to interface layer 532 of carrier 530 to form reconstituted or reconfigured wafer 536. In one embodiment, insulating layer 514 is embedded within interface layer 532. For example, active surface 510 of semiconductor die 504 may be coplanar with surface 534 of interface layer 532. In another embodiment, insulating layer 514 is mounted over interface layer 532 such that active surface 510 of semiconductor die 504 is offset from interface layer 532.

Reconstituted wafer or reconstituted panel 536 can be processed into many types of semiconductor packages, including fan-in WLCSP, reconstituted or eWLCSP, fan-out WLCSP, flipchip packages, 3D packages, such as PoP, or other semiconductor packages. Reconstituted panel 536 is configured according to the specifications of the resulting semiconductor package. In one embodiment, semiconductor die 504 are placed on carrier 530 in a high-density arrangement, i.e., 300 μm apart or less, for processing fan-in devices. Semiconductor die 504 are placed onto carrier 530 separated by a gap or distance D4 between semiconductor die 504. Distance D4 between semiconductor die 304 is selected based on the design and specifications of the semiconductor package to be processed. In one embodiment, distance D4 between semiconductor die 504 is 50 μm or less. In another embodiment, distance D4 between semiconductor die 504 is 100 μm or less. Distance D4 between semiconductor die 504 on carrier 530 is optimized for manufacturing the semiconductor packages at the lowest unit cost.

Figure 26F:
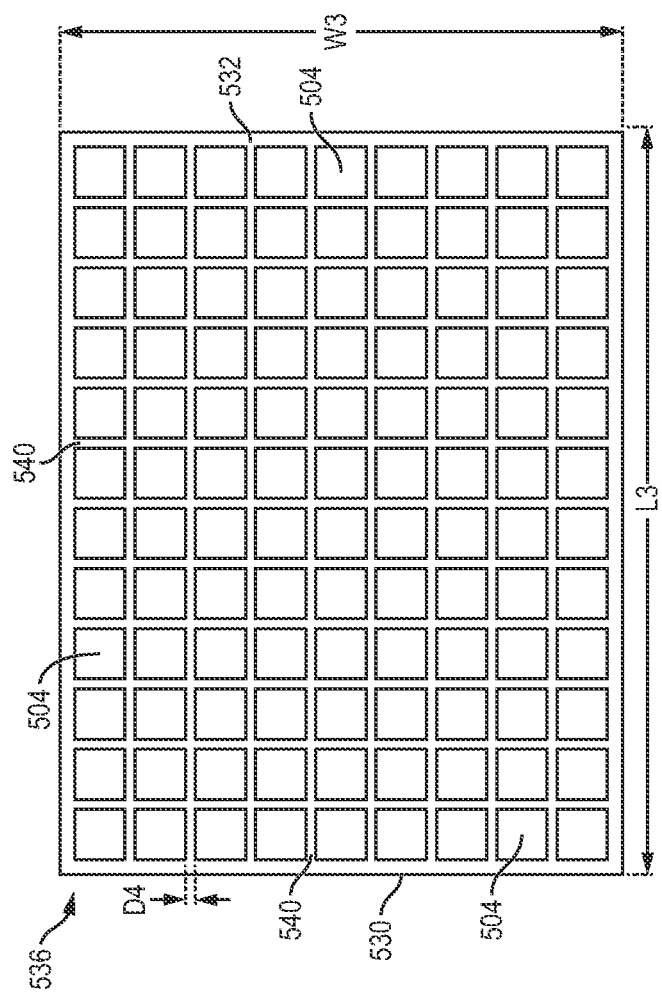

FIG. 26f shows a plan view of reconstituted panel 536 with semiconductor die 504 disposed over carrier 530. Carrier 530 is a standardized shape and size with capacity for various sizes and quantities of semiconductor die, which are singulated from various sizes of semiconductor wafers. In one embodiment, carrier 530 is rectangular in shape and has a width W3 of 560 mm and a length L3 of 600 mm. The number of semiconductor die 504 mounted to carrier 530 can be greater than, less than, or equal to the number of semiconductor die 504 singulated from semiconductor wafer 500. The larger surface area of carrier 530 accommodates more semiconductor die 504 and lowers manufacturing cost as more semiconductor die 504 are processed per reconstituted panel 536.

The standardized carrier, carrier 530, is fixed in size and can accommodate multiple sizes of semiconductor die. The size of standardized carrier 530 is independent of the dimensions of the semiconductor die or semiconductor wafer. More small semiconductor die than larger semiconductor die can fit on carrier 530. For example, carrier 530 accommodates a greater number of 5 mm by 5 mm die over the surface area of carrier 530 than a number of 10 mm by 10 mm die over the surface area of carrier 530.

For example, semiconductor die 504 having dimensions of 10 mm by 10 mm are placed on carrier 530 with a distance D4 of 200 μm between adjacent semiconductor die 504. The number of semiconductor die 504 singulated from semiconductor wafer 500 is approximately 600 semiconductor die, where semiconductor wafer 500 has a diameter of 300 mm. The number of 10 mm by 10 mm semiconductor die 504 which can fit on carrier 530 is over 3,000 semiconductor die. Alternatively, semiconductor die 504 having dimensions of 5 mm by 5 mm are placed on carrier 530 with a distance D4 of 200 μm between adjacent semiconductor die 504. The number of semiconductor die 504 singulated from semiconductor wafer 500, where semiconductor wafer 500 has a diameter of 200 mm, is approximately 1,000 semiconductor die. The number of 5 mm by 5 mm semiconductor die 504, which can fit on carrier 530, is over 12,000 semiconductor die.

The size of carrier 530 does not vary with the size of semiconductor die being processed. The number of semiconductor die 504, which fit on carrier 530, varies with the size of semiconductor die 504 and space or distance D4 between semiconductor die 504. The size and shape of carrier 530 remains fixed and independent of the size of semiconductor die 504 or semiconductor wafer 500 from which semiconductor die 504 are singulated. Carrier 530 and reconstituted panel 536 provide the flexibility to manufacture many different types of semiconductor packages with different size semiconductor die 504 from different sized semiconductor wafers 500 using a common set of processing equipment, such as processing equipment 340 from FIG. 13h.

Figure 26G:
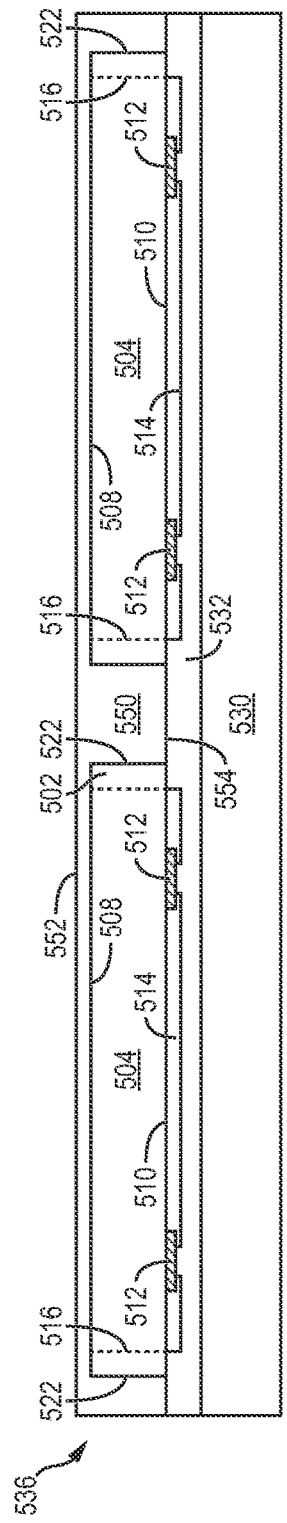

In FIG. 26g, an encapsulant or molding compound 550 is deposited over semiconductor die 504 and carrier 530 using a paste printing, transfer molding, liquid encapsulant molding, vacuum lamination, spin coating, or other suitable applicator. Encapsulant 550 can be polymer composite material, such as epoxy resin with filler, epoxy acrylate with filler, or polymer with proper filler. Encapsulant 550 is non-conductive and environmentally protects the semiconductor device from external elements and contaminants. In another embodiment, encapsulant 550 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, SiO2, Si3N4, SiON, Ta2O5, Al2O3, prepreg, or other dielectric material having similar insulating and structural properties deposited using printing, spin coating, spray coating, vacuum or pressure lamination with or without heat, or other suitable process. In one embodiment, encapsulant 550 is a low temperature curing photosensitive dielectric polymer with or without insulating fillers cured at less than 200° C.

In particular, encapsulant 550 is disposed along base substrate side surfaces 522. Encapsulant 550 also covers back surface 508 of semiconductor die 504. In one embodiment, encapsulant 550 is opaque and dark or black in color. Encapsulant 550 can be used for laser marking reconstituted panel 536 for alignment and singulation. Encapsulant 550 can be thinned in a subsequent backgrinding step. Encapsulant 550 can also be deposited such that encapsulant 550 is coplanar with back surface 508 of semiconductor die 504 and does not cover back surface 508. A surface 554 of encapsulant 550 opposite backside surface 552 is disposed over carrier 530 and interface layer 532 such that surface 554 of encapsulant 550 may be coplanar with active surface 510 of semiconductor die 504.

Figure 26H:
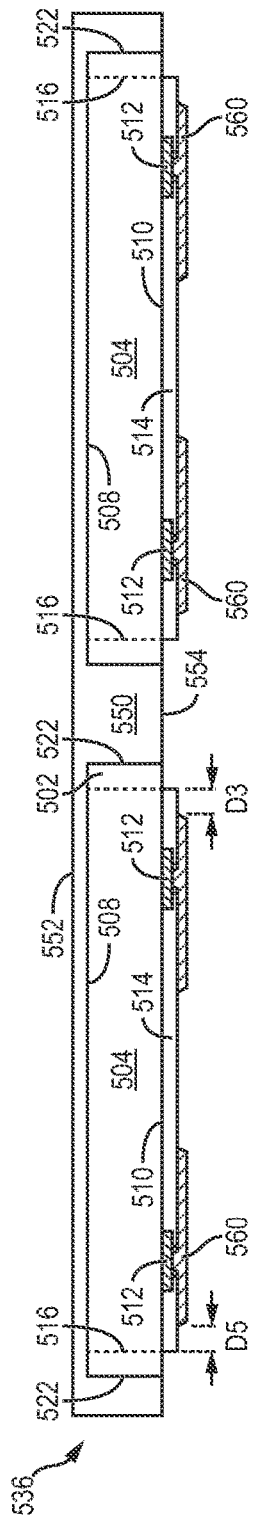

In FIG. 26h, carrier 530 and interface layer 532 are removed by chemical etching, mechanical peeling, CMP, mechanical grinding, thermal bake, UV light, laser scanning, or wet stripping to expose insulating layer 514, conductive layer 512, and surface 554 of encapsulant 550.

An electrically conductive layer 560 is formed over insulating layer 514 and conductive layer 512 using a patterning and metal deposition process such as printing, PVD, CVD, sputtering, electrolytic plating, and electroless plating. Conductive layer 560 can be one or more layers of Al, Cu, Sn, Ti, Ni, Au, Ag, W, or other suitable electrically conductive material. A portion of conductive layer 560 extends horizontally along insulating layer 514 and parallel to active surface 510 of semiconductor die 504 to laterally redistribute the electrical interconnect to conductive layer 512. Conductive layer 560 operates as an RDL for the electrical signals of semiconductor die 504. Conductive layer 560 is formed over a footprint of semiconductor die 504 and does not extend beyond the footprint of semiconductor die 504 and over encapsulant 550. In other words, a peripheral region of semiconductor die 504 adjacent to semiconductor die 504 is devoid of conductive layer 560 such that encapsulant 550 remains devoid of conductive layer 560. In one embodiment, conductive layer 560 is formed a distance D5 from sidewall 516 of semiconductor die 504, and distance D5 is at least 1 μm. A portion of conductive layer 560 is electrically connected to conductive layer 512. Other portions of conductive layer 560 are electrically common or electrically isolated depending on the connectivity of semiconductor die 504.

Figure 26I:
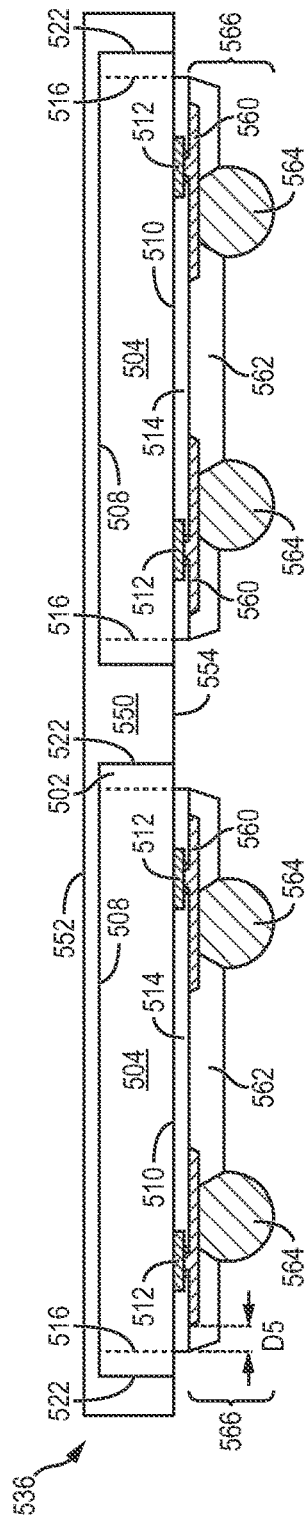

In FIG. 26i, an insulating or passivation layer 562 is formed over insulating layer 514 and conductive layer 560 using PVD, CVD, printing, spin coating, spray coating, screen printing or lamination. Insulating layer 562 can be one or more layers of SiO2, Si3N4, SiON, Ta2O5, Al2O3, or other material having similar insulating and structural properties. In one embodiment, insulating layer 562 is a photosensitive dielectric polymer low-cured at less than 200° C. In one embodiment, insulating layer 562 is formed within the footprint of semiconductor die 504 and does not extend beyond the footprint of semiconductor die 504 over encapsulant 550. In other words, a peripheral region of semiconductor die 504 adjacent to semiconductor die 504 is devoid of insulating layer 562 such that encapsulant 550 remains devoid of insulating layer 562. In another embodiment, insulating layer 562 is formed over insulating layer 514, semiconductor die 504, and encapsulant 550. A portion of insulating layer 562 is removed by an etching process with a patterned photoresist layer or by LDA to form openings to expose conductive layer 560.

An electrically conductive bump material is deposited over conductive layer 560 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 560 using a suitable attachment or bonding process. In one embodiment, the bump material is reflowed by heating the material above its melting point to form balls or bumps 564. In some applications, bumps 564 are reflowed a second time to improve electrical contact to conductive layer 560. Bumps 564 can also be compression bonded or thermocompression bonded to conductive layer 560. Bumps 564 represent one type of interconnect structure that can be formed over conductive layer 560. The interconnect structure can also use bond wires, conductive paste, stud bump, micro bump, or other electrical interconnect. Laser marking can be performed before or after bump formation, or after removal of carrier 530.

Collectively, insulating layers 562, conductive layer 560, and bumps 564 constitute a build-up interconnect structure 566 formed over semiconductor die 504 and encapsulant 550 within a footprint of semiconductor die 504. A peripheral region of semiconductor die 504 adjacent to semiconductor die 504 is devoid of interconnect structure 566 such that surface 554 of encapsulant 550 remains exposed with respect to interconnect structure 566. Build-up interconnect structure 566 may include as few as one RDL or conductive layer, such as conductive layer 560, and one insulating layer, such as insulating layer 562. Additional insulating layers and RDLs can be formed over insulating layer 562 prior to forming bumps 564, to provide additional vertical and horizontal electrical connectivity across the package according to the design and functionality of semiconductor die 504.

Figure 26J:
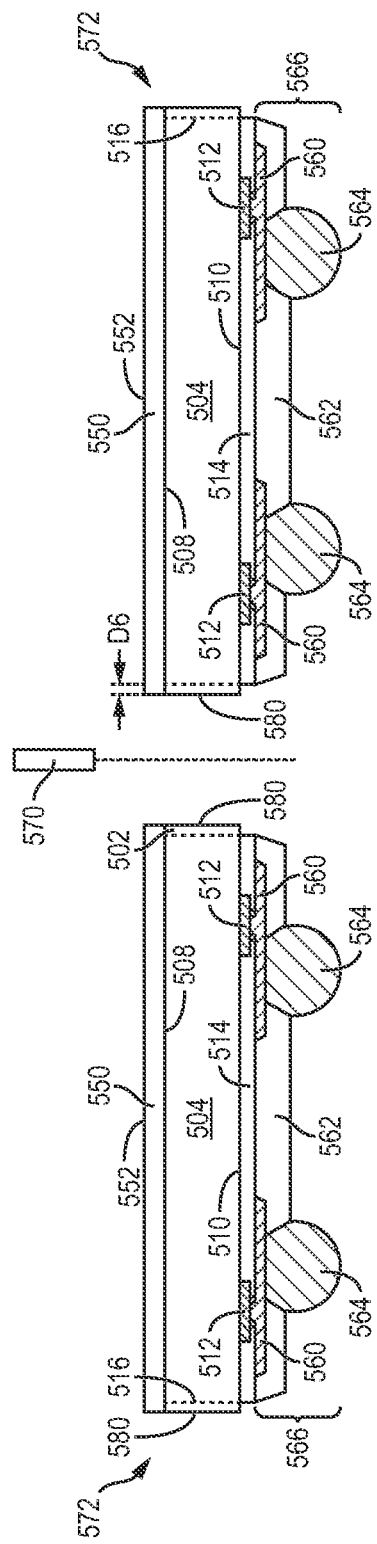

In FIG. 26j, semiconductor die 504 are singulated with saw blade or laser cutting tool 570 into individual eWLCSP 572. Reconstituted panel 536 is singulated through encapsulant 550 and base substrate material 502 along side surface 580 to remove encapsulant 550 from the sides of semiconductor die 504 and to remove a portion of base substrate material 502 from the sides of semiconductor die 504. Therefore, base substrate material 502 is cut or singulated twice during the formation of eWLCSP 572, once at the wafer-level and once at the reconstituted panel-level. As a result, the dielectric materials are less prone to cracking and the reliability of eWLCSP 572 is improved.

A portion of base substrate material 502 remains disposed along sidewalls 516 of semiconductor die 504 after singulation. The thickness of base substrate material 502 adjacent to semiconductor die 504 over sidewalls 516 is at least 1 μm. In other words, a distance D6 between side surface 580 and sidewalls 516 of semiconductor die 504 is at least 1 μm. eWLCSP 572 undergoes electrical testing before or after singulation.

Figure 26K:
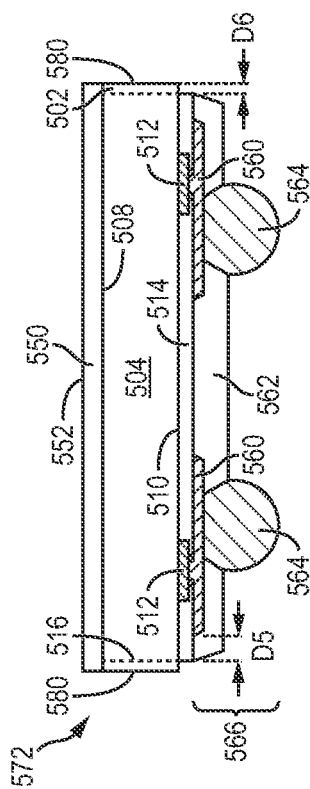

FIG. 26k shows eWLCSP 572 after singulation having encapsulant covering back surface 508 of semiconductor die 504. Semiconductor die 504 is electrically connected through conductive layers 512 and 560 to bumps 564 for external interconnect through interconnect structure 566. Interconnect structure 566 does not extend beyond a footprint of semiconductor die 504 and thus forms a fan-in package. Encapsulant 550 remains over back surface 508 of semiconductor die 504. Encapsulant 550 over back surface 508 of semiconductor die 504 eliminates the need for a backside protection layer or backside laminate, thereby reducing the cost of eWLCSP 572. Encapsulant 550 is completely removed from the sides of semiconductor die 504 during singulation to expose side surfaces 580 of base substrate material 502. In one embodiment, eWLCSP 572 has dimensions of approximately 4.445 mm in length×3.875 mm in width with a pitch of 0.35-0.50 mm for bumps 564. eWLCSP 572 is manufactured by forming a reconstituted wafer or panel on standardized carrier 530 using equipment designed for a single standardized carrier size, which reduces equipment and material costs for eWLCSP 572. eWLCSP 572 is manufactured at a higher volume using standardized carrier 530, thereby simplifying the manufacturing process and reducing unit cost.

FIG. 27 shows an eWLCSP 590 with exposed backside and sidewalls. Semiconductor die 504 is electrically connected through conductive layers 512 and 560 to bumps 564 for external interconnect through interconnect structure 566. Interconnect structure 566 does not extend beyond a footprint of semiconductor die 504 and thus forms a fan-in package. Encapsulant 550 is completely removed from back surface 508 of semiconductor die 504 during a grinding operation. Encapsulant 550 is completely removed from the sides of semiconductor die 504 during singulation to expose side surfaces 580 of base substrate material 502. In one embodiment, eWLCSP 590 has dimensions of approximately 4.4 mm in length×3.9 mm in width with a pitch of 0.35-0.50 mm for bumps 564. eWLCSP 590 is manufactured by forming a reconstituted wafer or panel on standardized carrier 530 using equipment designed for a single standardized carrier size, which reduces equipment and material costs for eWLCSP 590. eWLCSP 590 is manufactured at a higher volume using standardized carrier 530, thereby simplifying the manufacturing process and reducing unit cost.

FIG. 28 shows an alternative eWLCSP 592 with UBM 594, backside insulating layer 596, and exposed side surfaces 580. An electrically conductive layer 594 is formed over the exposed portion of conductive layer 560 and over insulating layer 562 after final repassivation using PVD, CVD, evaporation, electrolytic plating, electroless plating, or other suitable metal deposition process. Conductive layer 594 can be Al, Cu, Sn, Ti, Ni, Au, Ag, W, or other suitable electrically conductive material. Conductive layer 594 is a UBM electrically connected to conductive layers 560 and 512. UBMs 594 can be a multi-metal stack with adhesion layer, barrier layer, and seed or wetting layer. The adhesion layer is formed over conductive layer 560 and can be Ti, TiN, TiW, Al, or Cr. The barrier layer is formed over the adhesion layer and can be Ni, NiV, Pt, Pd, TiW, Ti, or CrCu. The barrier layer inhibits the diffusion of Cu into active surface 510 of semiconductor die 504. The seed layer is formed over the barrier layer and can be Cu, Ni, NiV, Au, or Al. UBMs 594 provide a low resistive interconnect to conductive layer 512, as well as a barrier to solder diffusion and seed layer for solder wettability.

Semiconductor die 504 is electrically connected through conductive layers 512, 560, and 594 to bumps 564 for external interconnect through interconnect structure 566. Conductive layers 560 and 594 and insulating layers 514 and 562 do not extend beyond a footprint of semiconductor die 504 and thus forms a fan-in package. Backside insulating layer 596 is formed over back surface 508 of semiconductor die 504 for mechanical protection and protection from degradation due to exposure to photons from light or other emissions. Backside insulating layer 596 contains one or more layers of photosensitive low curing temperature dielectric resist, photosensitive composite resist, laminate compound film, insulation paste with filler, solder mask resist film, liquid molding compound, granular molding compound, polyimide, BCB, PBO, SiO2, Si3N4, SiON, Ta2O5, Al2O3, prepreg, or other dielectric material having similar insulating and structural properties. Backside insulating layer 596 is deposited using printing, spin coating, spray coating, vacuum or pressure lamination with or without heat, or other suitable process. In one embodiment, backside insulating layer 596 is a low temperature curing photosensitive dielectric polymer with or without insulating fillers cured at less than 200° C. Backside insulating layer 596 is a backside protection layer and provides mechanical protection for semiconductor die 504 and protection from light. In one embodiment, backside insulating layer 596 has a thickness ranging from approximately 5-150 μm.

Encapsulant 550 is completely removed from the sides of semiconductor die 504 during singulation to expose side surfaces 580 of base substrate material 502. In one embodiment, eWLCSP 592 has dimensions of approximately 4.4 mm in length×3.9 mm in width with a pitch of 0.35-0.50 mm for bumps 564. eWLCSP 592 is manufactured by forming a reconstituted wafer or panel on standardized carrier 530 using equipment designed for a single standardized carrier size, which reduces equipment and material costs for eWLCSP 592. eWLCSP 592 is manufactured at a higher volume using standardized carrier 530, thereby simplifying the manufacturing process and reducing unit cost.

Figure 29C:
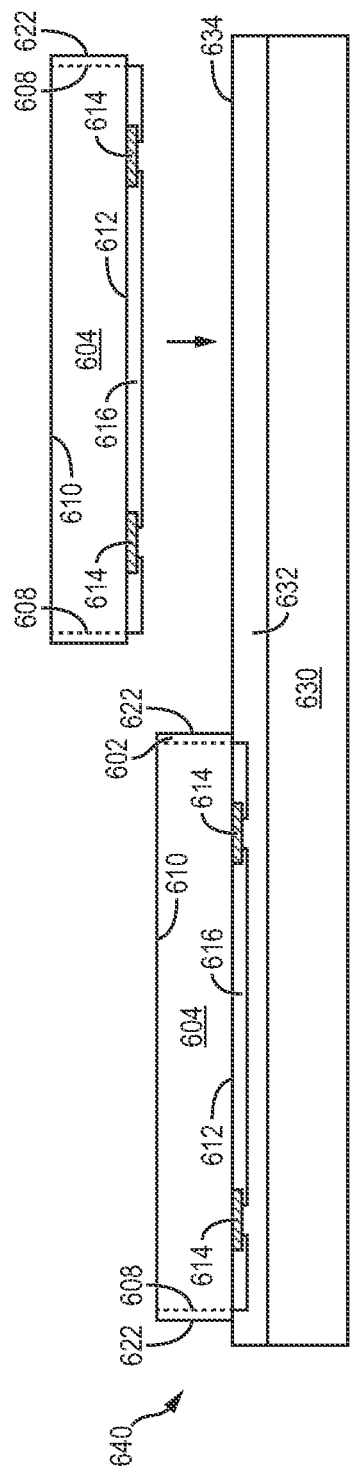

FIGS. 29a-29i illustrate, in relation to FIGS. 1 and 2a-2c, a process of forming a reconstituted or embedded fan-in WLCSP. FIG. 29a shows a cross-sectional view of a portion of semiconductor wafer 600. Semiconductor wafer 600 includes a base substrate material 602, such as silicon, germanium, gallium arsenide, indium phosphide, or silicon carbide, for structural support. A plurality of semiconductor die or components 604 is formed on wafer 600 separated by a non-active, inter-die wafer area or saw street 606 as described above. Saw street 606 provides cutting areas to singulate semiconductor wafer 600 into individual semiconductor die 604. Semiconductor die 604 has edges or sidewalls 608. In one embodiment, semiconductor wafer 600 is 200-300 mm in diameter. In another embodiment, semiconductor wafer 600 is 100-450 mm in diameter. Semiconductor wafer 600 may have any diameter prior to singulating semiconductor wafer into individual semiconductor die 604.

Each semiconductor die 604 has a back or non-active surface 610 and active surface 612 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 612 to implement analog circuits or digital circuits, such as DSP, ASIC, memory, or other signal processing circuit. Semiconductor die 604 may also contain IPDs, such as inductors, capacitors, and resistors, for RF signal processing.

An electrically conductive layer 614 is formed over active surface 612 using PVD, CVD, electrolytic plating, electroless plating process, or other suitable metal deposition process. Conductive layer 614 can be one or more layers of Al, Cu, Sn, Ni, Au, Ag, or other suitable electrically conductive material. Conductive layer 614 operates as contact pads electrically connected to the circuits on active surface 612. Conductive layer 614 can be formed as contact pads disposed side-by-side a first distance from edge 608 of semiconductor die 604, as shown in FIG. 29a. Alternatively, conductive layer 614 can be formed as contact pads that are offset in multiple rows such that a first row of contact pads is disposed a first distance from edge 608 of semiconductor die 604, and a second row of contact pads alternating with the first row is disposed a second distance from edge 608 of semiconductor die 604.

A first insulating or passivation layer 616 is formed over semiconductor die 604 and conductive layer 614 using PVD, CVD, printing, spin coating, spray coating, sintering or thermal oxidation. Insulating layer 616 contains one or more layers of SiO2, Si3N4, SiON, Ta2O5, Al2O3, HfO2, BCB, PI, PBO, polymer, or other dielectric material having similar structural and insulating properties. In one embodiment, insulating layer 616 is a low temperature curing photosensitive dielectric polymer with or without insulating fillers cured at less than 200° C. Insulating layer 616 covers and provides protection for active surface 612. Insulating layer 616 is conformally applied over conductive layer 614 and active surface 612 of semiconductor die 604 and does not extend over sidewalls 608 of semiconductor die 604 or beyond a footprint of semiconductor die 604. A peripheral region of semiconductor die 604 adjacent to semiconductor die 604 is devoid of insulating layer 616. A portion of insulating layer 616 is removed by LDA using laser 618 or an etching process through a patterned photoresist layer to expose conductive layer 614 through insulating layer 616 and provide for subsequent electrical interconnect.

Semiconductor wafer 600 undergoes electrical testing and inspection as part of a quality control process. Manual visual inspection and automated optical systems are used to perform inspections on semiconductor wafer 600. Software can be used in the automated optical analysis of semiconductor wafer 600. Visual inspection methods may employ equipment such as a scanning electron microscope, high-intensity or ultra-violet light, or metallurgical microscope. Semiconductor wafer 600 is inspected for structural characteristics including warpage, thickness variation, surface particulates, irregularities, cracks, delamination, and discoloration.

The active and passive components within semiconductor die 604 undergo testing at the wafer level for electrical performance and circuit function. Each semiconductor die 604 is tested for functionality and electrical parameters using a probe or other testing device. A probe is used to make electrical contact with nodes or contact pads 614 on each semiconductor die 604 and provides electrical stimuli to the contact pads. Semiconductor die 604 responds to the electrical stimuli, which is measured and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 600 enables semiconductor die 604 that pass to be designated as KGD for use in a semiconductor package.

In FIG. 29b, semiconductor wafer 600 is singulated through saw streets 606 using a saw blade or laser cutting tool 620 into individual semiconductor die 604. Semiconductor wafer 600 is singulated along a portion of base substrate material 602 within saw street area 606 by cutting along base substrate side surface 622 to allow a portion of base substrate material 602 to remain disposed on sidewalls 608 of semiconductor die 604. Distance D7 between semiconductor sidewall 608 and base substrate side surface 622 is at least 1 μm. Individual semiconductor die 604 can be inspected and electrically tested for identification of KGD post singulation.

FIG. 29c shows a cross-sectional view of a portion of a carrier or temporary substrate 630 containing sacrificial base material such as silicon, polymer, beryllium oxide, glass, or other suitable low-cost, rigid material for structural support. An interface layer or double-sided tape 632 is formed over carrier 630 as a temporary adhesive bonding film, etch-stop layer, or thermal release layer. Semiconductor die 604 from FIG. 29b are mounted to carrier 630 and interface layer 632 using, for example, a pick and place operation with active surface 612 oriented toward the carrier.

Carrier 630 can be a round or rectangular panel (greater than 300 mm) with capacity for multiple semiconductor die 604. Carrier 630 may have a larger surface area than the surface area of semiconductor wafer 600. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 630 is selected independent of the size of semiconductor die 604 or size of semiconductor wafers 600. That is, carrier 630 has fixed or standardized size, which can accommodate various size semiconductor die 604 singulated from one or more semiconductor wafers 600. In one embodiment, carrier 630 is circular with a diameter of 330 mm. In another embodiment, carrier 630 is rectangular with a width of 560 mm and length of 600 mm. Semiconductor die 604 may have dimensions of 10 mm by 10 mm, which are placed on standardized carrier 630. Alternatively, semiconductor die 604 may have dimensions of 20 mm by 20 mm, which are placed on the same standardized carrier 630. Accordingly, standardized carrier 630 can handle any size semiconductor die 604, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 630 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

FIG. 29c shows semiconductor die 604 mounted to interface layer 632 of carrier 630 to form reconstituted or reconfigured wafer 640. In one embodiment, insulating layer 616 is embedded within interface layer 632. For example, active surface 612 of semiconductor die 604 may be coplanar with surface 634 of interface layer 632. In another embodiment, insulating layer 616 is mounted over interface layer 632 such that active surface 612 of semiconductor die 604 is offset from interface layer 632.

Reconstituted wafer or reconstituted panel 640 can be processed into many types of semiconductor packages, including fan-in WLCSP, reconstituted or eWLCSP, fan-out WLCSP, flipchip packages, 3D packages, such as PoP, or other semiconductor packages. Reconstituted panel 640 is configured according to the specifications of the resulting semiconductor package. In one embodiment, semiconductor die 604 are placed on carrier 630 in a high-density arrangement, i.e., 300 μm apart or less, for processing fan-in devices. Semiconductor die 604 are placed onto carrier 630 separated by a gap or distance D8 between semiconductor die 604. Distance D8 between semiconductor die 604 is selected based on the design and specifications of the semiconductor package to be processed. In one embodiment, distance D8 between semiconductor die 604 is 50 μm or less. In another embodiment, distance D8 between semiconductor die 604 is 100 μm or less. Distance D8 between semiconductor die 604 on carrier 630 is optimized for manufacturing the semiconductor packages at the lowest unit cost.

Figure 29D:
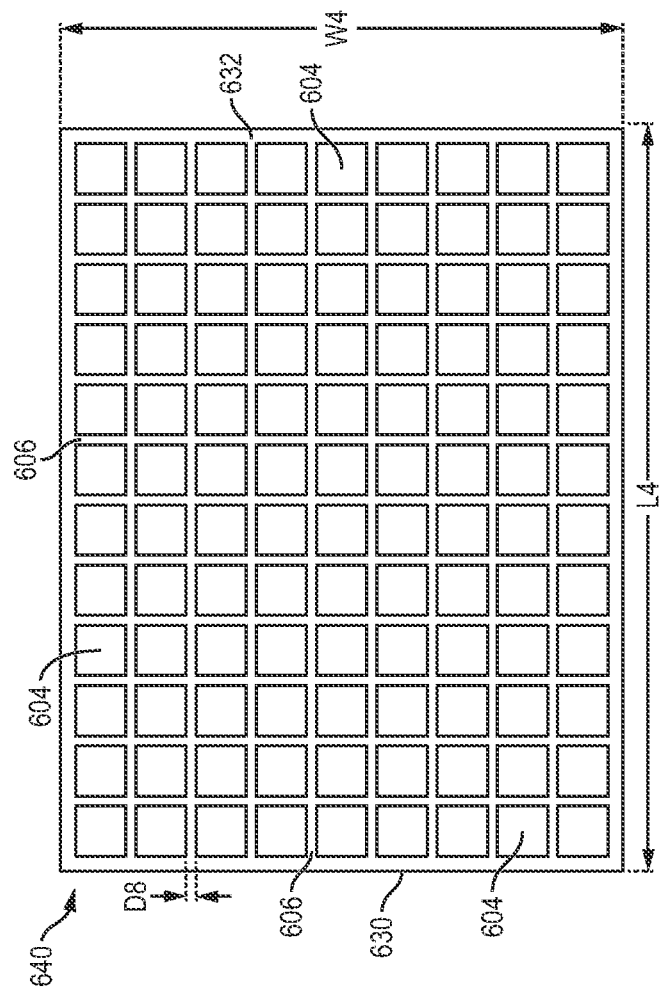

FIG. 29d shows a plan view of reconstituted panel 640 with semiconductor die 604 disposed over carrier 630. Carrier 630 is a standardized shape and size with capacity for various sizes and quantities of semiconductor die, which are singulated from various sizes of semiconductor wafers. In one embodiment, carrier 630 is rectangular in shape and has a width W4 of 560 mm and a length L4 of 600 mm. The number of semiconductor die 604 mounted to carrier 630 can be greater than, less than, or equal to the number of semiconductor die 604 singulated from semiconductor wafer 600. The larger surface area of carrier 630 accommodates more semiconductor die 604 and lowers manufacturing cost as more semiconductor die 604 are processed per reconstituted panel 640.

The standardized carrier, carrier 630, is fixed in size and can accommodate multiple sizes of semiconductor die. The size of standardized carrier 630 is independent of the dimensions of the semiconductor die or semiconductor wafer. More small semiconductor die than larger semiconductor die can fit on carrier 630. For example, carrier 630 accommodates a greater number of 5 mm by 5 mm die over the surface area of carrier 630 than a number of 10 mm by 10 mm die over the surface area of carrier 630.

For example, semiconductor die 604 having dimensions of 10 mm by 10 mm are placed on carrier 630 with a distance D8 of 200 μm between adjacent semiconductor die 604. The number of semiconductor die 604 singulated from semiconductor wafer 600 is approximately 600 semiconductor die, where semiconductor wafer 600 has a diameter of 300 mm. The number of 10 mm by 10 mm semiconductor die 604 which can fit on carrier 630 is over 3,000 semiconductor die.

Alternatively, semiconductor die 604 having dimensions of 5 mm by 5 mm are placed on carrier 630 with a distance D8 of 200 μm between adjacent semiconductor die 604. The number of semiconductor die 604 singulated from semiconductor wafer 600, where semiconductor wafer 600 has a diameter of 200 mm, is approximately 1,000 semiconductor die. The number of 5 mm by 5 mm semiconductor die 604, which can fit on carrier 630, is over 12,000 semiconductor die.

The size of carrier 630 does not vary with the size of semiconductor die being processed. The number of semiconductor die 604, which fit on carrier 630, varies with the size of semiconductor die 604 and space or distance D8 between semiconductor die 604. The size and shape of carrier 630 remains fixed and independent of the size of semiconductor die 604 or semiconductor wafer 600 from which semiconductor die 604 are singulated. Carrier 630 and reconstituted panel 640 provide the flexibility to manufacture many different types of semiconductor packages with different size semiconductor die 604 from different sized semiconductor wafers 600 using a common set of processing equipment, such as processing equipment 340 from FIG. 13h.

In FIG. 29e, an encapsulant or molding compound 644 is deposited over semiconductor die 604 and carrier 630 using a paste printing, transfer molding, liquid encapsulant molding, vacuum lamination, spin coating, or other suitable applicator. Encapsulant 644 can be polymer composite material, such as epoxy resin with filler, epoxy acrylate with filler, or polymer with proper filler. Encapsulant 644 is non-conductive and environmentally protects the semiconductor device from external elements and contaminants. In another embodiment, encapsulant 644 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, $SiO_2$, $Si_3N_4$, SiON, $Ta_2O_5$, $Al_2O_3$, prepreg, or other dielectric material having similar insulating and structural properties deposited using printing, spin coating, spray coating, vacuum or pressure lamination with or without heat, or other suitable process. In one embodiment, encapsulant 644 is a low temperature curing photosensitive dielectric polymer with or without insulating fillers cured at less than 200° C.

In particular, encapsulant 644 is disposed along base substrate side surfaces 622. Encapsulant 644 also covers back surface 610 of semiconductor die 604. In one embodiment, encapsulant 644 is opaque and dark or black in color. Encapsulant 644 can be used for laser marking reconstituted panel 640 for alignment and singulation. Encapsulant 644 can be thinned in a subsequent backgrinding step. Encapsulant 644 can also be deposited such that a back surface 646 of encapsulant is coplanar with back surface 610 of semiconductor die 604 and does not cover back surface 610. A surface 648 of encapsulant 644 opposite backside surface 646 is disposed over carrier 630 and interface layer 632 such that surface 648 of encapsulant 644 may be coplanar with active surface 612 of semiconductor die 604.

In FIG. 29f, carrier 630 and interface layer 632 are removed by chemical etching, mechanical peeling, CMP, mechanical grinding, thermal bake, UV light, laser scanning, or wet stripping to expose insulating layer 616, conductive layer 614, and surface 648 of encapsulant 644.

An electrically conductive layer 650 is formed over insulating layer 616 and conductive layer 614 using a patterning and metal deposition process such as printing, PVD, CVD, sputtering, electrolytic plating, and electroless plating. Conductive layer 650 can be one or more layers of Al, Cu, Sn, Ti, Ni, Au, Ag, W, or other suitable electrically conductive material. A portion of conductive layer 650 extends horizontally along insulating layer 616 and parallel to active surface 612 of semiconductor die 604 to laterally redistribute the electrical interconnect to conductive layer 614. Conductive layer 650 operates as an RDL for the electrical signals of semiconductor die 604. Conductive layer 650 is formed over a footprint of semiconductor die 604 and does not extend beyond the footprint of semiconductor die 604 or over encapsulant 644. In other words, a peripheral region of semiconductor die 604 adjacent to semiconductor die 604 is devoid of conductive layer 650. In one embodiment, conductive layer 650 is formed within a footprint of semiconductor die 604 and a distance D9 of at least 1 µm from sidewall 608 of semiconductor die 604. A portion of conductive layer 650 is electrically connected to conductive layer 614. Other portions of conductive layer 650 are electrically common or electrically isolated depending on the connectivity of semiconductor die 604.

In FIG. 29g, an insulating or passivation layer 660 is formed over insulating layer 616 and conductive layer 650 using PVD, CVD, printing, spin coating, spray coating, screen printing or lamination. Insulating layer 660 can be one or more layers of SiO2, Si3N4, SiON, Ta2O5, Al2O3, or other material having similar insulating and structural properties. In one embodiment, insulating layer 660 is a photosensitive dielectric polymer low-cured at less than 200° C. In one embodiment, insulating layer 660 is formed over insulating layer 616, semiconductor die 604, and extends beyond the footprint of semiconductor die 604 and over surface 648 of encapsulant 644 by a distance D10 of 1 µm or more. Insulating layer 660 covers the interface between semiconductor die 604 and encapsulant 644 to protect the interface during processing and improve the reliability of the device. A portion of insulating layer 660 is removed by an etching process with a patterned photoresist layer or by LDA to form openings to expose conductive layer 650.

An electrically conductive bump material is deposited over conductive layer 650 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 650 using a suitable attachment or bonding process. In one embodiment, the bump material is reflowed by heating the material above its melting point to form balls or bumps 662. In some applications, bumps 662 are reflowed a second time to improve electrical contact to conductive layer 650. Bumps 662 can also be compression bonded or thermocompression bonded to conductive layer 650. Bumps 662 represent one type of interconnect structure that can be formed over conductive layer 650. The interconnect structure can also use bond wires, conductive paste, stud bump, micro bump, or other electrical interconnect. Laser marking can be performed before or after bump formation, or after removal of carrier 630.

Collectively, insulating layers 660, conductive layer 650 and bumps 662 constitute a build-up interconnect structure 664 formed over semiconductor die 604 and encapsulant 644. Alternatively, build-up interconnect structure 664 is formed completely within a footprint of semiconductor die 604. Build-up interconnect structure 664 may include as few as one RDL or conductive layer, such as conductive layer 650, and one insulating layer, such as insulating layer 660. Additional insulating layers and RDLs can be formed over insulating layer 660 prior to forming bumps 662, to provide additional vertical and horizontal electrical connectivity across the package according to the design and functionality of semiconductor die 604.

In FIG. 29h, semiconductor die 604 are singulated with saw blade or laser cutting tool 670 into individual eWLCSP 672. Reconstituted panel 640 is singulated through encapsulant 644. A portion of encapsulant 644 remains disposed along the sides of semiconductor die 604 after singulation. eWLCSP 672 undergoes electrical testing before or after singulation.

In FIG. 29i, shows eWLCSP 672 with encapsulant 644 formed over back surface 610 and sidewalls 608 of semiconductor die 604. Semiconductor die 604 is electrically connected through conductive layers 614 and 650 to bumps 662 for external interconnect through interconnect structure 664. Conductive layers of interconnect structure 664 do not extend beyond a footprint of semiconductor die 604 and thus forms a fan-in package. In one embodiment, conductive layer 650 is formed within a footprint of semiconductor die 604 and a distance D9 of at least 1 µm from sidewall 608 of semiconductor die 604. Insulating layer 660 covers the interface between semiconductor die 604 and encapsulant 644 to protect the interface during processing and improve the reliability of the device. In one embodiment, insulating layer 660 extends beyond the footprint of semiconductor die 604 and over surface 648 of encapsulant 644 by a distance D10 of 1 µm or more.

Encapsulant 644 remains over back surface 610 of semiconductor die 604 after an optional grinding operation. Encapsulant 644 remains over base substrate side surfaces 622 for mechanical protection and protection from degradation due to exposure to photons from light or other emissions. Therefore, encapsulant 644 is formed over five sides of semiconductor die 604, i.e., over four base substrate side surfaces 622 and over back surface 610. Encapsulant 644 over back surface 610 of semiconductor die 604 eliminates the need for a backside protection layer or backside laminate, thereby reducing the cost of eWLCSP 672.

The thickness of encapsulant 644 over base substrate side surfaces 622 is less than 150 μm for eWLCSP 672. In one embodiment, eWLCSP 672 has dimensions of 4.595 mm in length×4.025 mm in width×0.470 mm in height with a pitch of 0.4 mm for bumps 662 where semiconductor die 294 has a length of 4.445 mm and a width of 3.875 mm. In another embodiment, the thickness of encapsulant 644 over base substrate side surfaces 622 is 75 μm or less. eWLCSP 672 has dimensions of 6.075 mm in length×6.075 mm in width× 0.8 mm in height with a pitch of 0.5 mm for bumps 662 where semiconductor die 604 has dimensions of 6.0 mm in length×6.0 mm in width×0.470 mm in height. In yet another embodiment, eWLCSP 672 has dimensions of 5.92 mm in length×5.92 mm in width×0.765 mm in height with a pitch of 0.5 mm for bumps 662 where semiconductor die 604 has dimensions of 5.75 mm in length×5.75 mm in width×0.535 mm in height. In another embodiment, the thickness of encapsulant 644 over base substrate side surface 622 is 25 μm or less. In yet another embodiment, the thickness of encapsulant 644 over base substrate side surface 622 is approximately 50 μm or less. eWLCSP 672 is manufactured by forming a reconstituted wafer or panel on standardized carrier 630 using equipment designed for a single standardized carrier size, which reduces equipment and material costs for eWLCSP 672. eWLCSP 672 is manufactured at a higher volume using standardized carrier 630, thereby simplifying the manufacturing process and reducing unit cost.

FIG. 30 shows eWLCSP 674 after singulation having encapsulant 644 over sidewalls 608 and having backside insulating layer 676. Semiconductor die 604 is electrically connected through conductive layers 614 and 650 to bumps 662 for external interconnect through interconnect structure 664. Conductive layers of interconnect structure 664 do not extend beyond a footprint of semiconductor die 604 and thus forms a fan-in package. Insulating layer 660 covers the interface between semiconductor die 604 and encapsulant 644 to protect the interface during processing and improve the reliability of the device.

Backside insulating layer 676 is formed over back surface 610 of semiconductor die 604 for mechanical protection and protection from degradation due to exposure to photons from light or other emissions. Backside insulating layer 676 contains one or more layers of photosensitive low curing temperature dielectric resist, photosensitive composite resist, laminate compound film, insulation paste with filler, solder mask resist film, liquid molding compound, granular molding compound, polyimide, BCB, PBO, SiO2, Si3N4, SiON, Ta2O5, Al2O3, prepreg, or other dielectric material having similar insulating and structural properties. Backside insulating layer 676 is deposited using printing, spin coating, spray coating, vacuum or pressure lamination with or without heat, or other suitable process. In one embodiment, backside insulating layer 676 is a low temperature curing photosensitive dielectric polymer with or without insulating fillers cured at less than 200° C. Backside insulating layer 676 is a backside protection layer and provides mechanical protection for semiconductor die 604 and protection from light. In one embodiment, backside insulating layer 676 has a thickness ranging from approximately 5-150 μm.

Encapsulant 644 covers base substrate side surfaces 622 to protect semiconductor die 604 from degradation due to exposure to photons from light or other emissions. The thickness of encapsulant 644 over base substrate side surfaces 622 is less than 150 μm for eWLCSP 674. In one embodiment, eWLCSP 674 has dimensions of 4.595 mm in length×4.025 mm in width×0.470 mm in height with a pitch of 0.4 mm for bumps 662 where semiconductor die 604 has a length of 4.445 mm and a width of 3.875 mm. In another embodiment, the thickness of encapsulant 644 over base substrate side surfaces 622 is 75 μm or less. eWLCSP 674 has dimensions of 6.075 mm in length×6.075 mm in width× 0.8 mm in height with a pitch of 0.5 mm for bumps 662 where semiconductor die 604 has dimensions of 6.0 mm in length×6.0 mm in width×0.470 mm in height. In yet another embodiment, eWLCSP 674 has dimensions of 5.92 mm in length×5.92 mm in width×0.765 mm in height with a pitch of 0.5 mm for bumps 662 where semiconductor die 604 has dimensions of 5.75 mm in length×5.75 mm in width×0.535 mm in height. In another embodiment, the thickness of encapsulant 644 over base substrate side surfaces 622 is 25 μm or less. In yet another embodiment, the thickness of encapsulant 644 over base substrate side surfaces 622 is approximately 50 μm or less. eWLCSP 674 is manufactured by forming a reconstituted wafer or panel on standardized carrier 630 using equipment designed for a single standardized carrier size, which reduces equipment and material costs for eWLCSP 674. eWLCSP 674 is manufactured at a higher volume using standardized carrier 630, thereby simplifying the manufacturing process and reducing unit cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    depositing an encapsulant over the semiconductor die;
    removing the encapsulant over a side surface of the semiconductor die; and
    forming a fan-in interconnect structure over the semiconductor die by,
        forming a first insulating layer over the semiconductor die,
        forming a second insulating layer over the first insulating layer,
        forming a conductive layer over the first insulating layer and second insulating layer, and
        forming a third insulating layer over the conductive layer;
    wherein a side surface of the first insulating layer, a side surface of the second insulating layer, a side surface of the third insulating layer, a side surface of the semiconductor die, and a side surface of the encapsulant are all coplanar to each other.

2. The method of claim 1, further including forming the fan-in interconnect structure over the semiconductor die prior to depositing the encapsulant.

3. The method of claim 1, wherein a footprint of the fan-in interconnect structure is totally contained within a footprint of the semiconductor die.

4. The method of claim 1, wherein forming the fan-in interconnect structure includes:
    forming the conductive layer to fan in from contact pads of the semiconductor die; and
    forming the third insulating layer over the conductive layer prior to singulating the semiconductor die, wherein a discrete portion of the second insulating layer is limited to within a footprint of the semiconductor die.

5. The method of claim 1, further including depositing the encapsulant over a back surface of the semiconductor die.

6. The method of claim 5, further including removing the encapsulant from over the back surface of the semiconductor die.

7. The method of claim 6, further including disposing a backside insulating layer over the back surface of the semiconductor die after removing the encapsulant from over the back surface of the semiconductor die.

8. A semiconductor device, comprising:
a semiconductor die including a contact pad;
an encapsulant deposited over the semiconductor die; and
a fan-in interconnect structure formed over the semiconductor die, wherein the fan-in interconnect structure includes,
    a first insulating layer formed over the semiconductor die including a first opening formed through the first insulating layer to expose the contact pad,
    a second insulating layer formed over the first insulating layer including a second opening formed through the second insulating layer to expose the contact pad,
    a conductive layer formed over the first insulating layer and second insulating layer, wherein the conductive layer extends through the first opening and second opening to contact the contact pad, and
    a third insulating layer formed over and directly on the conductive layer and second insulating layer, wherein side surfaces of the semiconductor die, first insulating layer, second insulating layer, and third insulating layer are all coplanar to each other.

9. The semiconductor device of claim 8, wherein the encapsulant extends over a side surface of the fan-in interconnect structure.

10. The semiconductor device of claim 8, further including:
an under-bump metallization (UBM) formed over the conductive layer; and
a conductive bump disposed on the UBM.

11. The semiconductor device of claim 8, wherein a footprint of the fan-in interconnect structure is totally contained within a footprint of the semiconductor die.

12. The semiconductor device of claim 8, wherein:
the conductive layer is formed to fan in from contact pads of the semiconductor die; and
the third insulating layer is formed over the conductive layer with a discrete portion of the third insulating layer limited to within a footprint of the semiconductor die.

13. A semiconductor device, comprising:
a semiconductor die;
an encapsulant deposited over the semiconductor die, wherein a side surface of the semiconductor die is exposed from the encapsulant; and
a fan-in interconnect structure formed over the semiconductor die, wherein the fan-in interconnect structure includes,
    a first insulating layer formed over the semiconductor die,
    a second insulating layer formed over the first insulating layer,
    a conductive layer formed over the first insulating layer and second insulating layer, and
    a third insulating layer formed over the conductive layer;
wherein a side surface of the first insulating layer, a side surface of the second insulating layer, a side surface of the third insulating layer, a side surface of the semiconductor die, and a side surface of the encapsulant are all coplanar to each other.

14. The semiconductor device of claim 13, further including:
an under-bump metallization (UBM) formed over the conductive layer; and
a conductive bump disposed on the UBM.

15. The semiconductor device of claim 13, wherein a footprint of the fan-in interconnect structure is completely contained within a footprint of the semiconductor die.

16. The semiconductor device of claim 13, wherein:
the conductive layer fans in from contact pads of the semiconductor die; and
a discrete portion of the third insulating layer is limited to within a footprint of the semiconductor die.

17. The semiconductor device of claim 13, wherein the encapsulant remains only over a back surface of the semiconductor die.

* * * * *